(12) United States Patent
Izuhara

(10) Patent No.: US 10,811,454 B2
(45) Date of Patent: Oct. 20, 2020

(54) SOLID-STATE IMAGING DEVICE, MANUFACTURING METHOD OF SOLID-STATE IMAGING DEVICE, AND ELECTRONIC APPARATUS

(71) Applicant: SONY CORPORATION, Tokyo (JP)

(72) Inventor: Kunihiko Izuhara, Kanagawa (JP)

(73) Assignee: Sony Corporation, Toyko (JP)

( * ) Notice: Subject to any disclaimer, the term of this patent is extended or adjusted under 35 U.S.C. 154(b) by 22 days.

(21) Appl. No.: 16/284,716

(22) Filed: Feb. 25, 2019

(65) Prior Publication Data

US 2019/0189666 A1 Jun. 20, 2019

Related U.S. Application Data

(63) Continuation of application No. 15/302,705, filed as application No. PCT/JP2015/001990 on Apr. 9, 2015, now Pat. No. 10,217,785.

(30) Foreign Application Priority Data

Apr. 21, 2014 (JP) .................................. 2014-087603
Jun. 25, 2014 (JP) .................................. 2014-129952

(51) Int. Cl.
*H01L 27/00* (2006.01)
*H01L 27/146* (2006.01)

(52) U.S. Cl.
CPC .... *H01L 27/14634* (2013.01); *H01L 27/1464* (2013.01); *H01L 27/1469* (2013.01); *H01L 27/14618* (2013.01); *H01L 2224/48091* (2013.01); *H01L 2224/48227* (2013.01); *H01L 2224/49113* (2013.01)

(58) Field of Classification Search
CPC ........... H01L 27/1464; H01L 27/14634; H01L 27/1469
USPC ........... 250/208.1, 214.1; 257/431, 432, 443, 257/444

See application file for complete search history.

(56) References Cited

U.S. PATENT DOCUMENTS 8,669,602 B2 * 3/2014 Hayashi ............ H01L 27/14625
257/292
9,362,325 B2 * 6/2016 Baba ...................... H01L 25/167

* cited by examiner

*Primary Examiner* — Kevin K Pyo
(74) *Attorney, Agent, or Firm* — Sheridan Ross P.C.

(57) ABSTRACT

There is provided a solid-state imaging device including a first substrate having a pixel circuit including a pixel array unit formed thereon, and a second substrate having a plurality of signal processing circuits formed thereon so as to be arranged through a scribe region. The first substrate and the second substrate are stacked.

13 Claims, 36 Drawing Sheets

# SOLID-STATE IMAGING DEVICE, MANUFACTURING METHOD OF SOLID-STATE IMAGING DEVICE, AND ELECTRONIC APPARATUS

CROSS REFERENCE TO RELATED APPLICATIONS

This application is a continuation of U.S. patent application Ser. No. 15/302,705, filed Oct. 7, 2016, which is a national stage application under 35 U.S.C. 371 and claims the benefit of PCT Application No. PCT/JP2015/001990 having an international filing date of 9 Apr. 2015, which designated the United States, which PCT application claimed the benefit of Japanese Priority Patent Application JP 2014-087603 filed Apr. 21, 2014, and Japanese Priority Patent Application JP 2014-129952 filed Jun. 25, 2014, the entire contents of each of which are incorporated herein by reference.

The present technology relates to a solid-state imaging device, a manufacturing method of a solid-state imaging device, and an electronic apparatus, and particularly, relates to a solid-state imaging device of a stacked structure, a manufacturing method of a solid-state imaging device of a stacked structure, and an electronic apparatus equipped with a solid-state imaging device of a stacked structure.

BACKGROUND ART

In the past, in a case of manufacturing a solid-state imaging device having an area greater than the exposure range of an exposure apparatus, the solid-state imaging device is divided into a plurality of regions, and separate exposure for exposing respective separated regions is used (for example, see PTL 1).

Further, in the past, in order to improve the aperture ratio of the solid-state imaging device, a stacking technology has been used in which a pixel circuit including a pixel array unit and a signal processing circuit are respectively formed on different semiconductor substrates, and the two semiconductor substrates are stacked and electrically connected (for example, see PTL 2).

Then, for example, in a case of manufacturing a solid-state imaging device of a stacked structure having an area greater than the exposure range of an exposure apparatus, separate exposure is performed on respective semiconductor substrates.

CITATION LIST

Patent Literature

PTL 1: Japanese Patent No. 2902506
PTL 2: Japanese Patent No. 4497844

SUMMARY OF INVENTION

Technical Problem

However, in the separate exposure, different photomasks are used for the separated regions or high-precision alignment is necessary in a portion connecting the separated regions, and thus a manufacturing process is complicated and a manufacturing cost increases.

Thus, the present technology is made to be able to reduce the manufacturing cost of the solid-state imaging device.

Solution to Problem

A solid-state imaging device according to a first embodiment of the present technology includes a first substrate having a pixel circuit including a pixel array unit formed thereon and
a second substrate having a plurality of signal processing circuits formed thereon, wherein the plurality of signal processing circuits are arranged adjacent to one another and include a spacing region therebetween, and
wherein the first substrate and the second substrate are stacked.

A manufacturing method of a solid state imaging device according to a second embodiment of the present disclosure includes forming a pixel circuit including a pixel array unit so as to be two-dimensionally arranged through a scribe region on a first semiconductor substrate, by using one or more separate exposures, forming a signal processing circuit that processes a pixel signal of each pixel in the pixel array unit so as to be two-dimensionally arranged through a scribe region on a second semiconductor substrate, by using a one-shot exposure;
stacking the first semiconductor substrate and the second semiconductor substrate such that the scribe region of the first semiconductor substrate overlaps the scribe region of the second semiconductor substrate, and cutting a semiconductor substrate including the first semiconductor substrate and the second semiconductor substrate that are stacked, along the scribe region of the first semiconductor substrate.

An electronic apparatus according to a third embodiment includes a solid-state imaging device including a first substrate having a pixel circuit including a pixel array unit formed thereon and a second substrate having a plurality of signal processing circuits formed thereon, wherein the plurality of signal processing circuits are arranged adjacent to one another and include a spacing region therebetween, and wherein the first substrate and the second substrate are stacked.

Advantageous Effects of Invention

According to the first to third embodiments of the present technology, it is possible to reduce the manufacturing cost of the solid-state imaging device.

DESCRIPTION OF EMBODIMENTS

Hereinafter, embodiments for carrying out the present technology (hereinafter, referred to as embodiments) will be described. In addition, a description will be made in the following order.

1. First embodiment (example of signal processing circuit not being electrically connected)
2. Second embodiment (example of signal processing circuit being electrically connected in logic board)
3. Third embodiment (example of signal processing circuit being electrically connected in pixel substrate)
4. Modifications 1. First Embodiment {1-1. System Configuration}

Figure 1:
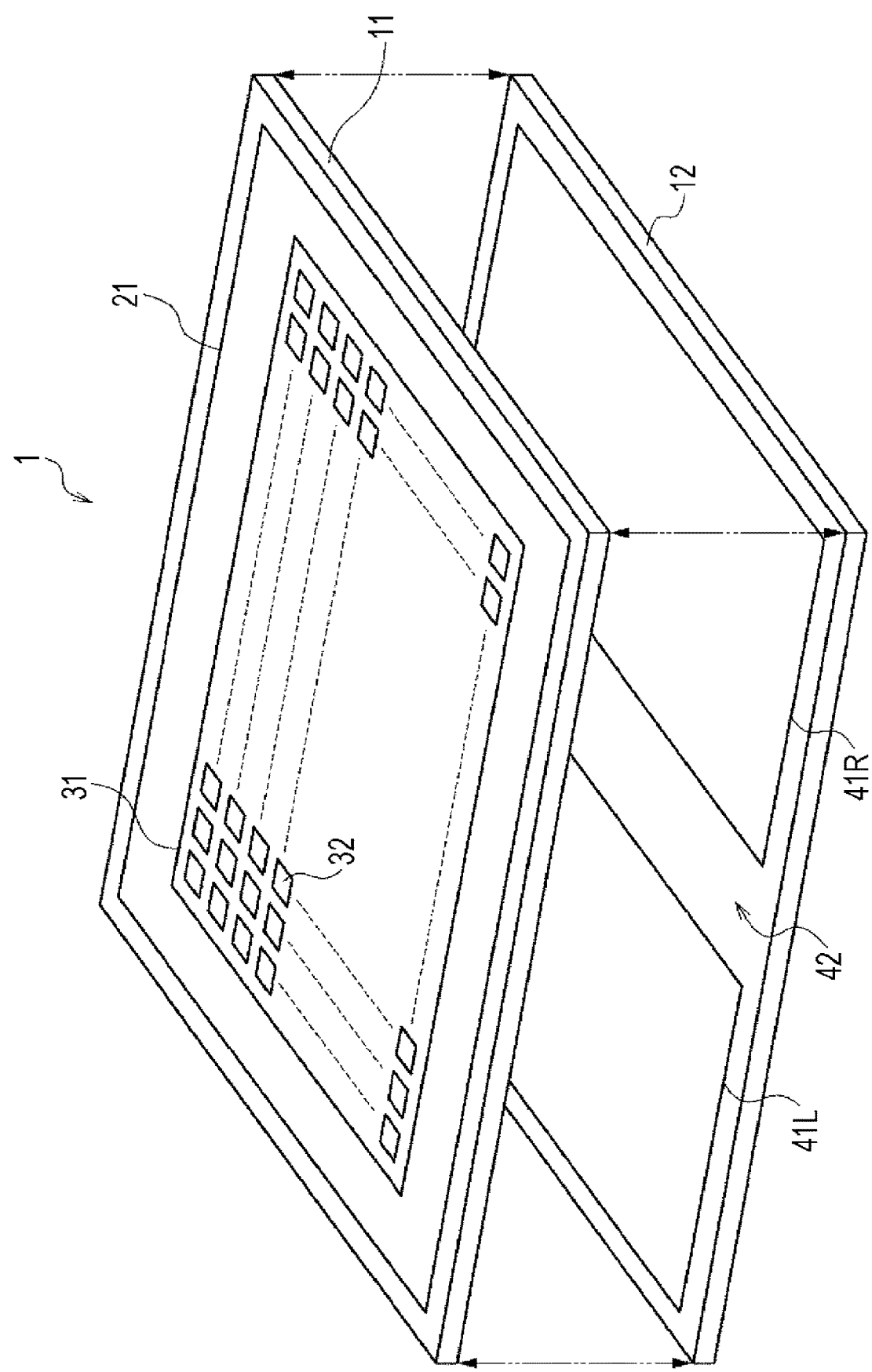
FIG. 1 is a perspective view schematically illustrating a solid-state imaging device according to a first embodiment of the present technology.

FIG. 1 is a perspective view schematically illustrating a configuration example of a solid-state imaging device 1 according to a first embodiment of the present technology. In addition, here, a case where the solid-state imaging device 1 is a CMOS image sensor will be described as an example, but the present technology is not limited to application to the CMOS image sensor.

The solid-state imaging device 1 is a semiconductor chip of a structure in which a pixel substrate 11 and a logic board 12 are stacked (so-called, a stacked structure). Further, the solid-state imaging device 1 is a back-illuminated type CMOS image sensor in which a wiring layer of the pixel substrate 11 and a wiring layer of the logic board 12 are stacked so as to be adjacent to each other. In addition, the present technology is not limited to application to the back-illuminated type CMOS image sensor.

The pixel substrate 11 is a semiconductor substrate in which a pixel circuit 21 is formed, and the pixel circuit 21 includes a pixel array unit (a pixel unit) 31 in which each of the unit pixels 32 includes a photoelectric conversion element and is arranged two-dimensionally in a matrix. In addition, for example, pads for providing external electrical connection and vias for electrical connection with the logic board 12, which are not shown, are provided in a peripheral portion surrounding a pixel array unit 31 of the pixel circuit 21. A pixel signal obtained from each unit pixel 32 of the pixel array unit 31 is an analog signal, and the analog pixel signal is transmitted from the pixel substrate 11 to the logic board 12 through the vias or the like.

The logic board 12 is a semiconductor substrate in which a signal processing circuit 41L and a signal processing circuit 41R having the same circuit pattern are formed so as to be arranged to the left and right through a spacing region, such as a scribe region 42. In addition, in FIG. 1, the width of the scribe region 42 is widely exaggerated for clarity of illustration. This is also applied to the following drawings.

The signal processing circuit 41L performs, for example, a predetermined signal process, including digitalization (AD conversion) of the analog pixel signal that is read from each unit pixel 32 in the left half region of the pixel array unit 31, and stores the pixel data, which is subjected to the signal process. Further, the signal processing circuit 41L reads, for example, the stored pixel data in a predetermined order, and outputs the pixel data to the outside of the chip. Thus, the pixel data obtained from the unit pixels 32 in the left half region of the pixel array unit 31 is output from the signal processing circuit 41L.

The signal processing circuit 41R performs, for example, a predetermined signal process, including digitalization (AD conversion) of the analog pixel signal read from each unit pixel 32 in the right half region of the pixel array unit 31, and stores the pixel data, which is subjected to the signal process. Further, the signal processing circuit 41R reads, for example, the stored pixel data in a predetermined order, and outputs the pixel data to the outside of the chip. Thus, the pixel data obtained from the unit pixels 32 in the right half region of the pixel array unit 31 is output from the signal processing circuit 41R.

Further, the signal processing circuit 41L and the signal processing circuit 41R control respective units of the solid-state imaging device 1 while synchronizing, for example, the pixel circuit 21.

Thus, it is possible to make the area of the pixel substrate 11 substantially equal to the area of the pixel array unit 31 by using a stacked structure of the pixel substrate 11 and the logic board 12. As a result, it is possible to reduce the size of the solid-state imaging device 1, and thus, it is possible to reduce the overall size of the chip. Further, it is possible to improve the aperture ratio of the solid-state imaging device 1.

In addition, since it is possible to perform a process suitable for making the unit pixel 32 or the like on the pixel substrate 11 and perform a process suitable for making the signal processing circuits 41L and 41R on the logic board 12, it is possible to optimize the process during manufacturing of the solid-state imaging device 1.

In addition, the area of the pixel circuit 21 is greater than the exposure range of an exposure apparatus, and thus separate exposure is necessary. Meanwhile, each of the areas of the signal processing circuit 41L and the signal processing circuit 41R is smaller than the exposure range of the exposure apparatus, and thus one-shot exposure is possible.

In addition, hereinafter, if there is no need to distinguish the signal processing circuit 41L and the signal processing circuit 41R, they are simply referred to as a signal processing circuit 41.

{1-2. Circuit Configuration}

Figure 2:
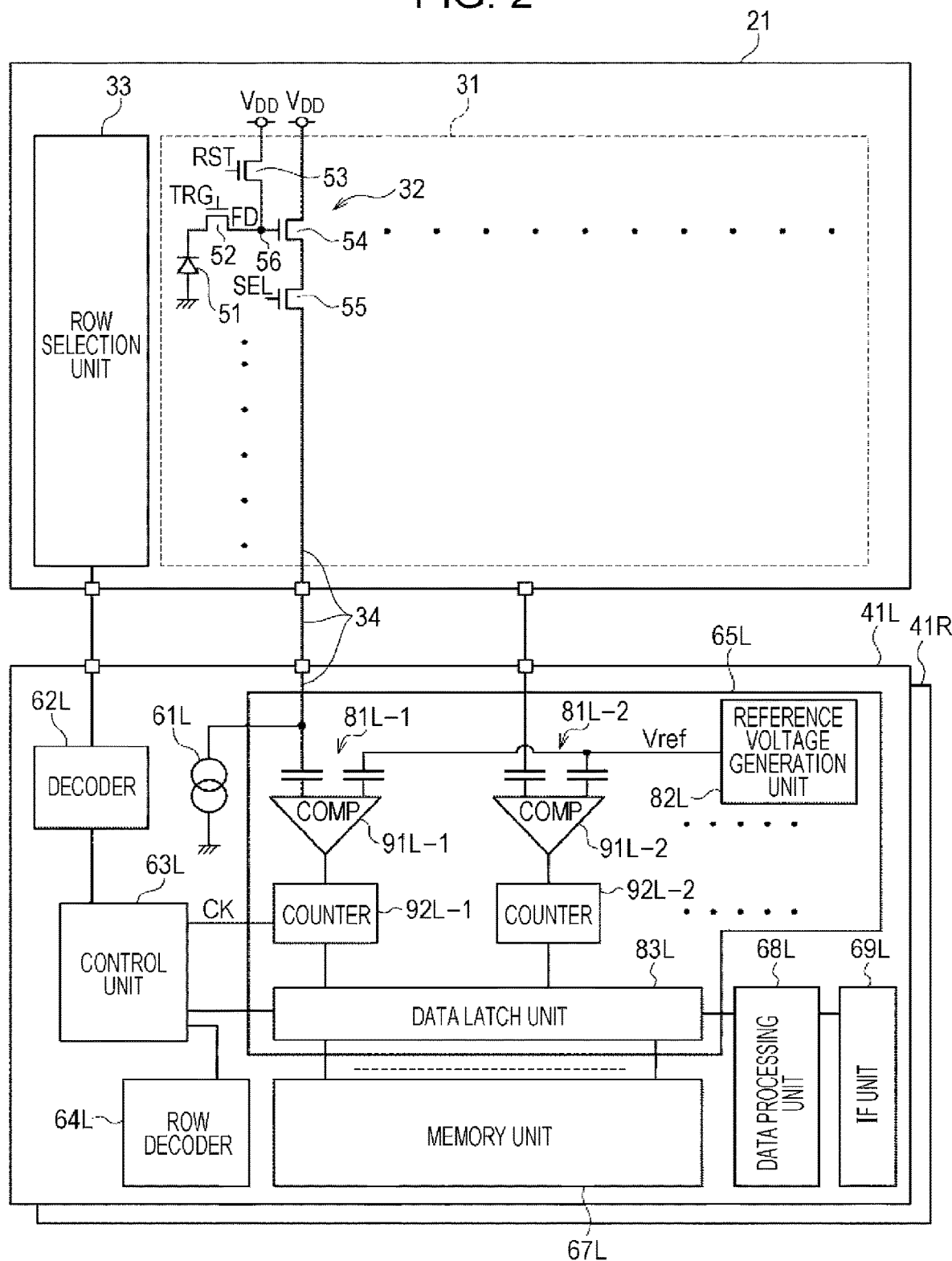
FIG. 2 is a circuit diagram illustrating a specific configuration of a pixel circuit and a signal processing circuit of the solid-state imaging device according to the first embodiment.

FIG. 2 is a circuit diagram illustrating a specific configuration of the pixel circuit 21 on the pixel substrate 11 and the signal processing circuits 41L and 41R on the logic board 12 of the solid-state imaging device 1. In addition, as described above, the pixel circuit 21 and the signal processing circuits 41L and 41R are electrically connected through vias, not shown.

(Configuration of Pixel Circuit 21)

First, the configuration of the pixel circuit 21 on the pixel substrate 11 will be described. In addition to the pixel array unit 31, in which the unit pixels 32 are arranged two-dimensionally in a matrix, a row selection unit 33 that selects each unit pixel 32 of the pixel array unit 31 in units of rows based on an address signal applied from the logic board 12 is provided in the pixel circuit 21. In addition, here, although the row selection unit 33 is provided on the pixel substrate 11, it is also possible to provide the row selection unit 33 on the logic board 12.

The unit pixel 32 includes, for example, a photodiode 51 as a photoelectric conversion element. Further, the unit pixel 32 includes four transistors, for example, a transfer transistor (transfer gate) 52, a reset transistor 53, an amplifying transistor 54, and a selection transistor 55, in addition to the photodiode 51.

Here, for example, N channel transistors are used as the four transistors 52 to 55. However, here, a combination of the conductivity types of the transfer transistor 52, the reset transistor 53, the amplifying transistor 54, and the selection transistor 55 is only an example, and a combination is not limited to the combination. In other words, as necessary, it is possible to use a combination of P-channel transistors.

A transfer signal TRG, a reset signal RST, and a selection signal SEL which are drive signals for driving the unit pixel 32 are appropriately supplied to the unit pixel 32 from the row selection unit 33. In other words, the transfer signal TRG, the reset signal RST, and the selection signal SEL are respectively applied to the gate electrode of the transfer transistor 52, the gate electrode of the reset transistor 53, and the gate electrode of the selection transistor 55.

The photodiode 51 has an anode electrode connected to a power supply of a low potential (e.g., ground), and accumulates the photoelectric charges by converting the received light (incident light) into photoelectric charges (here, photoelectrons) of the charge quantity corresponding to the light quantity. The cathode electrode of the photodiode 51 is electrically connected to the gate electrode of the amplifying transistor 54 through the transfer transistor 52. A node 56 electrically connected to the gate electrode of the amplifying transistor 54 is referred to as a floating diffusion (FD) region portion.

The transfer transistor 52 is connected between the cathode electrode of the photodiode 51 and the FD portion 56. The transfer signal TRG of a high level (e.g., $V_{DD}$ level), which is active (hereinafter, referred to as "High active"), is applied to the gate electrode of the transfer transistor 52 from the row selection unit 33. The transfer transistor 52 becomes conductive in response to the transfer signal TRG, and the photoelectric charges obtained through the photoelectric conversion by the photodiode 51 are transferred to the FD portion 56.

The reset transistor 53 includes a drain electrode connected to a pixel power supply $V_{DD}$ and a source electrode connected to the FD portion 56. The High active reset signal RST is applied to the gate electrode of the reset transistor 53 from the row selection unit 33. The reset transistor 53 becomes conductive in response to the reset signal RST, and the FD portion 56 is reset by discarding the charges in the FD portion 56 to the pixel power supply $V_{DD}$.

The amplifying transistor 54 includes a gate electrode connected to the FD portion 56, and a drain electrode connected to a pixel power supply $V_{DD}$. Then, the amplifying transistor 54 outputs the potential of the FD portion 56 after being reset by the reset transistor 53, as a reset signal (reset level) Vreset. The amplifying transistor 54 outputs the potential of the FD portion 56 after the signal charges thereof being transferred by the transfer transistor 52, as a light accumulation signal (signal level) Vsig.

The selection transistor 55 includes, for example, a drain electrode connected to the source electrode of the amplifying transistor 54 and a source electrode connected to a signal line 34. The High active selection signal SEL is applied to the gate electrode of the selection transistor 55 from the row selection unit 33. The selection transistor 55 becomes conductive in response to the selection signal SEL, and the signals output from the amplifying transistor 54 are read to the signal line 34, with the unit pixel 32 as the selected state.

As is apparent from the above description, the potential of the FD portion 56 after being reset is read as a reset level Vreset, and the potential of the FD portion 56 after the signal charges being transferred is read as a signal level Vsig from the unit pixel 32, to the signal line 34, in order. In addition, the signal level Vsig also includes the component of the reset level Vreset.

In addition, here, a circuit configuration is used in which the selection transistor 55 is connected between the source electrode of the amplifying transistor 54 and the signal line 34, but it is possible to employ a circuit configuration in which the selection transistor 55 is connected between the pixel power supply $V_{DD}$ and the drain electrode of the amplifying transistor 54.

Further, the unit pixel 32 is not limited to a pixel structure including the above four transistors. For example, a pixel structure including three transistors, in which the amplifying transistor 54 also has the function of the selection transistor 55, or a pixel structure in which a plurality of photoelectric conversion elements (i.e., pixels) share transistors following the FD portion 56 may be used, and the configuration of the pixel circuit does not matter.

(Configuration of Signal Processing Circuits 41L and 41R)

Next, the configuration of the signal processing circuits 41L and 41R on the logic board 12 will be described. In addition, as described above, the signal processing circuit 41L and the signal processing circuit 41R have the same circuit pattern, and thus here, the configuration of the signal processing circuit 41L will be mainly described.

The signal processing circuit 41L is a circuit for mainly processing pixel signals from the unit pixel 32 in the left half region of the pixel array unit 31. The signal processing circuit 41L is configured to include a current source 61L, a decoder 62L, a control unit 63L, a row decoder 64L, a signal processing unit 65L, a column decoder/sense amplifier 66L, a memory unit 67L, a data processing unit 68L, and an interface (IF) unit 69L.

The current source 61L is connected to each signal line 34 from which a signal is read for each pixel column from each unit pixel 32 of the pixel array unit 31. The current source 61L has a so-called load MOS circuit configuration, which includes a MOS transistor, of which the gate potential is biased at a constant potential so as to provide, for example, a constant current to the signal line 34. The current source 61L of the load MOS circuit configuration causes the amplifying transistor 54 to operate as a source follower, by supplying a constant current to the amplifying transistor 54 of the unit pixel 32 of the selected row.

The decoder 62L applies an address signal for specifying the address of the selected row to the row selection unit 33, when selecting each unit pixel 32 of the pixel array unit 31 in units of rows, under the control of the control unit 63L.

The row decoder 64L specifies a row address when writing pixel data to the memory unit 67L or reading pixel data from the memory unit 67L under the control of the control unit 63L.

The signal processing unit 65L includes at least AD converters 81L-1 to 81L-n that digitize (AD conversion) analog pixel signals which are read out from each unit pixel 32 of the pixel array unit 31 through the signal line 34. Then, the signal processing unit 65L is configured so as to perform a signal process on the analog pixel signal in parallel in units of pixel columns (column parallel AD). In addition, if there is no need to distinguish the AD converters 81L-1 to 81L-n, hereinafter, they are simply referred to as an AD converter 81L.

The signal processing unit 65L further includes a reference voltage generation unit 82L that generates a reference voltage used during the AD conversion in each AD converter 81L. The reference voltage generation unit 82L generates a reference voltage of a so-called ramp waveform (a slope-like waveform) of which a voltage value varies in a stepwise manner over time. The reference voltage generation unit 82L can be configured by using, for example, a digital-analog conversion (DAC) circuit.

The AD converter 81L is provided, for example, for each pixel column of the pixel array unit 31, that is, for each signal line 34. In other words, the AD converter 81L is a so-called column parallel AD converter, and the column parallel AD converters of the number of pixel columns in the left half of the pixel array unit 31 are arranged. Then, the AD converter 81L generates a pulse signal having for example, a size in the time-axis direction corresponding to the size of the level of a pixel signal (i.e., pulse width), and performs the AD conversion process by measuring the length of the period of the pulse width of the pulse signal.

More specifically, for example, the AD converter 81L-1 is configured to include at least a comparator (COMP) 91L-1 and a counter 92L-1, as illustrated in FIG. 2. The comparator 91L-1 regards the analog pixel signals (the signal level Vsig and the reset level Vreset, which are described previously), which are read from the unit pixel 32 through the signal line 34 as a comparative input, regards a reference voltage Vref of a ramp wave, which is supplied from the reference voltage generation unit 82L as a reference input, and compares both inputs.

Then, in the comparator 91L-1, for example, when the reference voltage Vref is greater than the pixel signal, the output becomes a first state (e.g., a high level), and when the reference voltage Vref is equal to or less than the pixel signal, the output becomes a second state (e.g., a low level). The output signal of the comparator 91L-1 is a pulse signal having a pulse width corresponding to the magnitude of the level of pixel signal.

For example, an up/down counter is used as the counter 92L-1. The clock CK is applied to the counter 92L-1, at the same timing as the supply start timing of the reference voltage Vref for the comparator 91L. Since the counter 92L-1, which is the up/down counter, performs down-counting or up-counting in synchronization with the clock CK, the counter 92L-1 measures the duration of the pulse width of the output pulse of the comparator 91L-1, that is, a comparison period from the start of the comparison operation to the end of the comparison operation. During the measurement operation, with respect to the reset level Vreset and the signal level Vsig, which are read in order from the unit pixel 32, the counter 92L-1 performs down-counting for the reset level Vreset and up-counting for the signal level Vsig.

It is possible to obtain a difference between the signal level Vsig and the reset level Vreset by the operation of the down counter/up counter. As a result, the AD converter 81L-1 performs a correlated double sampling (CDS) process in addition to AD conversion process. The CDS process is a process of removing a pixel-specific fixed pattern noise, such as a reset noise of the unit pixel 32 and threshold variations in the amplifying transistor 54, by obtaining a difference between the signal level Vsig and the reset level Vreset. Then, the count result (i.e., count value) of the counter 92L-1 is a digital value obtained by digitizing the analog pixel signals.

In addition, the AD converters 81L-2 to 81L-n have the same configuration as that of the AD converter 81L-1, and thus the redundant description thereof will be omitted. Further, when there is no need to distinguish the comparators 91L-1 to 91L-n, hereinafter, they are simply referred to as a comparator 91L, and when there is no need to distinguish the counters 92L-1 to 92L-n, hereinafter, they are simply referred to as a counter 92L.

Figure 3:
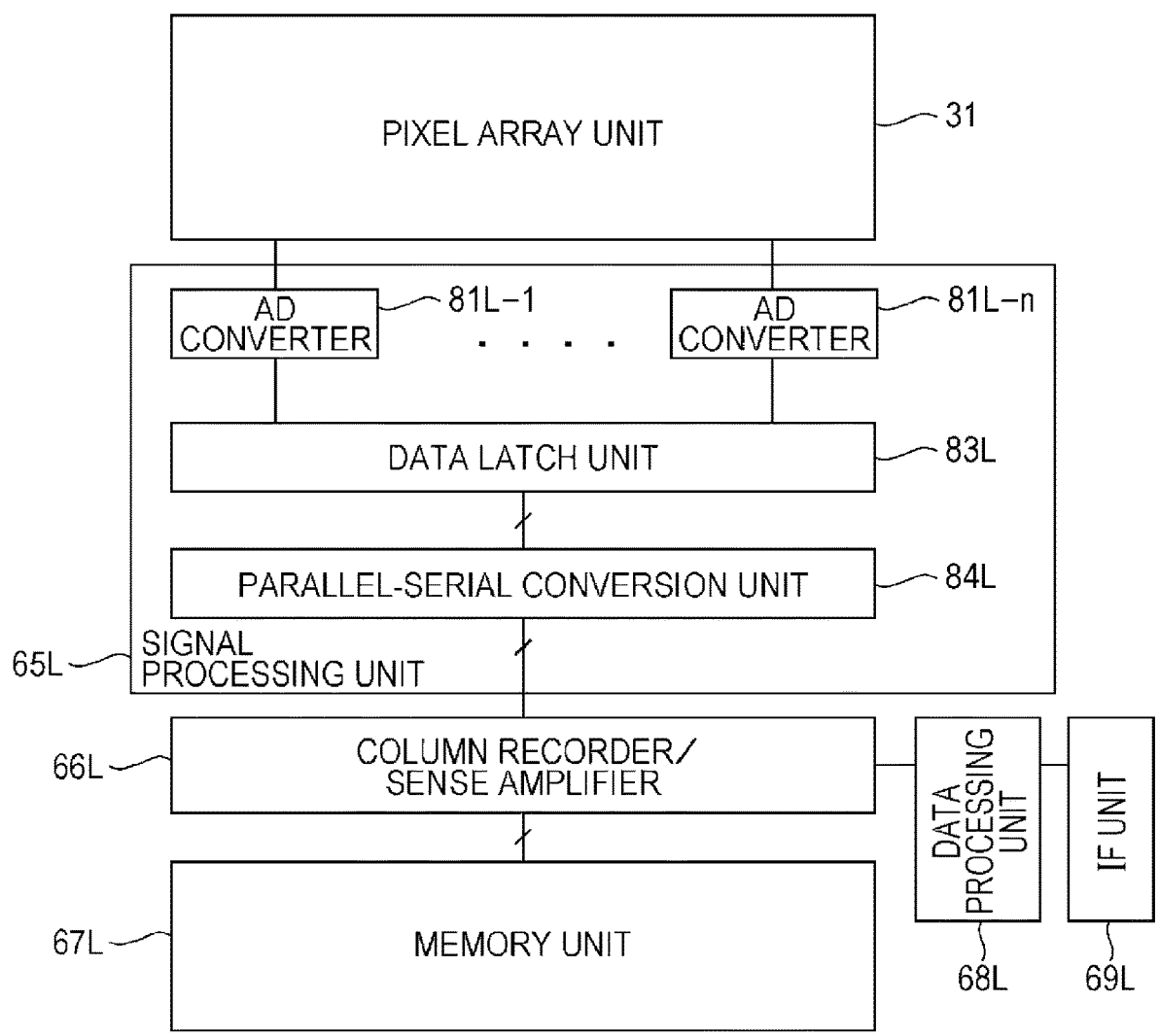
FIG. 3 is a block diagram illustrating a specific configuration example of a signal processing unit of the solid-state imaging device according to the first embodiment.

FIG. 3 is a block diagram illustrating an example of a specific configuration of the signal processing unit 65L. The signal processing unit 65L includes a data latch unit 83L and a parallel-serial conversion unit 84L, in addition to the AD converter 81L and the reference voltage generation unit 82L. The signal processing unit 65L has a pipeline configuration for pipeline-transferring the pixel data digitized by the AD converter 81L to the memory unit 67L. In this case, the signal processing unit 65L performs a digitization process by the AD converter 81L within one horizontal period, and performs a process of transferring the digitized pixel data to the data latch unit 83L in the next one horizontal period.

Meanwhile, the column decoder/sense amplifier 66L is provided as a peripheral circuit in the memory unit 67L. While the row decoder 64L described above (see FIG. 2) specifies the row address for the memory unit 67L, the column decoder specifies the column address for the memory unit 67L. Further, the sense amplifier amplifies a weak voltage, which is read through the hit lines from the memory unit 67L, to a level that can be handled as a digital level. Then, the pixel data read out through the column decoder/sense amplifier 66L is output to the outside of the logic board 12 through the data processing unit 68L and the interface unit 69L.

In addition, here, the case of having one column parallel AD converter 81L is described as an example, but the present embodiment is not limited thereto, and it is possible to employ a configuration in which two or more AD converters 81L are provided, and the two or more AD converters 81L are subjected to the digitization process in parallel.

In this case, two or more AD converters 81L are arranged, for example, in the extending direction of the signal line 34 of the pixel array unit 31, in other words, they are arranged by being divided into upper and lower sides of the pixel array unit 31. When two or more AD converters 81L are provided, respectively, two or more (two systems) of the data latch units 83L, the parallel-serial conversion units 84L, and the memory units 67L are provided corresponding thereto.

Thus, in a solid-state imaging device 1 employing a structure in which for example, two systems of AD converters 81L and the like are provided, the row scanning is performed in parallel for every two pixel rows. Then, signals of the respective pixels of one pixel row are read to one side in the vertical direction of the pixel array unit 31, and signals of the respective pixels of the other pixel row are read to the other side in the vertical direction of the pixel array unit 31, and the signals are digitized in parallel by two AD converters 81L. Similarly, the subsequent signal processes are performed in parallel. As a result, as compared with the case of performing row scan for each one pixel row, it is possible to perform high-speed readout of pixel data.

In addition, although detailed illustration and description thereof is omitted, the signal processing circuit 41R also has the same configuration as that of the signal processing circuit 41L. Then, the signal processing circuit 41R mainly processes pixel signals from the unit pixel 32 in the right half region of the pixel array unit 31.

In addition, hereinafter, the reference symbols of the respective units of the signal processing circuit 41R, not shown, are denoted by replacing L in the reference symbols of the respective units of the signal processing circuit 41L with R.

{1-3. Layout of Logic Board 12}

Figure 4:
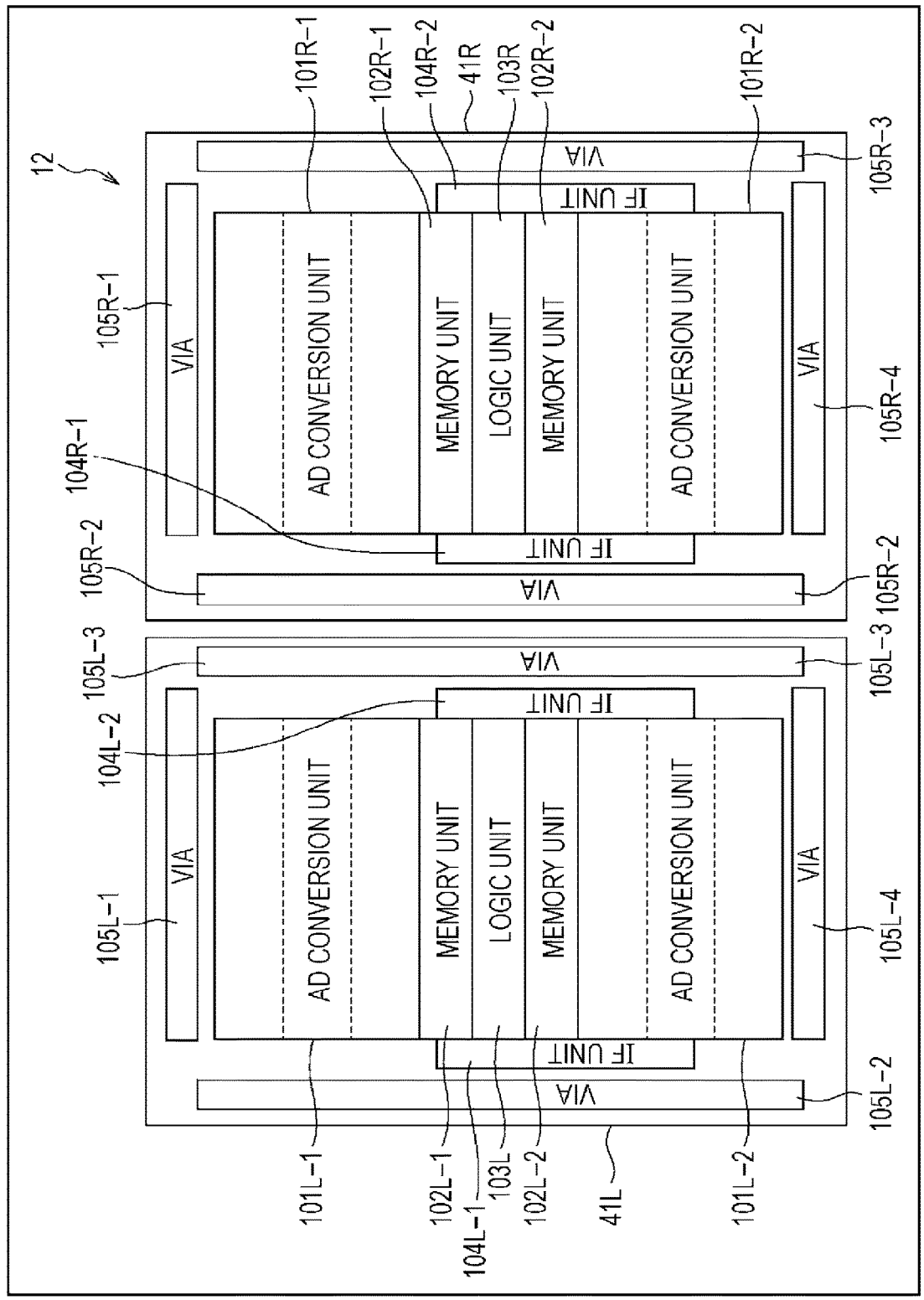
FIG. 4 is a diagram schematically illustrating a layout of a logic board of the solid-state imaging device according to the first embodiment.

FIG. 4 illustrates an example of a layout of the logic board 12. As illustrated in FIG. 4, the signal processing circuit 41L and the signal processing circuit 41R of the logic board 12 have the layouts of the same symmetry.

In the signal processing circuit 41L, an AD conversion unit 101L-1, a memory unit 102L-1, a logic unit 103L, a memory unit 102L-2, and an AD conversion unit 101L-2 are stacked in order from the top. In addition, an interface unit 104L-1 and an interface unit 104L-2 are located on the left and right sides of the stacked portion. Furthermore, vias 105L-1 to 105L-4 are arranged in the upper, lower, right and left ends of the signal processing circuit 41L.

For example, the current source 61L, the AD converters 81L-1 to 81L-n, the reference voltage generation unit 82L, the data latch unit 83L, and the parallel-serial conversion unit 84L, which are illustrated in FIGS. 2 and 3, are disposed and arranged in the AD conversion units 101L-1 and 101L-2.

In addition, in this example, the AD converter 81L and the circuit portion associated therewith are arranged to be stacked in each of the three stages, in the AD conversion units 101L-1 and 101L-2. In other words, the AD converter 81L and the circuit portion associated therewith are arranged while being divided into six systems in the signal processing circuit 41L. Then, the signal processing circuit 41L performs row scanning, for example, for every six pixel rows in parallel.

Further, the pixel signal from each unit pixel 32 in the pixel array unit 31 is supplied to the respective AD converters 81L disposed in the AD conversion units 101L-1 and 101L-2 through the vias 105L-1 to 105L-4.

For example, the column decoder/sense amplifier 66L and the memory unit 67L, which are illustrated in FIG. 3, are dispersed and arranged in the memory units 102L-1 and 102L-2. Then, the memory unit 102L-1 stores pixel data supplied from the AD conversion unit 101L-1, and the memory unit 102L-2 stores pixel data supplied from the AD conversion unit 101L-2.

For example, the decoder 62L, the control unit 63L, the row decoder 64L, and the data processing unit 68L, which are illustrated in FIG. 2, are arranged in the logic unit 103L.

For example, the interface unit 69L illustrated in FIG. 2 is arranged in the interface units 104L-1 and 104L-2, respectively.

In addition, since the signal processing circuit 41R has the same layout as that of the signal processing circuit 41L, the description thereof is omitted to avoid redundance.

Further, the configurations and layouts of the signal processing circuits 41L and 41R described above are examples, and a configuration and a layout other than those described above are possible.

{1-4. Imaging Process of Solid-State Imaging Device 1}

Next, an imaging process of the solid-state imaging device 1 will be simply described with reference to FIG. 5 and FIG. 6.

Figure 5:
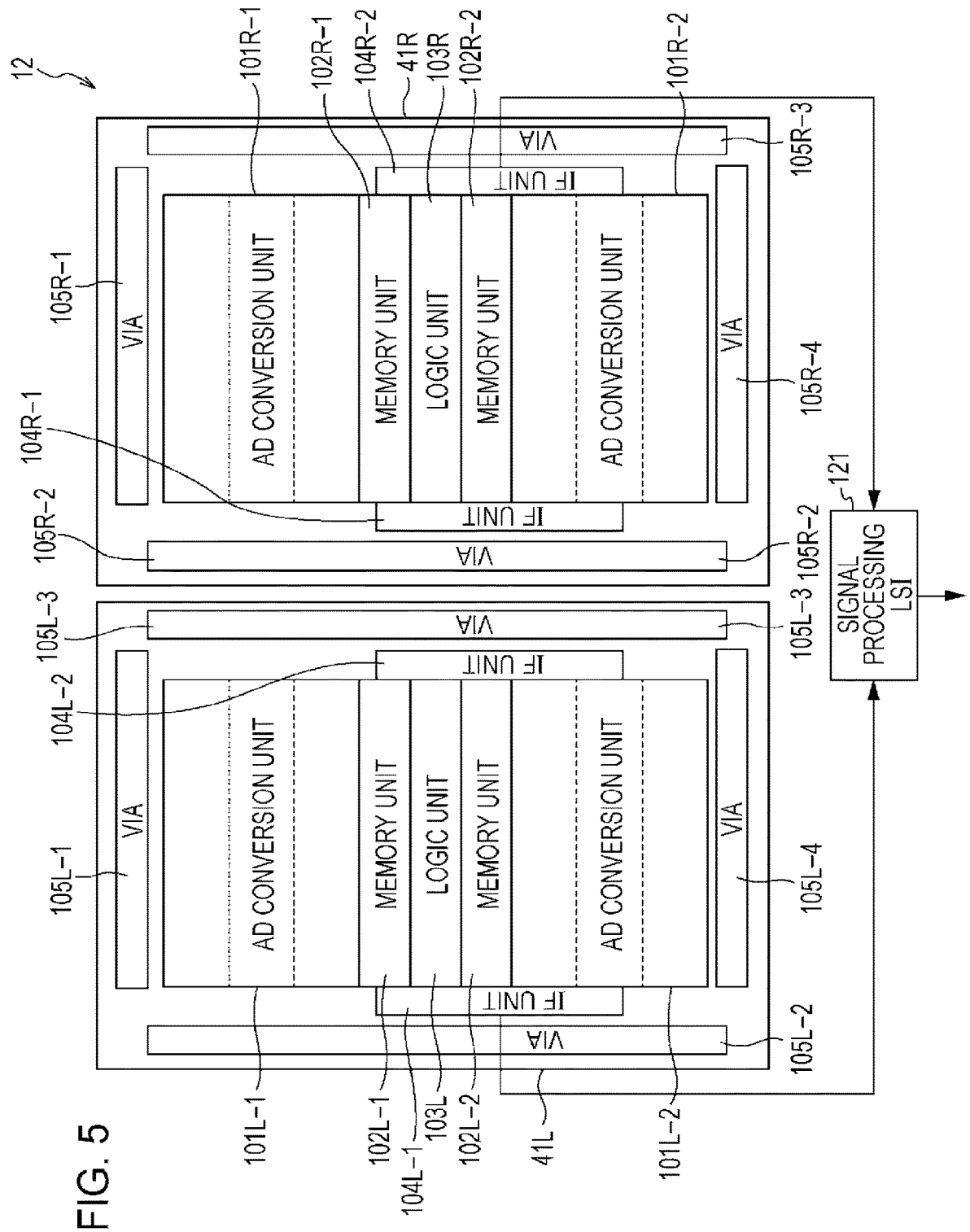
FIG. 5 is a diagram illustrating an example of a connection method of the signal processing circuit.

FIG. 5 illustrates an example of a method of connecting the signal processing circuits 41L and 41R of the solid-state imaging device 1 and the external signal processing LSI 121. Specifically, the signal processing LSI 121 is connected to the interface unit 104L-1 of the signal processing circuit 41L and the interface unit 104R-2 of the signal processing circuit 41R.

Figure 6:
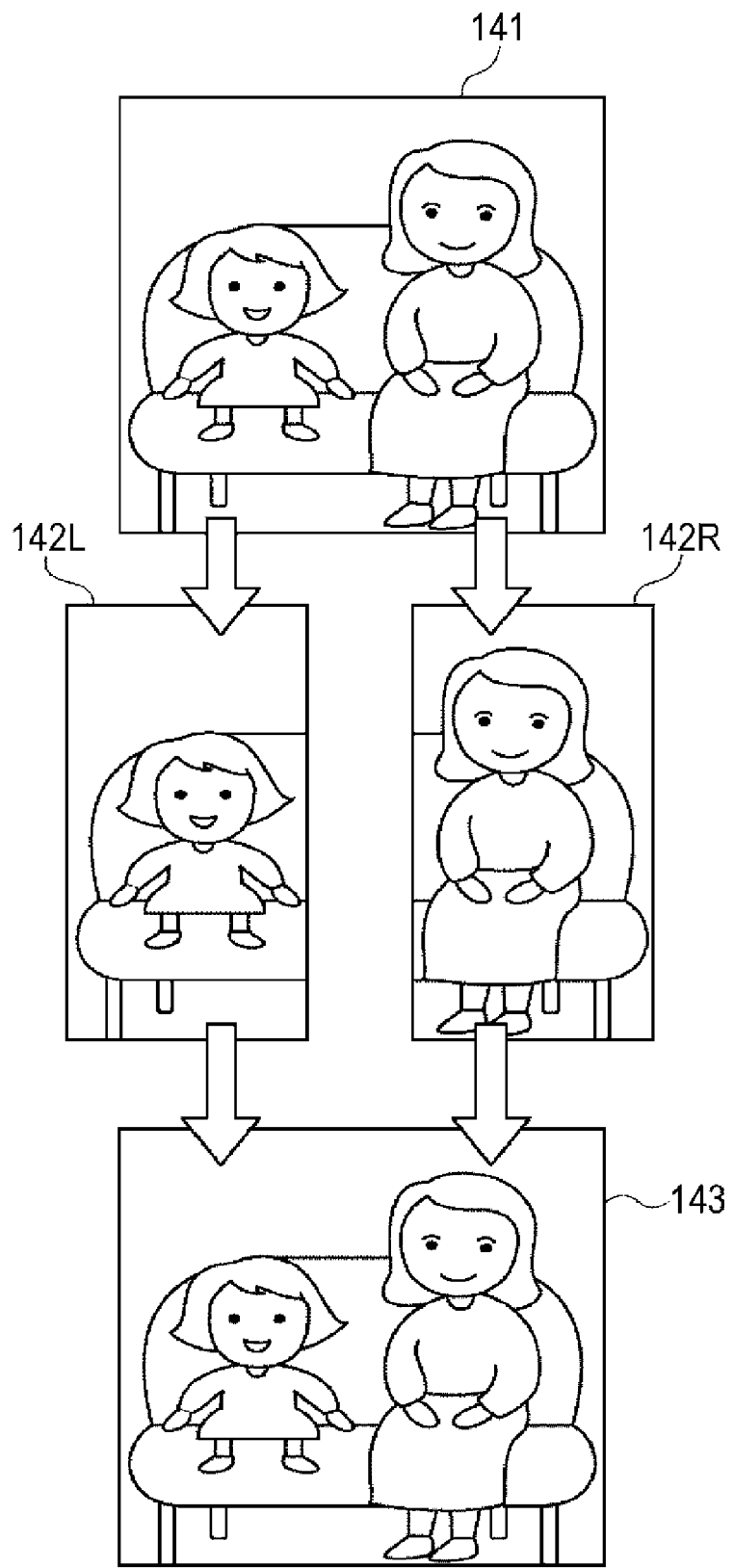
FIG. 6 is a diagram illustrating an imaging process of the solid-state imaging device according to the first embodiment.

For example, when the solid-state imaging device 1 captures an image of an object 141 of FIG. 6, pixel signals from the unit pixel 32 in the left half region of the pixel array unit 31 are supplied to the signal processing circuit 41L, and pixel signals from the unit pixel 32 in the right half region are supplied to the signal processing circuit 41R, in other words, the pixel signals corresponding to the left half part of the object 141 are supplied to the signal processing circuit 41L, and the pixel signals corresponding to the right half part of the object 141 are supplied to the signal processing circuit 41R.

The signal processing circuit 41L generates the pixel data 142L corresponding to the left half part of the object 141, based on the pixel signals supplied from the pixel circuit 21. Similarly, the signal processing circuit 41R generates the pixel data 142R corresponding to the right half part of the object 141, based on the pixel signals supplied from the pixel circuit 21.

Then, the signal processing circuit 41L outputs the generated pixel data 142L from the interface unit 104L-1, and supplies the pixel data to the signal processing LSI 121. The signal processing circuit 41R outputs the generated pixel data 142R from the interface unit 104R-2, and supplies the pixel data to the signal processing LSI 121.

The signal processing LSI 121 generates one piece of pixel data 143 by combining the pixel data 142L and the pixel data 142R, and outputs the generated pixel data 143.

In this manner, since the left and right parts of pixel data are generated independently in the solid-state imaging device 1, it is possible to speed up the process.

{1-5. Configuration Method of Left and Right Signal Processing Circuits 41}

As described above, the respective signal processing circuits 41 have the common circuit pattern and the same function. Meanwhile, as described above, the signal processing circuit 41L generates pixel data of the left half part of the object, and outputs the generated pixel data from the interface unit 104L-1 on the left side. Further, the signal processing circuit 41R generates pixel data of the right half part of the object, and outputs the generated pixel data from the interface unit 104R-2 on the right side. In other words, the signal processing circuit 41L operates as a circuit, which is located on the left side of the logic board 12, and the signal processing circuit 41R operates as a circuit, which is located on the right side of the logic board 12.

Thus, each signal processing circuit 41 has both functions so as to be able to operate as either the signal processing circuit 41L on the left side or the signal processing circuit 41R on the right side. Then, each of the signal processing circuits 41 is configured so as to operate as the signal processing circuit 41L on the left side or the signal processing circuit 41R on the right side by a signal from the outside. In other words, a valid function and an invalid function of each of the signal processing circuits 41 are set by the signal from the outside.

Figure 7:
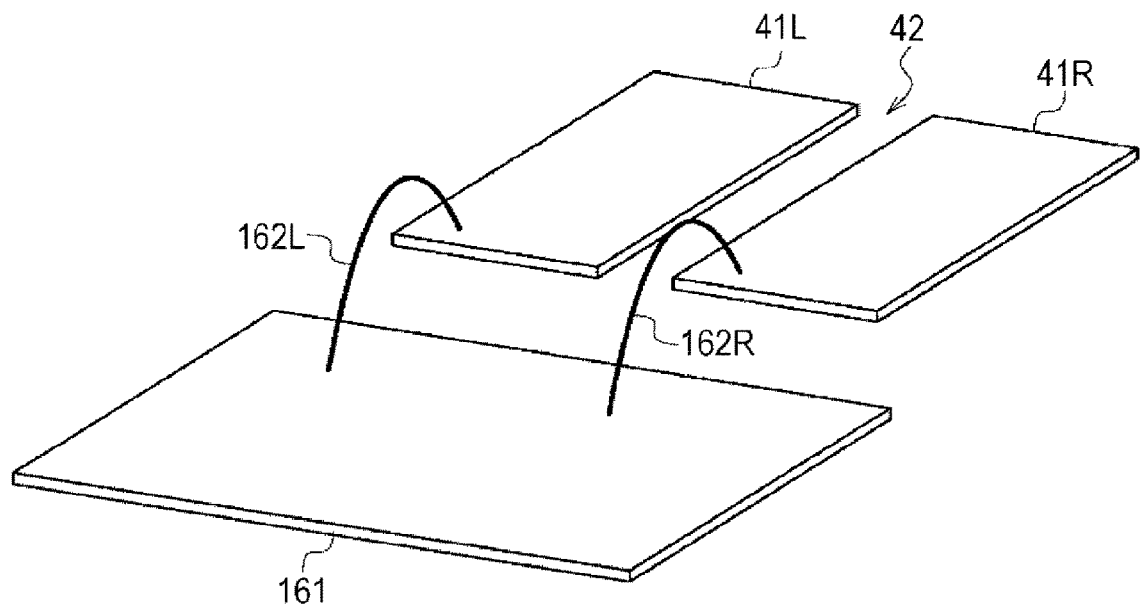
FIG. 7 is a diagram illustrating a configuration method of a left signal processing circuit and a right signal processing circuit.

Specifically, for example, as schematically illustrated in FIG. 7, the signal processing circuits 41L and 41R are respectively connected to an external substrate 161, by bonding wires 162L and 162R. In addition, the substrate 161 may be provided in the solid-state imaging device 1 and the same package, or may be provided outside the package.

Figure 8:
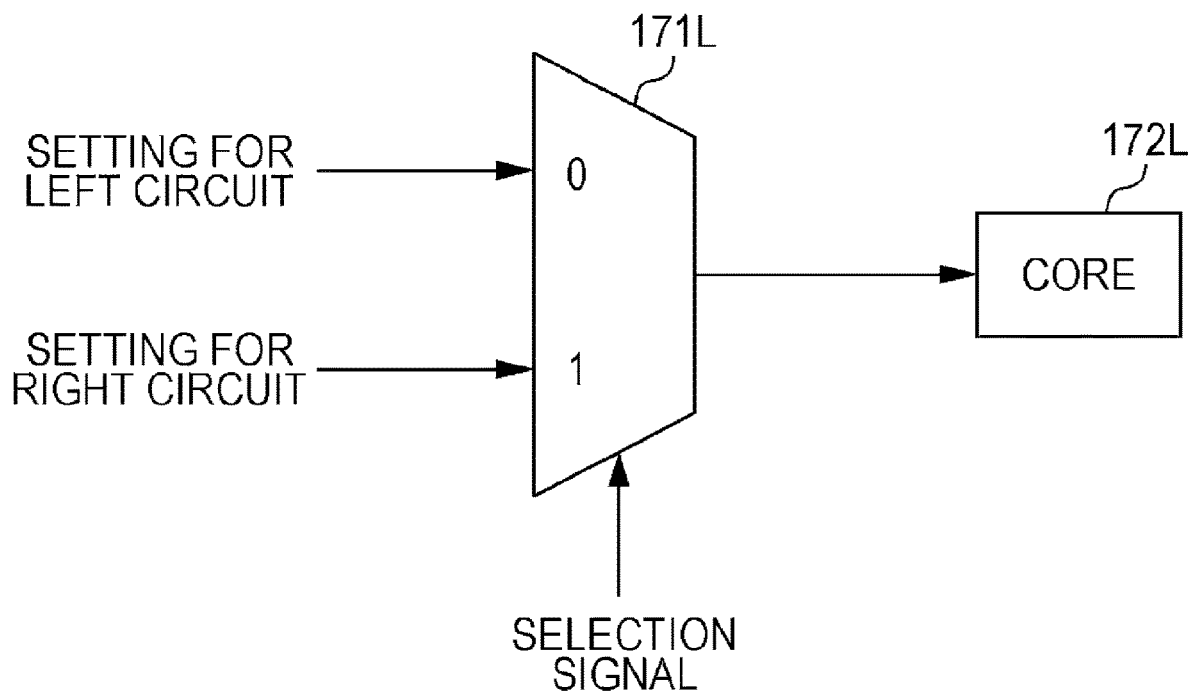
FIG. 8 is a diagram illustrating the configuration method of the left signal processing circuit and the right signal processing circuit.

Then, the substrate 161 supplies a selection signal to the signal processing circuit 41L through the bonding wire 162L. The selection signal is, for example, one of the values of the power supply level (High) and the ground level (Low). The signal processing circuit 41L includes a multiplexer 171L and a core 172L which are illustrated in FIG. 8. Then, the selection signal from the substrate 161 is input to the multiplexer 171L, and the multiplexer 171L supplies a setting signal indicating a value of 0 or 1 according to the selection signal to the core 172L.

With respect to a setting signal, when performing the setting for the left circuit (signal processing circuit 41L), the value is 0, and when performing the setting for the right circuit (signal processing circuit 41R), the value is 1. Then, the core 172L stores the value of the setting signal in a register, which is not shown, and the signal processing circuit 41L operates according to the value of the register. For example, the value of the register of the signal processing circuit 41L is set to 0, and the signal processing circuit 41L operates as the signal processing circuit on the left side.

In addition, without being illustrated, a multiplexer 171R and a core 172R are also provided in the signal processing circuit 41R, similar to the signal processing circuit 41L. Then, the signal processing circuit 41R is configured so as to operate as the signal processing circuit on the right side by the selection signal supplied from the substrate 161 through the bonding wire 162R, by using the same method as in the signal processing circuit 41L.

Further, since the signal processing circuit 41L and the signal processing circuit 41R have the same function, the function is duplicated. Thus, for the function, which may be performed by only one of the signal processing circuits 41, the function of one of the signal processing circuits 41 is enabled and the function of the other of the signal processing circuits 41 is disabled by the selection signal.

{1-6. Manufacturing Method of Solid-State Imaging Device 1}

Next, a manufacturing method of the solid-state imaging device 1 will be described with reference to FIG. 9 to FIG. 13. In addition, in FIG. 9 to FIG. 13, for clarity of illustration, only the pixel circuit 21 and the signal processing circuit 41 are illustrated, and the illustration of a wafer (semiconductor substrate) having the pixel circuit 21 and the signal processing circuit 41 formed thereon is omitted.

Figure 9:
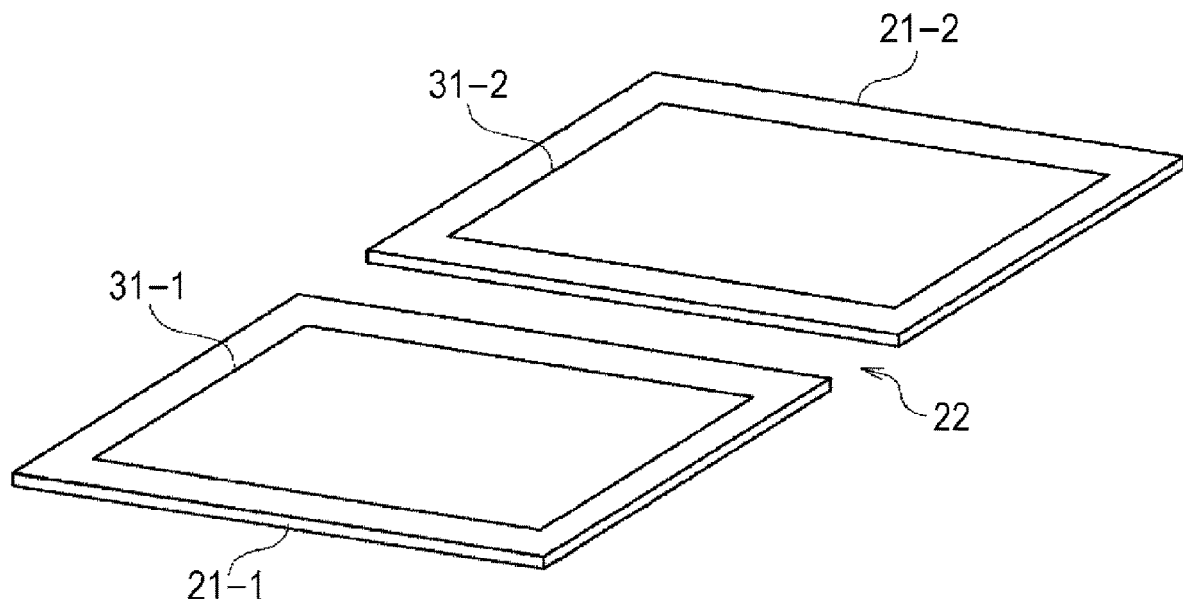
FIG. 9 is a diagram illustrating a manufacturing method of the solid-state imaging device according to the first embodiment.

First, as illustrated in FIG. 9, pixel circuits 21-1, 21-2, . . . are formed on the wafer (semiconductor substrate) not shown. In this case, since the area of each pixel circuit 21 is greater than the exposure range of an exposure apparatus, separate exposure is used for exposure of each pixel circuit 21.

Further, a scribe region 22 is provided in a longitudinal direction and a transverse direction between the adjacent pixel circuits 21. In addition, in FIG. 9, the width of the scribe region 22 is shown while being widely exaggerated in order to facilitate understanding of illustration. This is also applied to the following drawings.

Further, in FIG. 9, only two pixel circuits 21 of 2 rows*1 column are illustrated, but in fact, pixel circuits 21 of numbers greater than two are formed so as to be two-dimensionally arranged.

Figure 10:
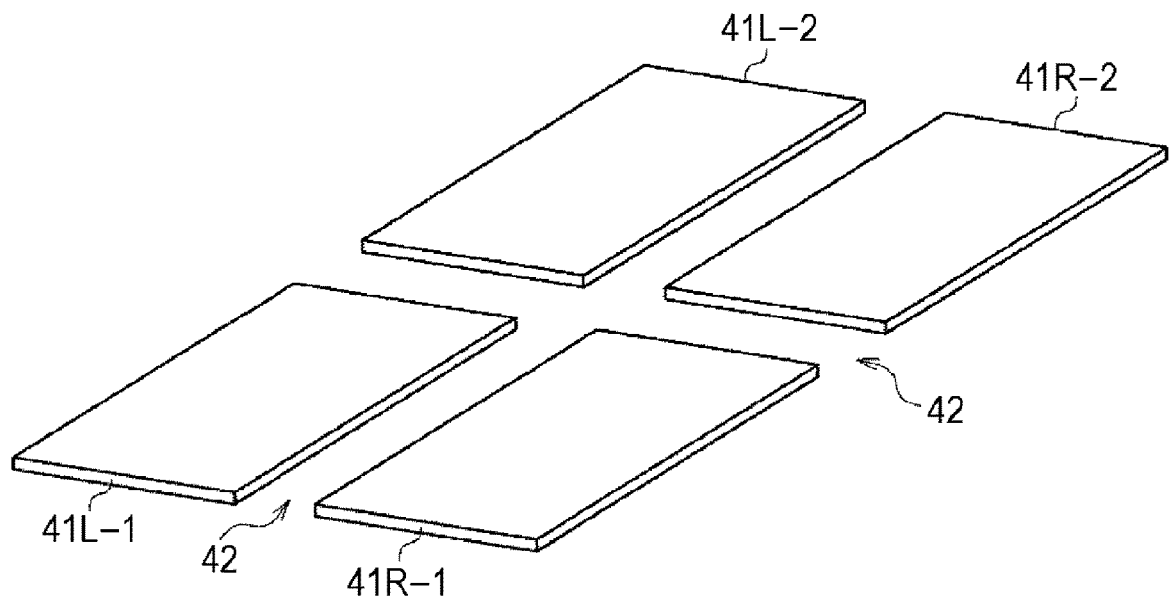
FIG. 10 is a diagram illustrating the manufacturing method of the solid-state imaging device according to the first embodiment.

Further, according to a manufacturing process other than in FIG. 9, as illustrated in FIG. 10, signal processing circuits 41L-1, 41R-1, 41L-2, 42R-2, . . . are formed on the wafer (semiconductor substrate) which is not illustrated. Among them, the signal processing circuit 41L-1 and the signal processing circuit 41R-1 are arranged on the same logic board 12, and the signal processing circuit 41L-2 and the signal processing circuit 41R-2 are arranged on the same logic board 12. In this case, since the area of the each signal processing circuit 41 is smaller than the exposure range of an exposure apparatus, one-shot exposure is used for the exposure of each signal processing circuit 41.

Further, a scribe region 42 is provided in a longitudinal direction and a transverse direction between signal processing circuits 41. It is of course that the scribe region 42 is provided between signal processing circuits 41, which are arranged on the same logic board 12.

Further, in FIG. 10, only four signal processing circuits 41 of 2 rows*2 columns are illustrated, but in fact, a larger number of signal processing circuits 41 are formed so as to be two-dimensionally arranged.

Figure 11:
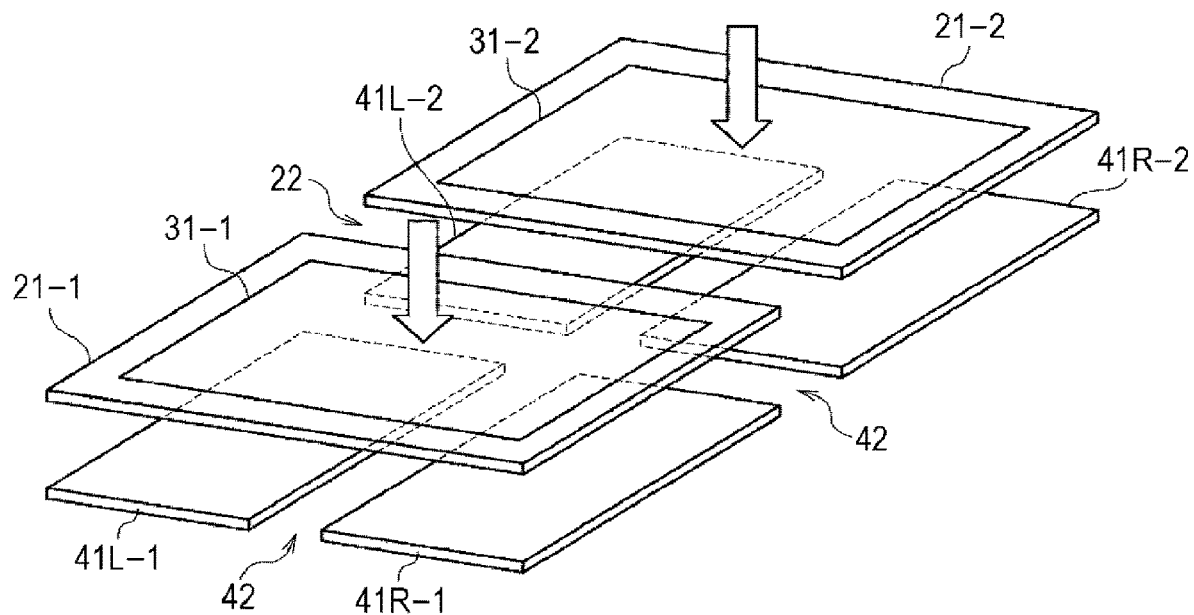
FIG. 11 is a diagram illustrating the manufacturing method of the solid-state imaging device according to the first embodiment.

Next, as illustrated in FIG. 11, the wafer (hereinafter, referred to as a pixel wafer) having the pixel circuit 21 formed thereon and the wafer (hereinafter, referred to as a logic wafer) having the signal processing circuit 41 formed thereon are bonded, and the pixel wafer and the logic wafer are stacked.

Here, the areas of the signal processing circuits 41 and the pixel circuits 21, which are respectively adjacent to the left and right through the scribe region 42, are substantially the same, and the pixel wafer and the logic wafer are stacked such that the scribe region 22 of the pixel wafer and the scribe region 42 of the logic wafer are overlapped. Thus, the pixel circuits 21 are perfectly overlapped on the signal processing circuits 41, which are adjacent to the left and right. For example, the pixel circuit 21-1 is perfectly overlapped on the signal processing circuit 41L-1 and the signal processing circuit 41R-1, which are adjacent to the left and right through the scribe region 42.

Further, the solid-state imaging device 1 is a back-illuminated type, and the pixel wafer and the logic wafer are stacked such that the substrate layer having the pixel circuit 21 of the logic wafer provided therein faces above and the wiring layer of the logic wafer and the wiring layer of the pixel wafer are adjacent.

In addition, hereinafter, a wafer in which the pixel wafer and the logic wafer are stacked is referred to as a stacked wafer.

Figure 12:
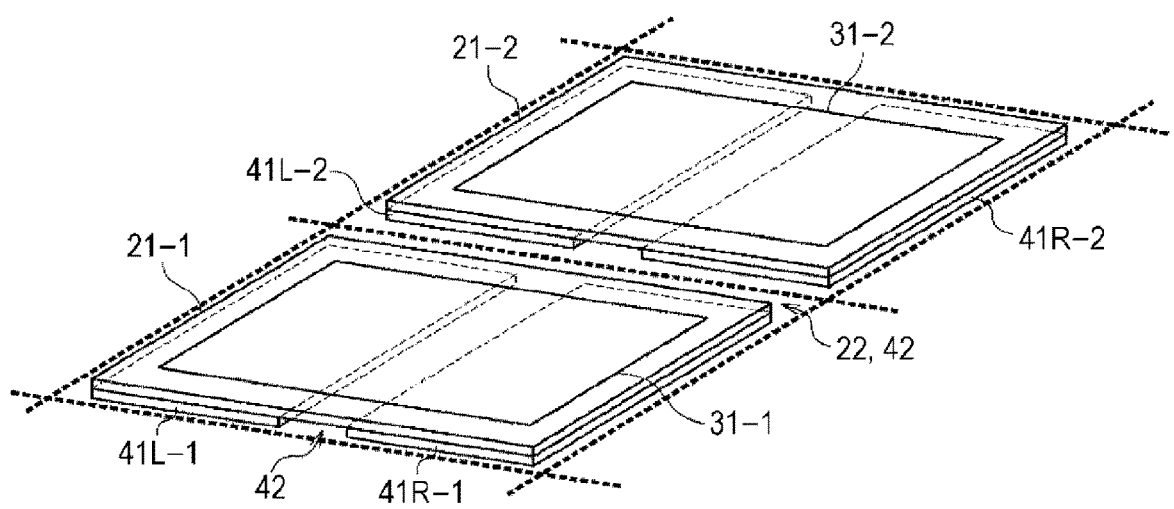
FIG. 12 is a diagram illustrating the manufacturing method of the solid-state imaging device according to the first embodiment.

Next, as indicated by thick dotted lines in FIG. 12, the stacked wafer is cut into units of chips. In other words, the stacked wafer is cut along the scribe region 22 of the pixel wafer provided around each pixel circuit 21. In addition, the scribe region 42 of the logic wafer, which does not overlap with the scribe region 22 of the pixel wafer, is left as it is without being cut.

Figure 13:
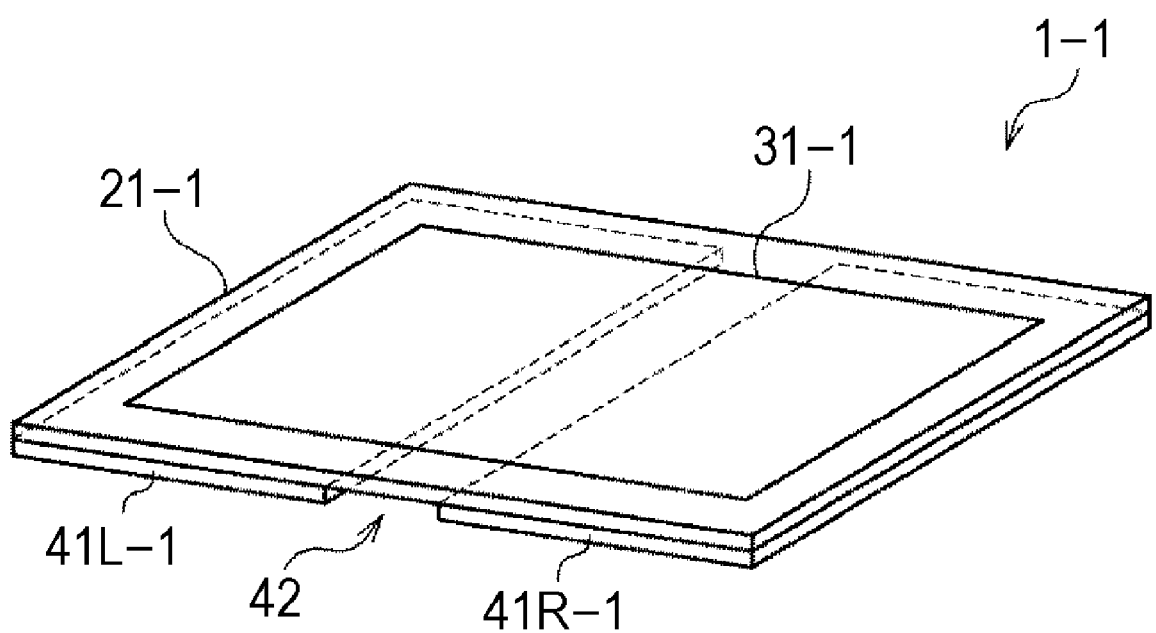
FIG. 13 is a diagram illustrating the manufacturing method of the solid-state imaging device according to the first embodiment.

Thus, a solid-state imaging device in which the pixel circuit 21 is stacked on the signal processing circuits 41, which are adjacent to the left and right, while the scribe region 42 is left is singulated. For example, as illustrated in FIG. 13, a solid-state imaging device 1-1, in which the pixel circuit 21-1 is stacked on the signal processing circuits 41L-1 and 41R-1, which are adjacent through the scribe region 42, is singulated.

In this manner, even when the area of the pixel circuit 21 on the pixel substrate 11 is greater than the exposure range of an exposure apparatus, and separate exposure is necessary, each signal processing circuit 41 on the logic board 12 is manufactured by one-shot exposure, without using the separate exposure. Further, regardless of whether each signal processing circuit 41 is disposed in either one of the left and right of the solid-state imaging device 1, the signal processing circuits 41 of the same circuit pattern are formed so as to be two-dimensionally arranged at a certain distance (i.e., scribe region 42). Thus, for example, it is possible to reduce the types of the photomasks necessary for manufacture of the logic board 12, and even an exposure apparatus without a photomask changing apparatus can manufacture the logic board 12.

2. Second Embodiment

As described above, in the solid-state imaging device 1, two signal processing circuits each independently performs a process while not being electrically connected. In contrast, in a second embodiment of the present technology, two signal processing circuits perform some processes in cooperation with each other while being electrically connected.

{2-1. System Configuration}

Figure 14:
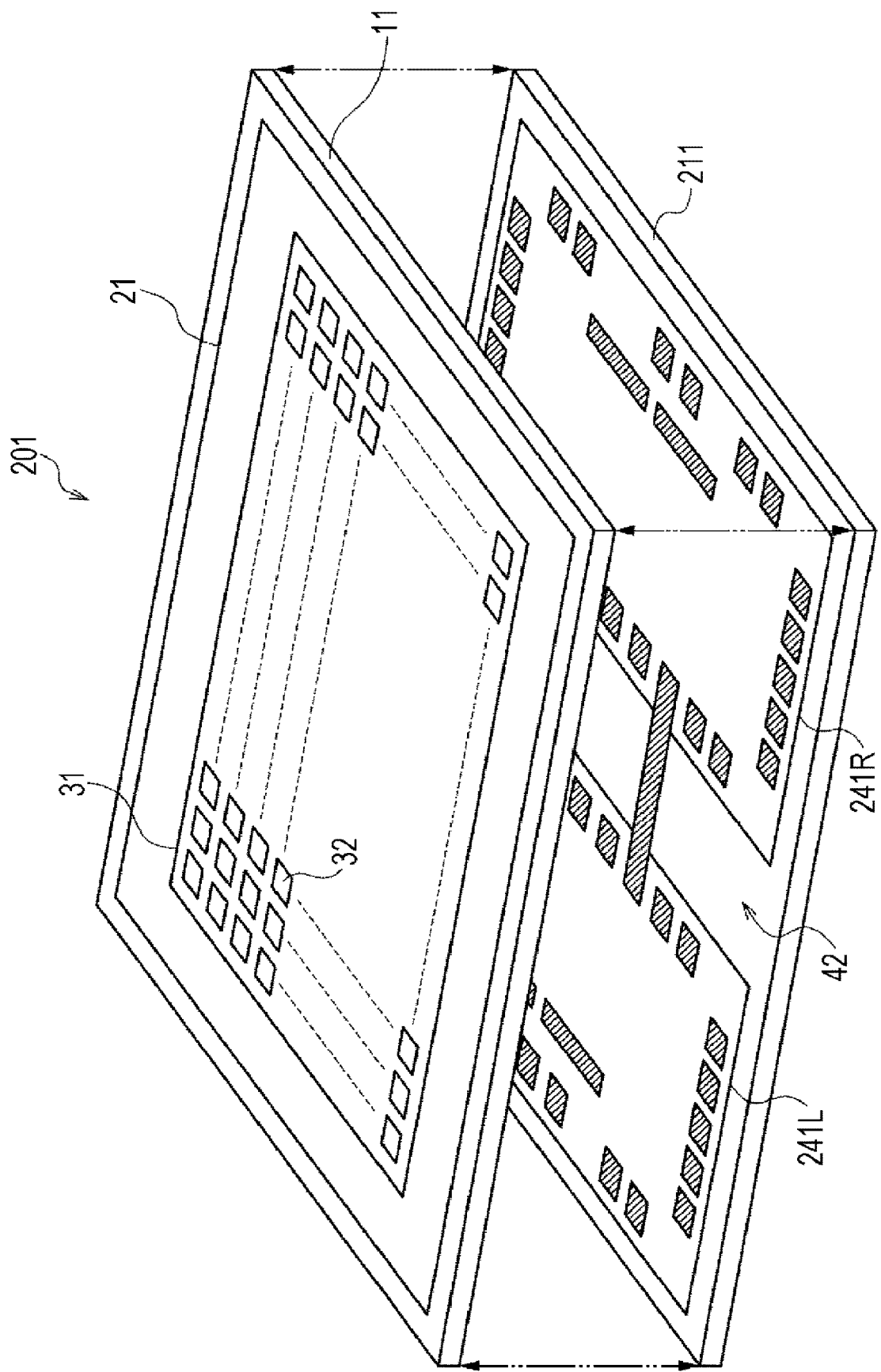
FIG. 14 is a perspective view schematically illustrating a solid-state imaging device according to a second embodiment of the present technology.

FIG. 14 is a perspective view schematically illustrating a configuration example of a solid-state imaging device 201 according to the second embodiment of the present technology. In addition, here, in FIG. 14, the portions corresponding to FIG. 1 are denoted by the same reference numerals, and the description of the portions of the same process is redundant, so the description thereof will be appropriately omitted.

As illustrated in FIG. 14, the solid-state imaging device 201 is a semiconductor chip of a structure (so-called, a stacked structure) in which the pixel substrate 11 and the logic board 211 are stacked, similar to the solid-state imaging device 1.

The logic board 211 is different from the logic board 12 in that signal processing circuits 241L and 241R are provided instead of the signal processing circuits 41L and 41R. Further, the logic board 211 is different from the logic board 12 in that a wiring layer (hereinafter, referred to as inter-circuit wiring layer) for electrically connecting the signal processing circuit 241L and the signal processing circuit 241R is provided on the top of the logic board 12. In other words, the pattern denoted by oblique lines on the logic board 211 of FIG. 14 represents a wiring pattern of the inter-circuit wiring layer, and the signal processing circuit 241L and the signal processing circuit 241R are electrically connected in the inter-circuit wiring layer.

Further, part of the layout of the signal processing circuits 241L and 241R is different from that of the signal processing circuits 41L and 41R, as described later with reference to FIG. 15.

In addition, when there is no need to distinguish the signal processing circuit 241L and the signal processing circuit 241R, hereinafter, they are simply referred to as a signal processing circuit 241.

{2-2. Layout of Logic Board 211}

Figure 15:
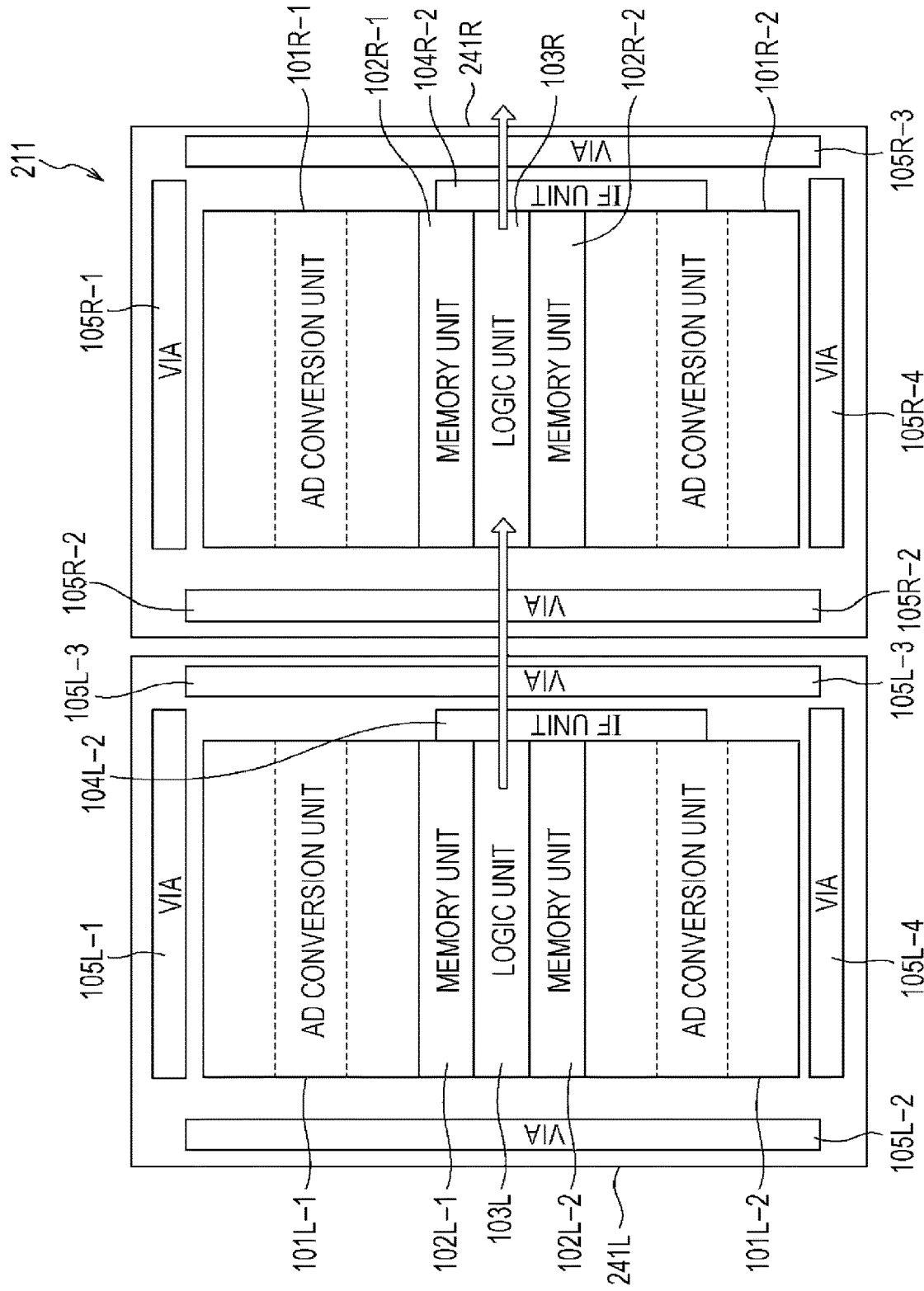
FIG. 15 is a diagram illustrating an imaging process of the solid-state imaging device according to the second embodiment.

FIG. 15 illustrates an example of a layout of the logic board 211. In addition, in FIG. 15, the illustration of the inter-circuit wiring layer is omitted. Further, in FIG. 15, the portions corresponding to FIG. 4 are denoted by the same reference numerals, and the description of the portions of the same process will be omitted.

The signal processing circuit 241L is different from the signal processing circuit 41L of FIG. 4 in that the interface unit 104L-1 is omitted, and only the interface unit 104L-2 is provided. Similarly, the signal processing circuit 241R is different from the signal processing circuit 41R of FIG. 4 in that the interface unit 104R-1 is omitted, and only the interface unit 104R-2 is provided.

{2-3. Imaging process of solid-state imaging device 201}

Next, an imaging process of the solid-state imaging device 201 will be simply described with reference to FIG. 6 and FIG. 15.

For example, when the solid-state imaging device 201 captures an object 141 of FIG. 6, pixel signals from the unit pixels 32 in the left half region of the pixel array unit 31 are supplied to the signal processing circuit 241L and pixel signals from the unit pixels 32 in the right half region are supplied to the signal processing circuit 241R, in other words, the pixel signals corresponding to the left half part of the object 141 are supplied to the signal processing circuit 241L, and the pixel signals corresponding to the right half part of the object 141 are supplied to the signal processing circuit 241R.

The signal processing circuit 241L generates the pixel data 142L corresponding to the left half part of the object 141, based on the pixel signals supplied from the pixel circuit 21. Similarly, the signal processing circuit 241R generates the pixel data 142R corresponding to the right half part of the object 141, based on the pixel signals supplied from the pixel circuit 21.

The processes up to here are the same as in the solid-state imaging device 1 described above.

Then, logic unit 103L of the signal processing circuit 241L supplies the generated pixel data 142L to the logic unit 103R of the signal processing circuit 241R through the inter-circuit wiring layer, which is not shown.

The logic unit 103R generates one piece of pixel data 143 by combining the pixel data 142L supplied from the signal processing circuit 241L and the pixel data 142R that the logic unit 103R generates. Then, the logic unit 103R outputs the generated pixel data 143 to the outside through the interface unit 104R-2.

In this manner, the solid-state imaging device 201 can generate and output one completed pixel data without using a device, such as an external LSI, differently from the solid-state imaging device 1. Therefore, the signal processing LSI 121 does not have to be externally provided and it is possible to reduce costs.

In addition, even in the solid-state imaging device 201, similar to the solid-state imaging device 1, the signal processing circuit 241L and the signal processing circuit 241R are configured so as to operate as either one of the left and right signal processing circuits by the method described with reference to FIG. 7 and FIG. 8.

<Manufacturing Method of Solid-State Imaging Device 201>

Next, a manufacturing method of the solid-state imaging device 201 will be described with reference to FIG. 9 and FIG. 10, which are previously illustrated, and FIG. 16 to FIG. 19. In addition, in FIG. 16 to FIG. 19, similar to FIG. 9 to FIG. 13, for clarity of illustration, only the pixel circuit 21 and the signal processing circuit 241 are illustrated, and the illustration of a wafer (semiconductor substrate) having the pixel circuit 21 and the signal processing circuit 241 formed thereon is omitted.

First, a pixel wafer in which pixel circuits 21 are arranged two-dimensionally through the scribe region 22, and a logic wafer in which signal processing circuits 241 are arranged two-dimensionally through the scribe region 42 are manufactured by a method similar to the method described above with reference to FIG. 9 and FIG. 10.

Figure 16:
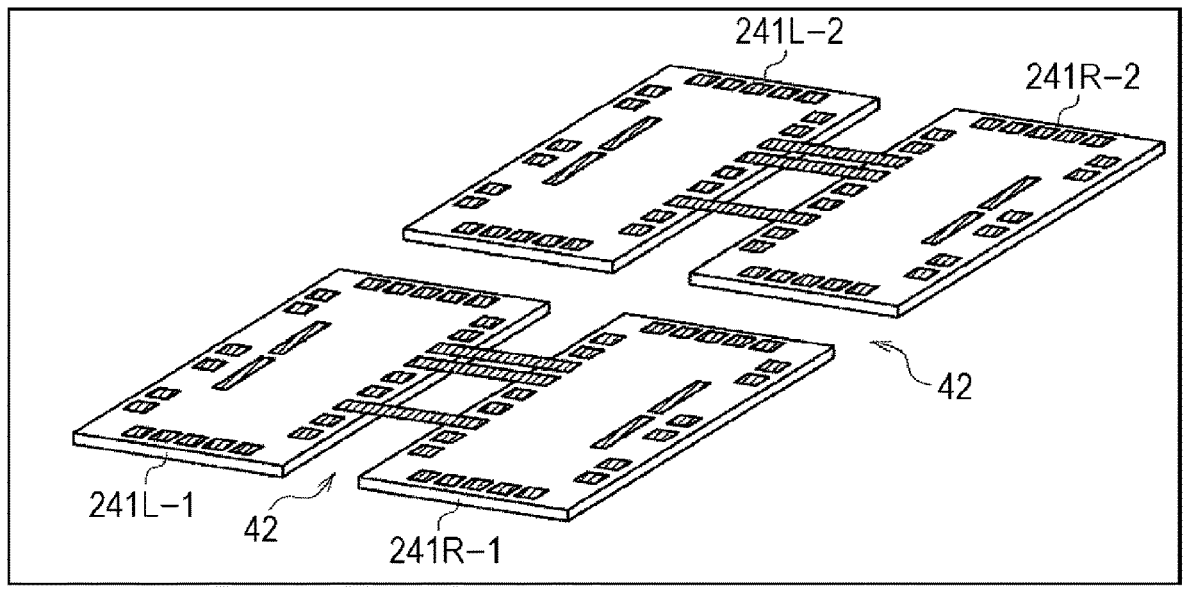
FIG. 16 is a diagram illustrating a manufacturing method of the solid-state imaging device according to the second embodiment.

Next, as illustrated in FIG. 16, the inter-circuit wiring layer is formed on the top layer of the logic wafer. In addition, since the inter-circuit wiring layer has a size substantially the same as that of the pixel circuit 21 of the pixel substrate 11, it is formed by using separate exposure. Two signal processing circuits 241 (for example, the signal processing circuit 241L-1 and the signal processing circuit 241R-1), which are disposed in the same solid-state imaging device 201, are electrically connected through the inter-circuit wiring layer.

In addition, for example, a manufacturer of the logic wafer may manufacture a logic wafer before exposure on which only a metal film for an inter-circuit wiring layer is formed, and deliver it to a manufacturer of the solid-state imaging device 201. Then, for example, the manufacturer of the solid-state imaging device 201 may stack the pixel wafer and the logic wafer after forming the inter-circuit wiring layer of the logic wafer by the separate exposure. Thus, even a manufacturer without having separate exposure equipment can manufacture the logic wafer.

Figure 17:
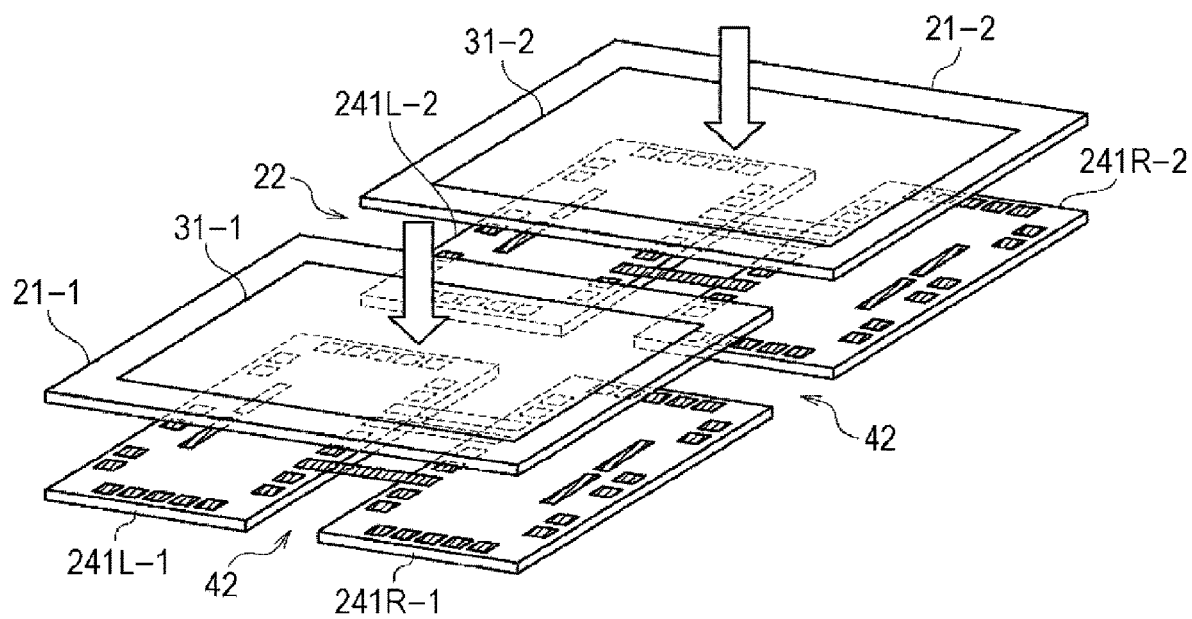
FIG. 17 is a diagram illustrating the manufacturing method of the solid-state imaging device according to the second embodiment.

Next, as illustrated in FIG. 17, the pixel wafer and the logic wafer are stacked by a method similar to the method described above with reference to FIG. 11.

Figure 18:
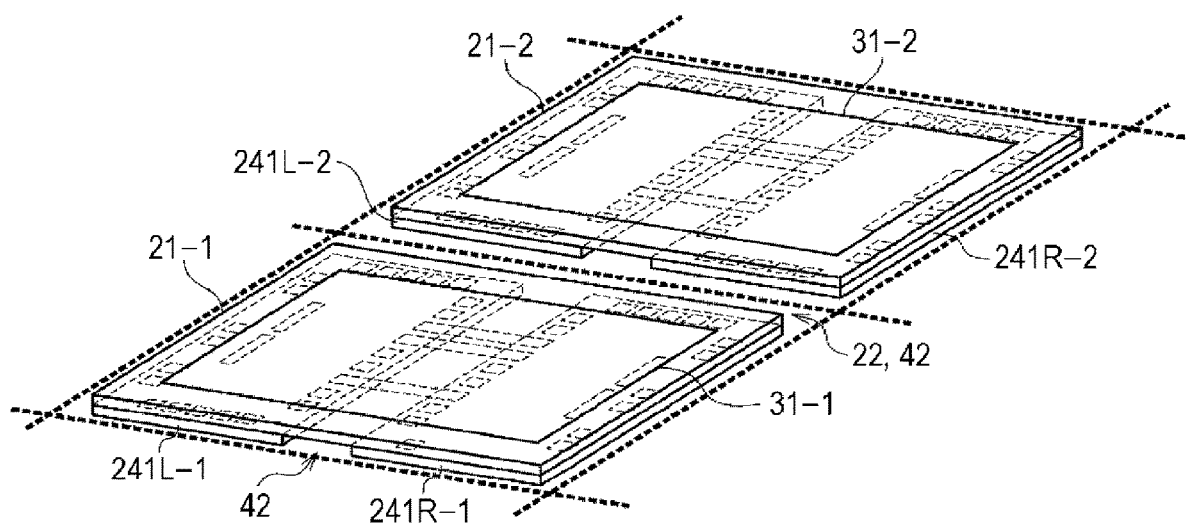
FIG. 18 is a diagram illustrating the manufacturing method of the solid-state imaging device according to the second embodiment.
Figure 19:
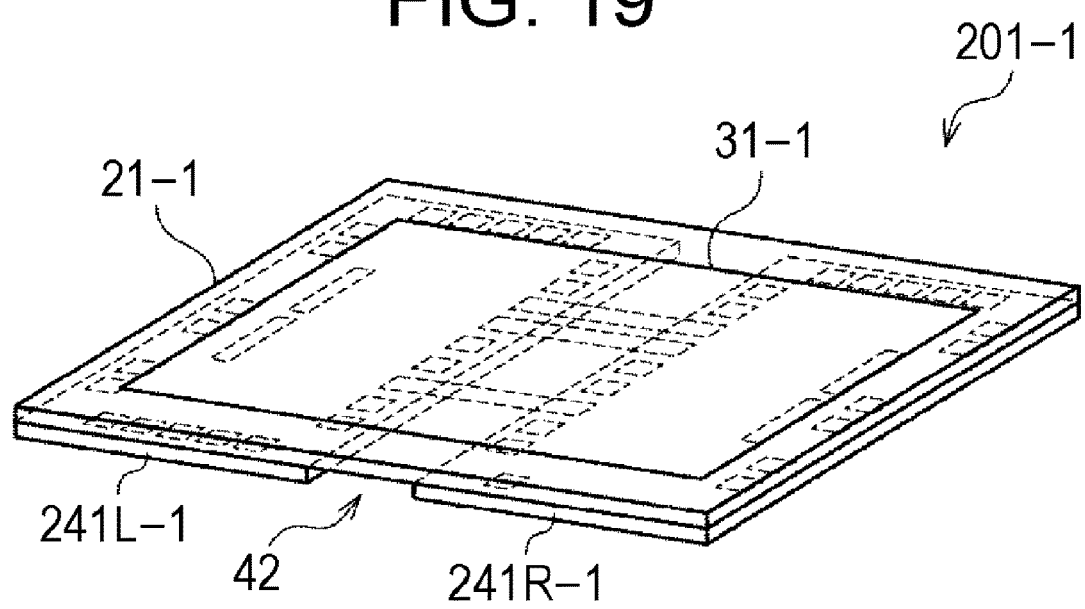
FIG. 19 is a diagram illustrating the manufacturing method of the solid-state imaging device according to the second embodiment.

Then, as illustrated in FIG. 18, the stacked wafer is cut into units of chips similar to the manufacturing process described above with reference to FIG. 12. Thus, for example, as illustrated in FIG. 19, the solid-state imaging device 201-1, in which the pixel circuit 21-1 is stacked on the signal processing circuits 241L-1 and 241R-1, which are adjacent through the scribe region 42, is singulated.

In addition, although the example described above represents an example in which the inter-circuit wiring layer is formed on the top layer of the logic board 211, the inter-circuit wiring layer may be formed on the layer below the top layer. For example, when a plurality of wiring layers are provided in the signal processing circuit 241, the signal processing circuit 241L and the signal processing circuit 241R may be connected in the wiring layer, which is formed on the layer below the top layer of the logic board 211.

Further, for example, the signal processing circuit 241L and the signal processing circuit 241R may be connected through a plurality of wiring layers. In other words, a plurality of the inter-circuit wiring layers may be formed. Further, not only a wiring for connecting the signal processing circuit 241L and the signal processing circuit 241R, but also an internal wiring of each signal processing circuit 241 (for example, a wiring between elements) may be provided in the inter-circuit wiring layer.

Further, even when the inter-circuit wiring layer is disposed in any layer of the logic board 211, for example, among respective layers of the logic board 211, the inter-circuit wiring layer is formed by separate exposure, and the other layer is formed by one-shot exposure. In addition, when the inter-circuit wiring layer is formed by different manufacturers as described above, it is preferable to form the inter-circuit wiring layer on the top layer of the logic board 211.

3. Third Embodiment

In a third embodiment of the present technology, the left and right signal processing circuits are electrically connected by a method different from that in the second embodiment.

Figure 20:
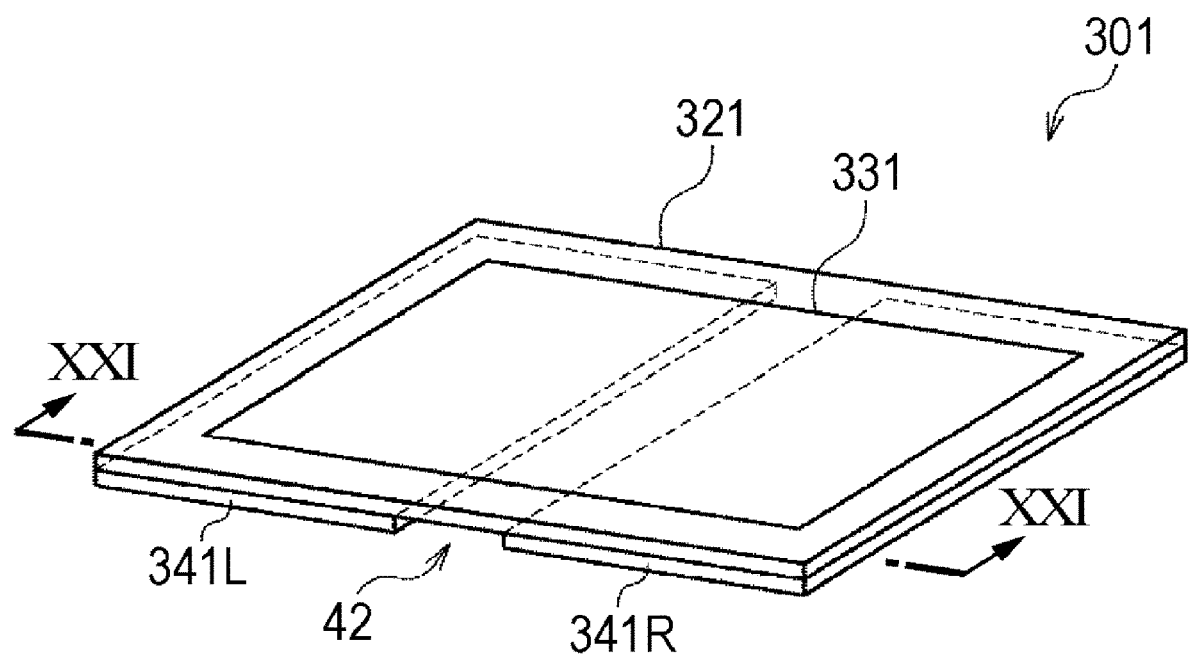
FIG. 20 is a perspective view schematically illustrating a solid-state imaging device according to a third embodiment of the present technology.

Specifically, FIG. 20 is a perspective view schematically illustrating a configuration example of a solid-state imaging device 301 according to the third embodiment of the present technology. Similar to the solid-state imaging device 1 and the solid-state imaging device 201, the solid-state imaging device 301 is a semiconductor chip of a structure (i.e., a stacked structure) in which the pixel substrate 311 (FIG. 21) having the pixel circuit 321 formed thereon and the logic board 312 (FIG. 21) having the signal processing circuits 341L and 341R formed thereon are stacked.

A pixel array unit 331, similar to the pixel array unit 31 of the pixel circuit 21 of FIG. 1, is formed on the pixel circuit 321. Further, the pixel circuit 321 has the same circuit configuration as that of the pixel circuit 21 described above with reference to FIG. 2. The signal processing circuits 341L and 341R have the same circuit configuration as that of the signal processing circuits 41L and 41R described above with reference to FIG. 2 and FIG. 3. The logic board 312 has the same layout as that of the logic board 12 described above with reference to FIG. 4. In this manner, the solid-state imaging device 301 has substantially the same circuit configuration and layout as that of the solid-state imaging device 1.

However, the solid-state imaging device 301 is different from the solid-state imaging device 1, and the signal processing circuit 341L and the signal processing circuit 341R are electrically connected in the pixel substrate 311.

Figure 21:
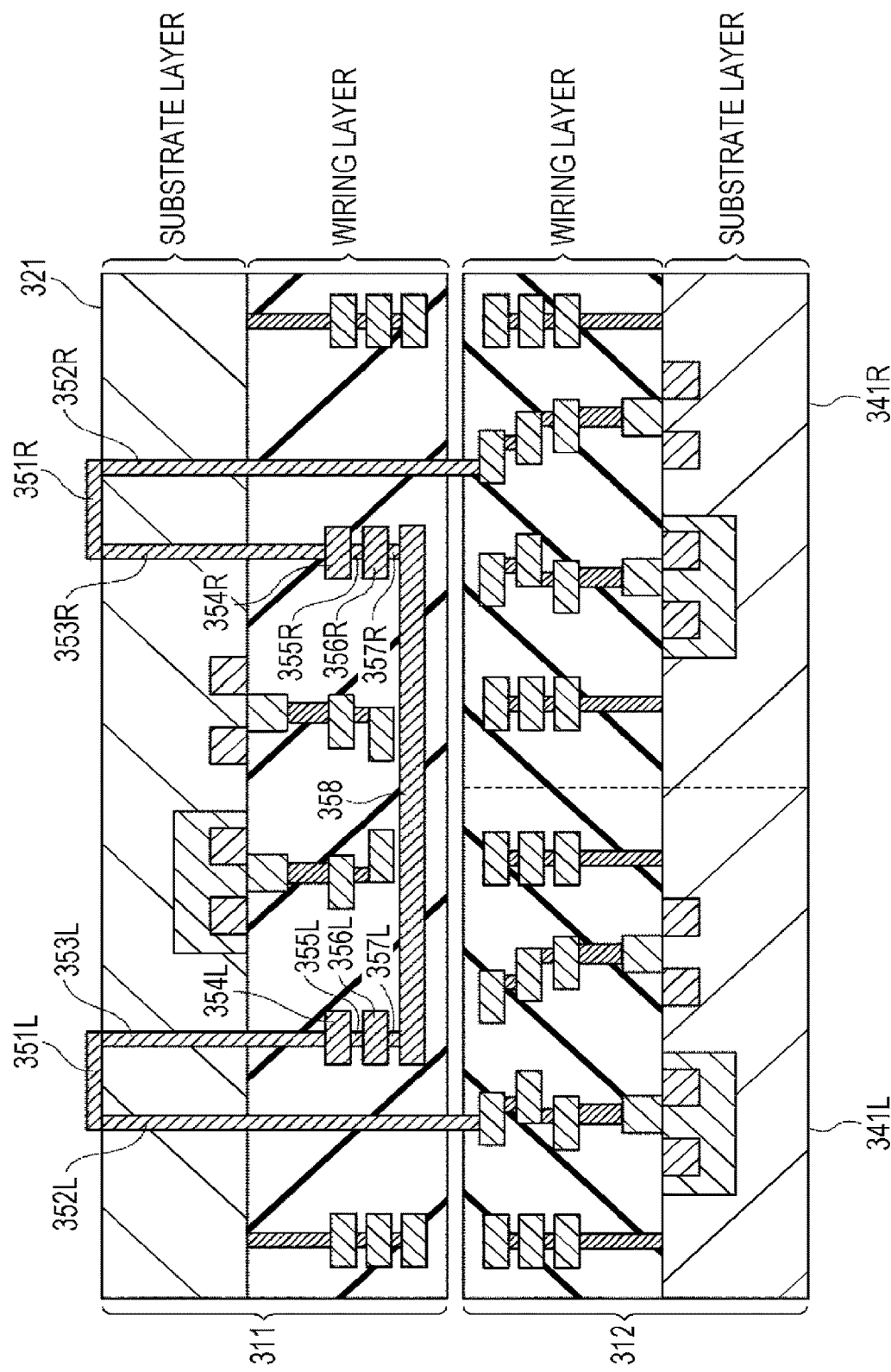
FIG. 21 is a cross-sectional view schematically illustrating the solid-state imaging device according to the third embodiment of the present technology.

Specifically, FIG. 21 illustrates a XXI-XXI sectional view of the solid-state imaging device 301 of FIG. 20. In other words, FIG. 21 is an outside of the pixel array unit 331 of the pixel circuit 321, and illustrates a cross section of the solid-state imaging device 301 on the front side in FIG. 20.

Since the solid-state imaging device 301 is a back-illuminated type imaging element, the wiring layer of the pixel substrate 311 and the wiring layer of the logic board 312 are arranged so as to be adjacent. Thus, the substrate layer of the pixel substrate 311 is disposed on the top, and the substrate layer of the logic board 312 is disposed on the bottom.

On the substrate layer of the pixel substrate 311, wirings 351L and 351R are formed on the outside of the pixel array unit 331. The wiring 351L is disposed above the signal processing circuit 341L, and the wiring 351R is disposed above the signal processing circuit 341R.

Then, the wiring 351L is connected to the wiring layer of the signal processing circuit 341L, through a via 352L formed in the pixel substrate 311. Further, the wiring 351L is connected to a wiring 354L through a via 353L. The wiring 354L is connected to a wiring 356L through a via 355L. The wiring 356L is connected to a wiring 358 through a via 357L.

Then, the wiring 351R is connected to the wiring layer of the signal processing circuit 341R, through a via 352R formed in the pixel substrate 311. Further, the wiring 351R is connected to a wiring 354R through a via 353R. The wiring 354R is connected to a wiring 356R through a via 355R. The wiring 356R is connected to a wiring 358 through a via 357R.

Thus, the wiring layer of the signal processing circuit 341L and the wiring layer of the signal processing circuit 341R are electrically connected through the via 352L, the wiring 351L, the via 353L, the wiring 354L, the via 355L, the wiring 356L, the via 357L, the wiring 358, the via 357R, the wiring 356R, the via 355R, the wiring 354R, the via 353R, the wiring 351R, and the via 352R.

Accordingly, the solid-state imaging device 301 can also generate and output one piece of pixel data obtained by capturing an object, by the method described above with reference to FIG. 6 and FIG. 15, similar to the solid-state imaging device 201.

In addition, the wirings 351L and 351R, the vias 352L and 352R, and the like of the pixel circuit 321 are formed, for example, during the manufacture of the pixel wafer described above with reference to FIG. 9.

Further, the number of layers of the wiring layer of the pixel substrate 311 of FIG. 21 is an example, and it is possible to set any number of layers. Further, for example, a wiring 358 for electrically connecting the signal processing circuit 341L and the signal processing circuit 341R in the wiring layer of the pixel substrate 311 may be provided in any wiring layer of the pixel substrate 311, and also, for example, may be formed by being divided into a plurality of wiring layers.

4. Modifications

Hereinafter, modifications of the embodiments of the present technology described above will be described.

{4-1. Modifications of Configuration of Solid-State Imaging Device}

(Modification of Logic Board)

The example of providing two signal processing circuits on the logic board has been described above, but three or more signal processing circuits may be provided.

Further, the circuit patterns and the sizes of the signal processing circuits provided on a single logic board are not necessary all the same, and it is also possible to mix signal processing circuits having different circuit patterns and sizes. Here, the manufacturing process is simpler and the manufacturing cost is less in the case of providing signal processing circuits of the same circuit pattern on the logic board, as compared to the case of mixing signal processing circuits having different circuit patterns and sizes.

(Variation of Stacked Structure)

Further, the example has been described above in which the solid-state imaging device has a stacked structure of two layers of the pixel substrate and the logic board, but the present technology can be applied to a stacked structure of three layers or more. For example, a logic board may be further stacked under the logic board 12 of FIG. 1 (in other words, a surface opposite to the surface adjacent to the pixel substrate 11 of the logic board 12). In this case, for example, placing the memory units 102L-1 to 102R-2 included in the signal processing circuits 41L and 41R on the logic board of the added bottom layer is considered.

Further, in the case of providing two or more logic boards, not all layers of the logic boards have to be manufactured by using one-shot exposure, and some logic boards may be manufactured by using separate exposure. For example, in the example described above, the logic board of the bottom layer having the memory units 102L-1 to 102R-2 provided therein may be manufactured by using separate exposure.

Further, as described above, in the case where the signal processing circuits are connected in the inside of the logic board, not all layers of the logic boards have to be manufactured by using one-shot exposure, and some layers may be manufactured by using separate exposure.

(Modification of Method of Connecting Signal Processing Circuit)

In addition, the second and third embodiments of the present technology describe the example in which the left and right signal processing circuits are electrically connected in the solid-state imaging device, but they may be connected in the outside of the solid-state imaging device.

Figure 22:
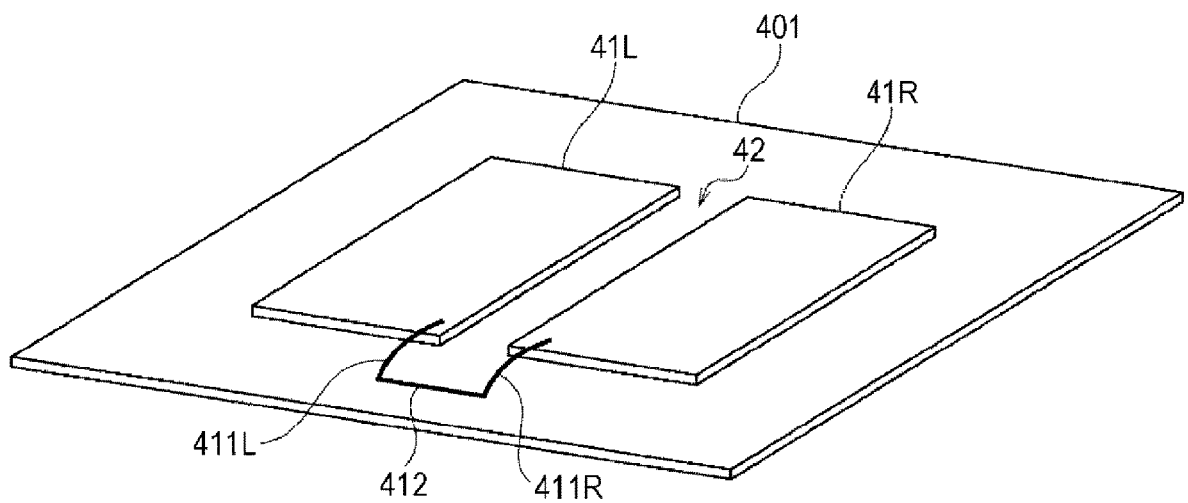
FIG. 22 is a diagram illustrating an example of a connection method of the signal processing circuit.

FIG. 22 illustrates an example in which the signal processing circuit 41L and the signal processing circuit 41R of the solid-state imaging device 1 are connected, in the outside of the solid-state imaging device 1. In addition, in this example, the solid-state imaging device 1 is mounted on the package. Further, in FIG. 22, for clarity of illustration, only the signal processing circuits 41L and 41R are illustrated in the solid-state imaging device 1.

The signal processing circuit 41L is connected to the conductive pattern 412 formed in the package 401 through bonding wire 411L. Similarly, the signal processing circuit 41R is connected to the conductive pattern 412 through bonding wire 411R. Accordingly, the signal processing circuit 41L and the signal processing circuit 41R are electrically connected through the bonding wires 411L, 411R and the conductive pattern 412.

In addition thereto, the signal processing circuit 41L and the signal processing circuit 41R may be externally electrically connected through a lead frame or the like.

Further, when the signal processing circuit 41L and the signal processing circuit 41R are connected, in the outside of the solid-state imaging device 1, as compared to the case of being internally connected, the number of wirings that can be mounted is limited. Therefore, the case where it is difficult to synthesize the left and right parts of pixel data in the solid-state imaging device 1 is assumed. In this case, for example, the analog signals may be shared by connecting signal lines of predetermined same analog signals (e.g., a signal line of a reference voltage, a ground line, and the like) between the signal processing circuit 41L and the signal processing circuit 41R.

For example, in the case of generating the left and right parts of pixel data in the different signal processing circuits 41, differences occur in the color and brightness of the left and right parts of pixel data due to the difference in the characteristics of the respective signal processing circuits 41, and the boundary of the synthetic part of two pieces of pixel data may be seen sometimes. Therefore, sharing a predetermined analog signal of each signal processing circuit 41 enables reducing the difference in characteristics of each signal processing circuit 41 and makes the boundary of the synthetic part of pixel data inconspicuous.

(Modification of AD Conversion Method)

Further, although the case of employing a column-parallel AD conversion method in the solid-state imaging device has been described above with reference to FIG. 2, a pixel AD parallel conversion method may be employed.

Figure 23:
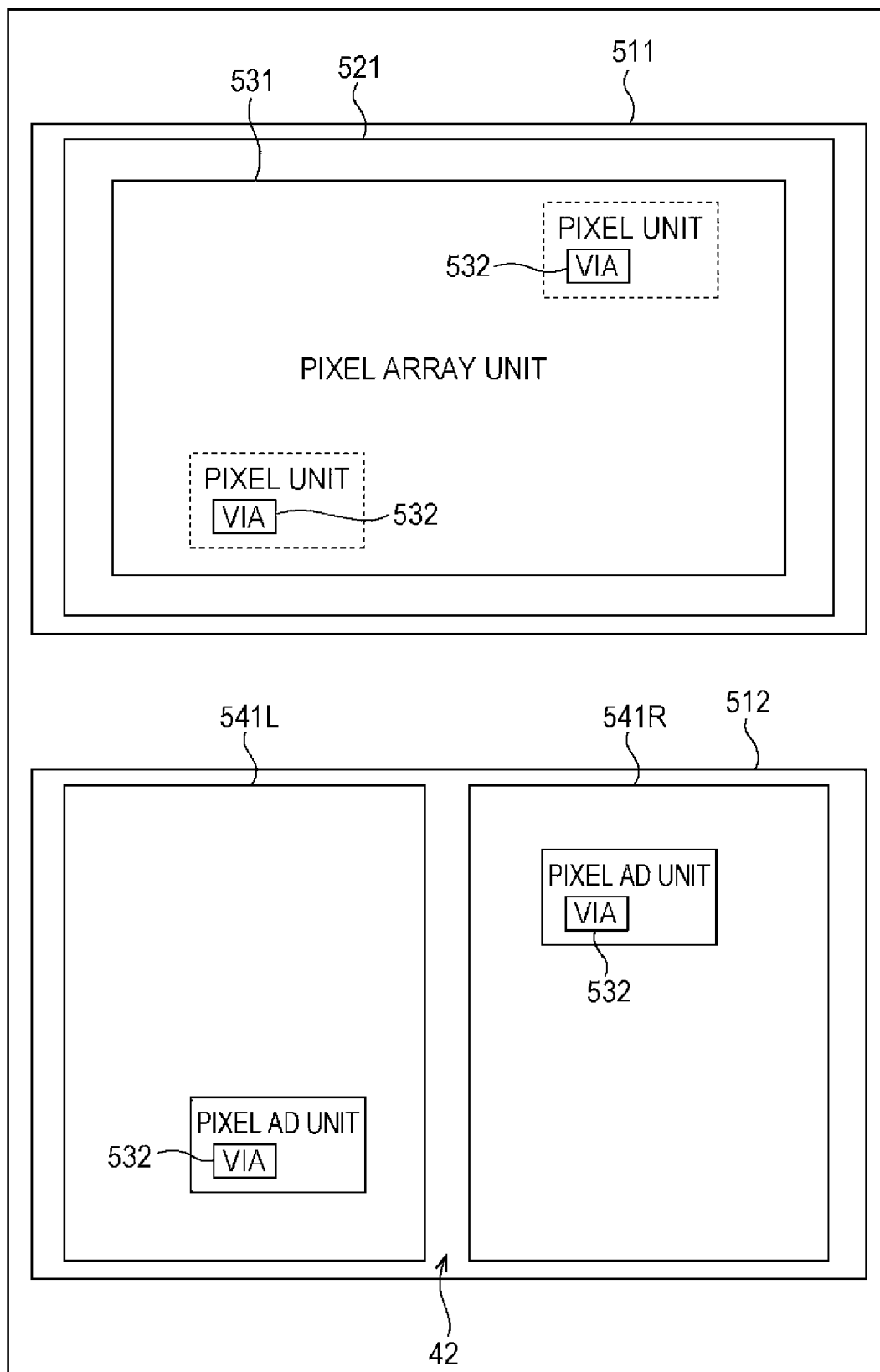
FIG. 23 is a diagram schematically illustrating a configuration example of a pixel substrate and a logic board, in a case of employing a pixel AD conversion method.

FIG. 23 schematically illustrates the configurations of a pixel substrate 511 and a logic board 512 in the case of employing a pixel AD conversion method.

A pixel circuit 521 including a pixel array unit 531 is formed on the pixel substrate 511, similar to the pixel substrate 11 of FIG. 1. Further, a signal processing circuit 541L and a signal processing circuit 541R having the same circuit pattern are formed so as to be arranged to the left and right through the scribe region 42, on the logic board 512, similar to the logic board 12 of FIG. 1.

Then, in the pixel array unit 531 of the pixel substrate 511, pixel units (groups) are two-dimensionally arranged in a matrix, with a region including a two-dimensional arrangement of pixels of a predetermined number as one unit, and a via 532 is formed for each pixel unit. Meanwhile, in the signal processing circuit 541L and the signal processing circuit 541R, a circuit unit (in FIG. 23, pixel AD unit) including the AD converter 81 (FIG. 2), the memory unit 67 (FIG. 2), and the like is provided for each pixel unit of the pixel array unit 531. Further, a via 23 is formed corresponding to the pixel unit, for each pixel AD unit.

In this manner, since it is possible to speed up the reading speed of the pixel signal by employing the pixel parallel AD conversion method, it is possible to lengthen the stop period of the AD converter 81, and as a result, it is possible to reduce power consumption.

(Modification of Moisture-Resistant Ring)

The moisture-resistant ring (also referred to as a seal ring or a guard ring or a structure) of the logic board can be basically formed by the same method as the past method. For example, the moisture-resistant ring is formed by the same method as the general method so as to surround each signal processing circuit individually. However, when the inter-circuit wiring layer electrically connecting the signal processing circuits is formed on the logic board as the second embodiment described above with reference to FIG. 14, if the moisture-resistant ring is made by the same method as in the past, the wiring and the moisture-resistant ring of the inter-circuit wiring layer interfere with each other. In other words, the moisture-resistant ring formed at the end of the signal processing circuit and the wiring of the inter-circuit wiring layer interfere with each other in a portion at which the wiring of the inter-circuit wiring layer passes through the end of the signal processing circuit.

Thus, hereinafter, a method of avoiding the interference between the wiring of the inter-circuit wiring layer and the moisture-resistant ring will be described.

Figure 25:
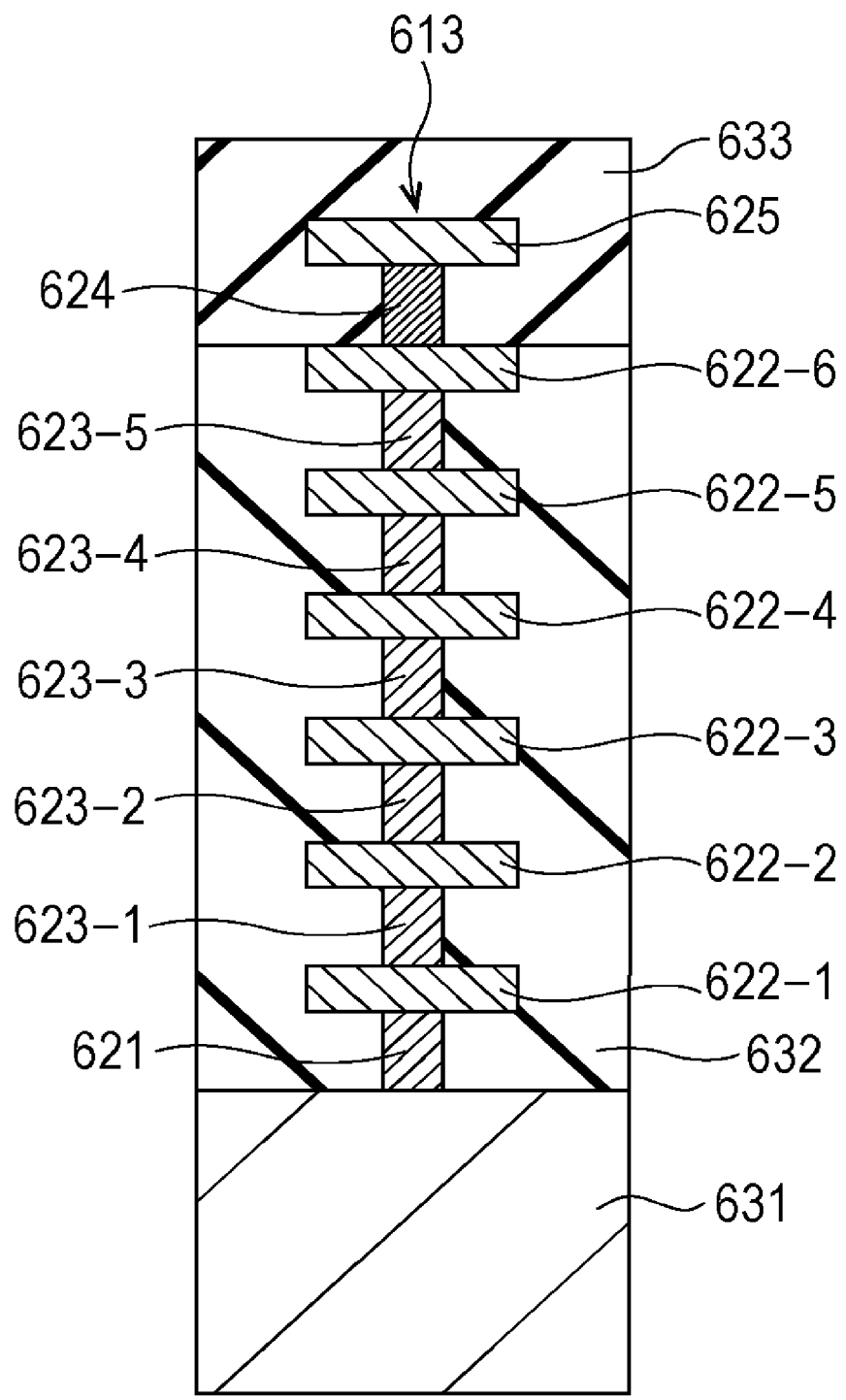
FIG. 25 is a cross-sectional view schematically illustrating the first embodiment of the moisture-resistant ring.
Figure 26:
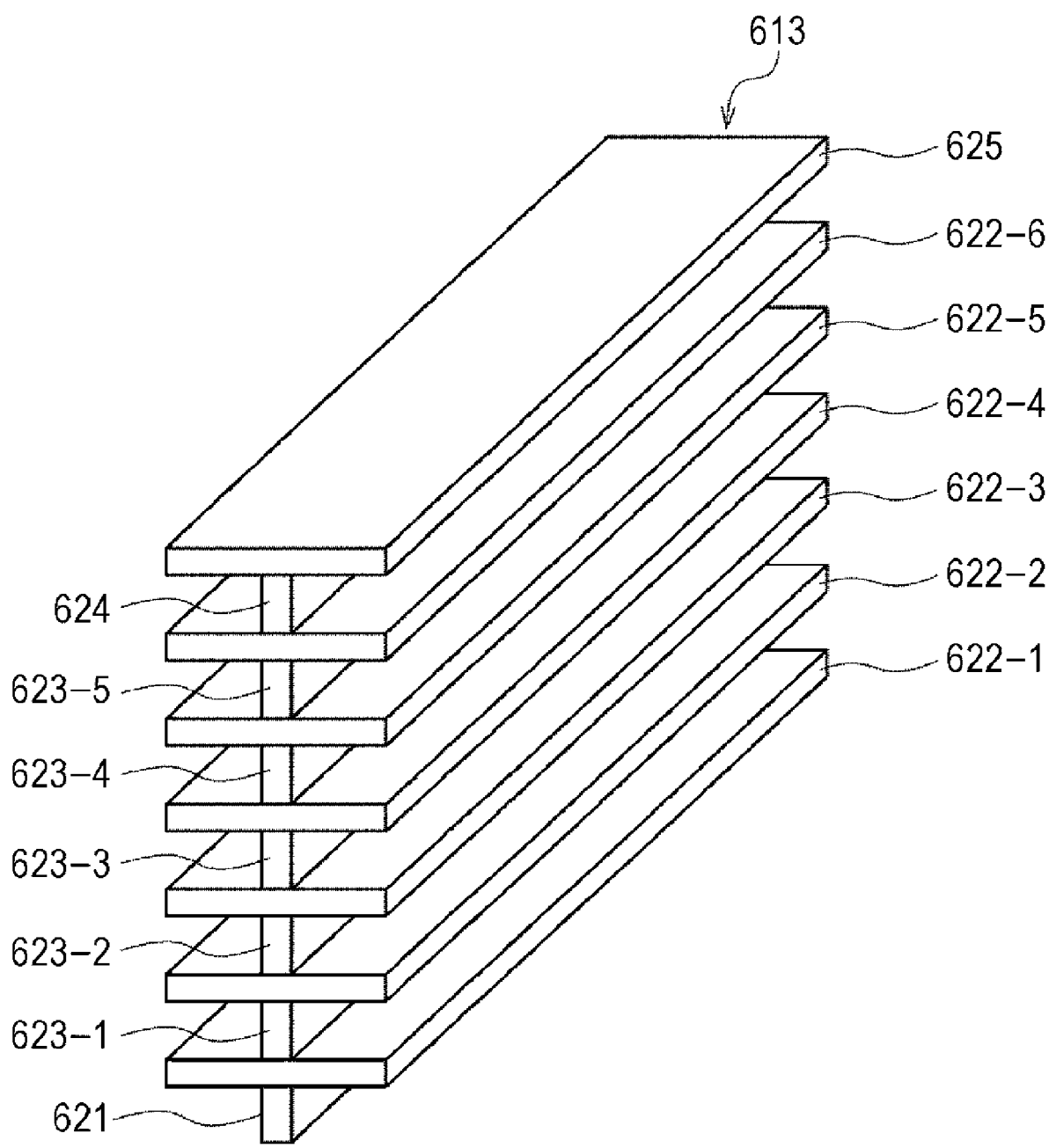
FIG. 26 is a perspective view schematically illustrating the first embodiment of the moisture-resistant ring.

First, a first method of avoiding the interference between the wiring of the inter-circuit wiring layer and the moisture-resistant ring will be described with reference to FIG. 24 to FIG. 26.

Figure 24:
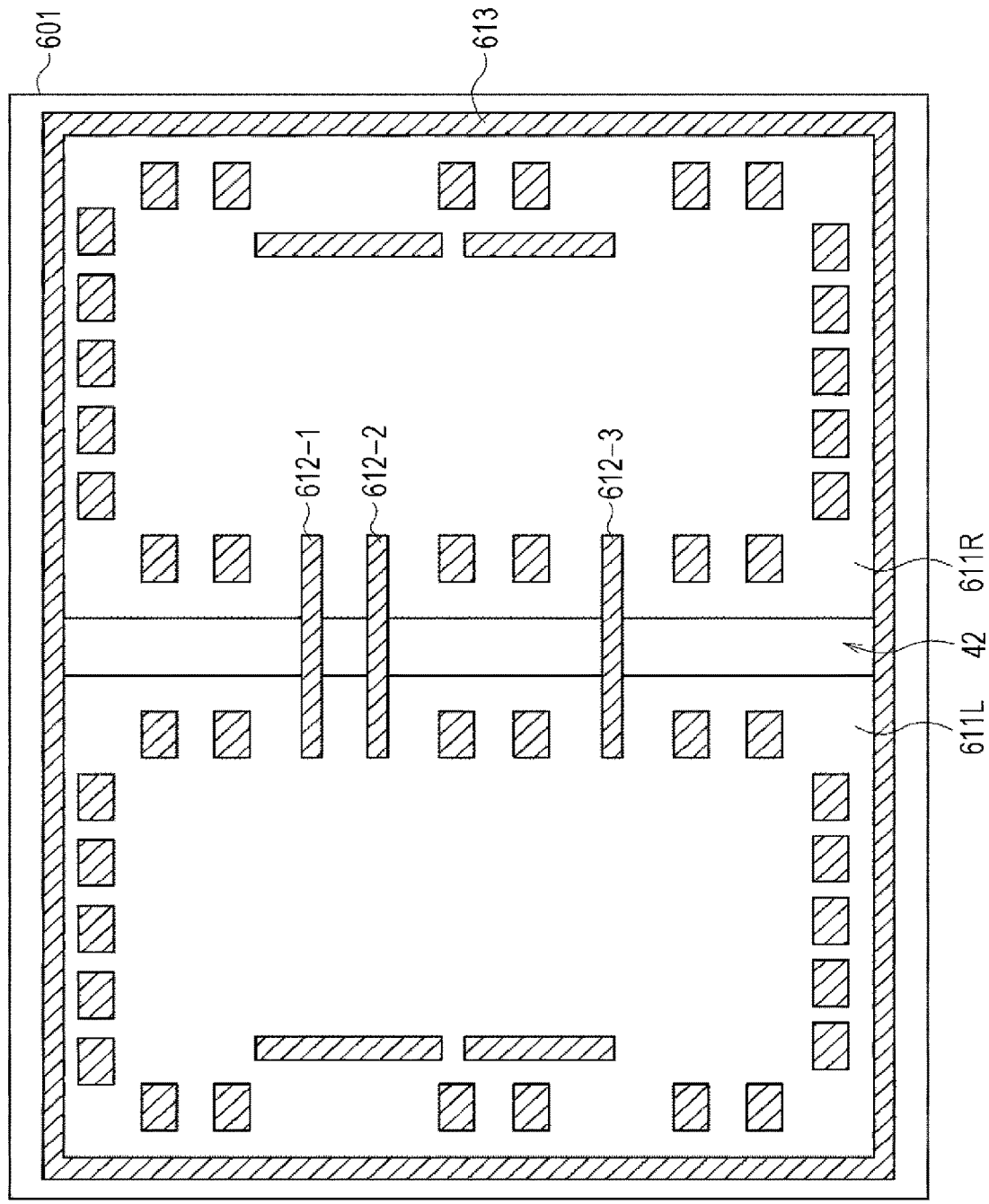
FIG. 24 is a plan view schematically illustrating the first embodiment of the logic board configured to avoid interference between a wiring of an inter-circuit wiring layer and a moisture-resistant ring.

FIG. 24 is a plan view schematically illustrating a configuration example of a logic board 601 so as to avoid the interference between the wiring of the inter-circuit wiring layer and the moisture-resistant ring.

The logic board 601 is different from the logic board 211 of FIG. 14 described above in that a signal processing circuit 611L and a signal processing circuit 611R having the same circuit pattern are provided through the scribe region 42, instead of the signal processing circuits 241L and 241R. Further, the inter-circuit wiring layer electrically connecting the signal processing circuit 611L and the signal processing circuit 611R are formed on the top layer of the logic board 601, similar to the logic board 211. In this example, the signal processing circuit 611L and the signal processing circuit 611R are electrically connected by the wirings 612-1 to 612-3 of the inter-circuit wiring layer.

Further, a moisture-resistant ring 613 is formed so as to surround the outer periphery of the signal processing circuits 611L and 611R along the vicinity of the outer periphery of the logic board 601.

Here, the structure of the moisture-resistant ring 613 will be described with reference to FIG. 25 and FIG. 26. FIG. 25 is a cross-sectional view schematically illustrating a cross section of the moisture-resistant ring 613, and FIG. 26 is a perspective view schematically illustrating a part of the moisture-resistant ring 613.

The moisture-resistant ring 613 includes a wall 621 made of a material of a contact, dummy wirings 622-1 to 622-6, walls 623-1 to 623-5 made of a material of a via, a wall 624, and a dummy wiring 625.

The dummy wirings 622-1 to 622-6 and the dummy wiring 625 are respectively formed in different wiring layers of the logic board 601, and are not used for signal transfers. In this example, the wiring layers of the logic board 601 are stacked in seven layers on a substrate layer 631 made of, for example, a silicon substrate. Then, the dummy wiring 622-1 is formed on a first wiring layer at the bottom of the logic board 601. The dummy wirings 622-2 to 622-6 are formed on the second to sixth wiring layers of the logic board 601. The dummy wiring 625 is formed on a seventh wiring layer at the top of the logic board 601.

The dummy wirings 622-1 to 622-6 and the dummy wiring 625 have substantially the same rectangular ring-like shape, and are formed so as to surround the outer peripheries of the signal processing circuits 611L and 611R, along the vicinity of the outer periphery of the logic board 601, in each wiring layer.

The wall 621, the walls 623-1 to 623-5, and the wall 624 have substantially the same rectangular ring-like shape, and are formed so as to surround the outer peripheries of the signal processing circuits 611L and 611R, along the vicinity of the outer periphery of the logic board 601.

The wall 621 is formed by the same process as that of a contact for connecting the substrate layer 631 and the first wiring layer so as to connect the substrate layer 631 and the dummy wiring 622-1.

The walls 623-1 to 623-5 are formed by the same process as that of a via for connecting respective wiring layers, from the first wiring layer to the sixth wiring layer. The wall 623-1 connects the dummy wiring 622-1 and the dummy wiring 622-2. The wall 623-2 connects the dummy wiring 622-2 and the dummy wiring 622-3. The wall 623-3 connects the dummy wiring 622-3 and the dummy wiring 622-4. The wall 623-4 connects the dummy wiring 622-4 and the dummy wiring 622-5. The wall 623-5 connects the dummy wiring 622-5 and the dummy wiring 622-6.

The wall 624 is formed by the same process as that of a via for connecting the sixth wiring layer and the seventh wiring layer, and connects the dummy wiring 622-6 and the dummy wiring 625.

For example, copper is used for the first wiring layer to the sixth wiring layer, the wall 621 is made of tungsten, and the dummy wirings 622-1 to 622-6 and the walls 623-1 to 623-5 are made of copper. Further, an insulating film made of, for example, a low-K material having a low dielectric constant is used for the interlayer insulation film 632 from the surface of the substrate layer 631 to the upper end of the sixth wiring layer. Then, the first to sixth wiring layers are used for the transmission of high-speed signals, for example.

Meanwhile, for example, aluminum is used for the seventh wiring layer, and the dummy wiring 625 is made of aluminum. Further, the wall 624 is made of, for example, tungsten. Further, an oxide film (for example, a silicon oxide film) having a higher dielectric constant and water resistance than those of an interlayer insulation film 632 are used for the upper end of the sixth wiring layer to the interlayer insulation film 633 thereabove. Then, the seventh wiring layer is used for, for example, the transmission of low-speed signals such as a power supply. Further, the seventh wiring layer is the inter-circuit wiring layer.

In this manner, the moisture-resistant ring 613 forms a wall surrounding the logic board 601, by the wall 621 to the dummy wiring 625, and prevents infiltration of moisture from the side of the logic board 601 to the signal processing circuits 611L and 611R.

Further, the moisture-resistant ring 613 is not provided between the signal processing circuit 611L and the signal processing circuit 611R. Accordingly, the wirings 612-1 to 612-3 connecting the signal processing circuit 611L and the signal processing circuit 611R do not interfere with the moisture-resistant ring 613.

In addition, the size of the outer periphery of the moisture-resistant ring 613 is substantially the same as that of the pixel circuit 21 and greater than the exposure range of an exposure apparatus. Accordingly, separate exposure is used during the formation of the layer (including the moisture-resistant ring 613) above the substrate layer 631 of the logic board 601.

Further, the moisture-resistant ring 613 does not necessarily have to be formed so as to surround all of the periphery of the logic board 601, and may be formed so as to surround only a part of the periphery of the logic board 601, for example, in a range in which the moisture resistance can be ensured.

Further, for example, similar to the case where three or more signal processing circuits are disposed on the logic board, the moisture-resistant ring may be formed so as to include all the signal processing circuits in the inside or surround the periphery or a part of the periphery of the logic board.

Next, a second method for avoiding the interference between the wiring and the moisture-resistant ring of the inter-circuit wiring layer will be described with reference to FIG. 27 to FIG. 33.

Figure 27:
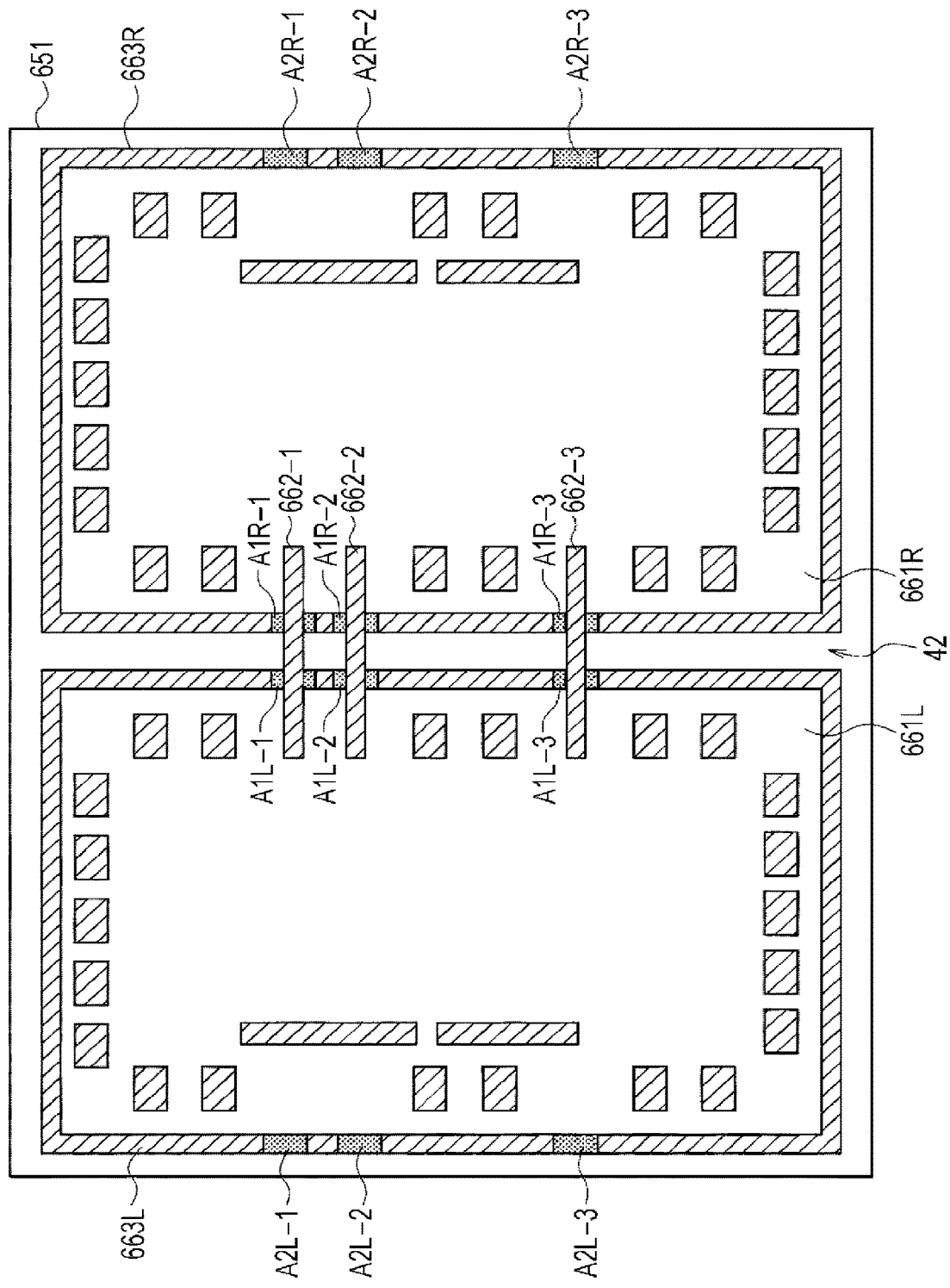
FIG. 27 is a plan view schematically illustrating the second embodiment of the logic board configured to avoid interference between the wiring of the inter-circuit wiring layer and the moisture-resistant ring.

FIG. 27 is a plan view schematically illustrating a configuration example of a logic board 651 formed so as to avoid the interference between the wiring and the moisture-resistant ring of the inter-circuit wiring layer.

The logic board 651 is different from the logic board 601 of FIG. 24 described above in that a signal processing circuits 661L and a signal processing circuit 661R having the same circuit pattern are provided through the scribe region 42, instead of the signal processing circuits 611L and 611R. Further, an inter-circuit wiring layer for electrically connecting the signal processing circuit 661L and the signal processing circuit 661R is formed on the top layer of the logic board 651, similar to the logic board 601. In the example, the signal processing circuit 661L and the signal processing circuit 661R are electrically connected by the wirings 662-1 to 662-3 of the inter-circuit wiring layer.

Further, the logic board 651 is different from the logic board 601 in that moisture-resistant rings 663L and 663R are formed instead of the moisture-resistant ring 613. The moisture-resistant ring 663L is formed so as to surround the periphery of the signal processing circuit 661L, along the vicinity of the outer periphery of the signal processing circuit 661L. The moisture-resistant ring 663R is formed so as to surround the periphery of the signal processing circuit 661R, along the vicinity of the outer periphery of the signal processing circuit 661R.

Here, the structure of the moisture-resistant ring 663R will be described with reference to FIG. 28 to FIG. 33. In addition, although the detailed description is omitted, the moisture-resistant ring 663L also has substantially the same structure as that of the moisture-resistant ring 663R. Further, hereinafter, the reference symbols of the portions of the moisture-resistant ring 663L corresponding to the respective portions of the moisture-resistant ring 663R are represented by replacing "R" with "L" in the reference symbols of the respective portions of the moisture-resistant ring 663R.

Figure 28:
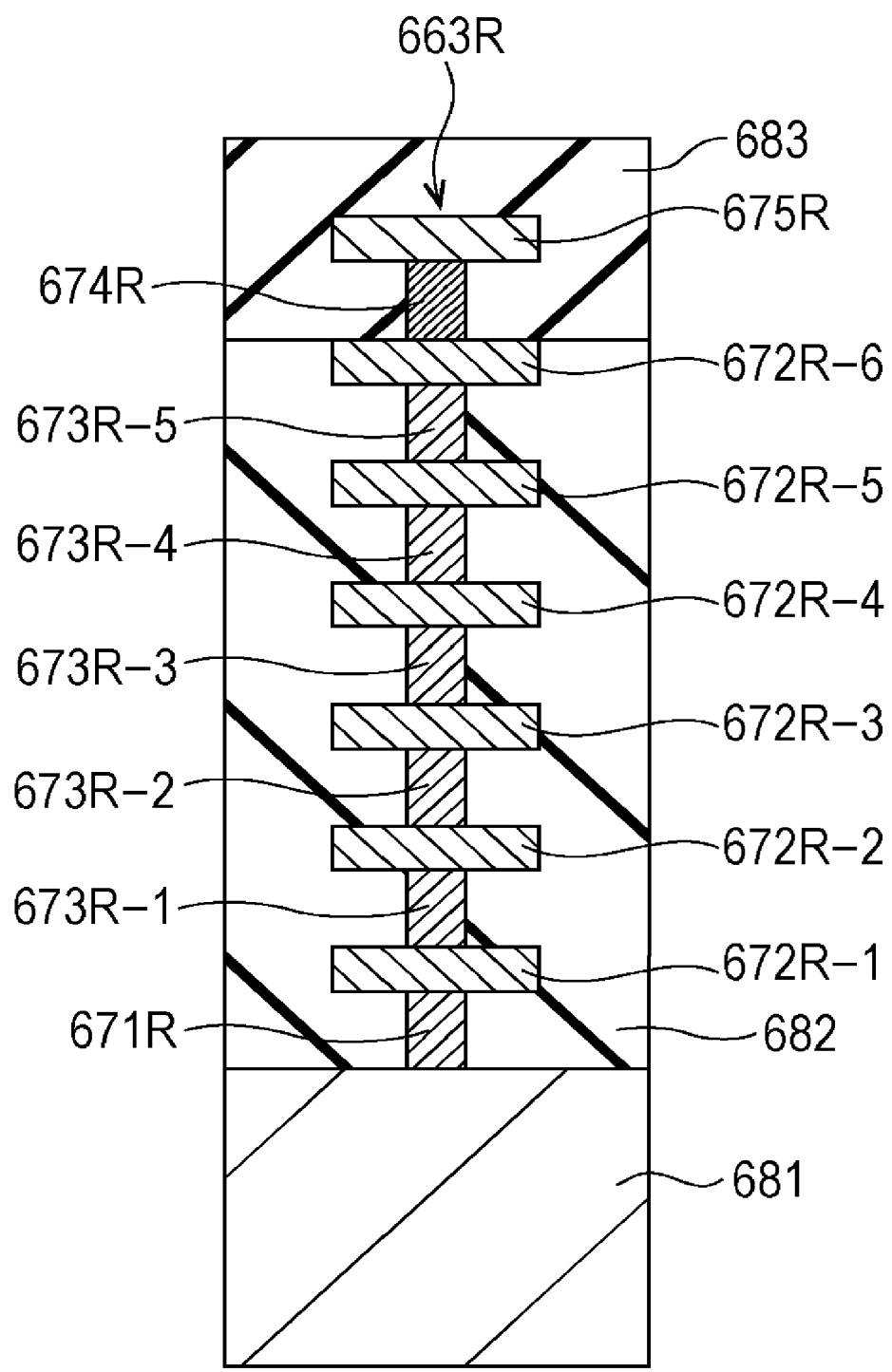
FIG. 28 is a first cross-sectional view schematically illustrating the second embodiment of the moisture-resistant ring.
Figure 29:
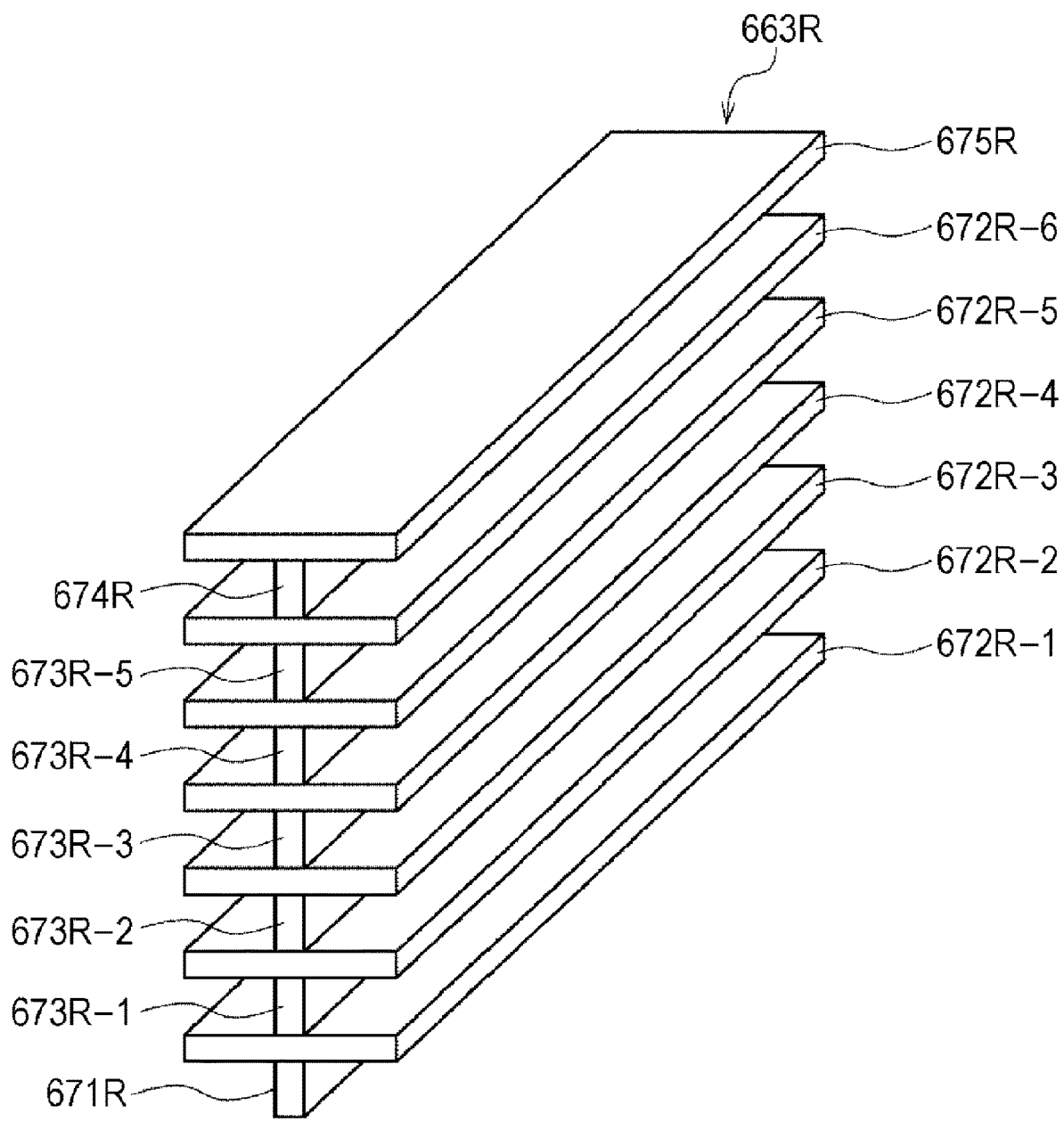
FIG. 29 is a first perspective view schematically illustrating the second embodiment of the moisture-resistant ring.

FIG. 28 is a cross-sectional view schematically illustrating a cross section of the portions other than the regions A1R-1 to A1R-3 and regions A2R-1 to A2R-3 of the moisture-resistant ring 663R. FIG. 29 is a perspective view schematically illustrating a part of the portions other than the regions A1R-1 to A1R-3 and regions A2R-1 to A2R-3 of the moisture-resistant ring 663R.

Figure 30:
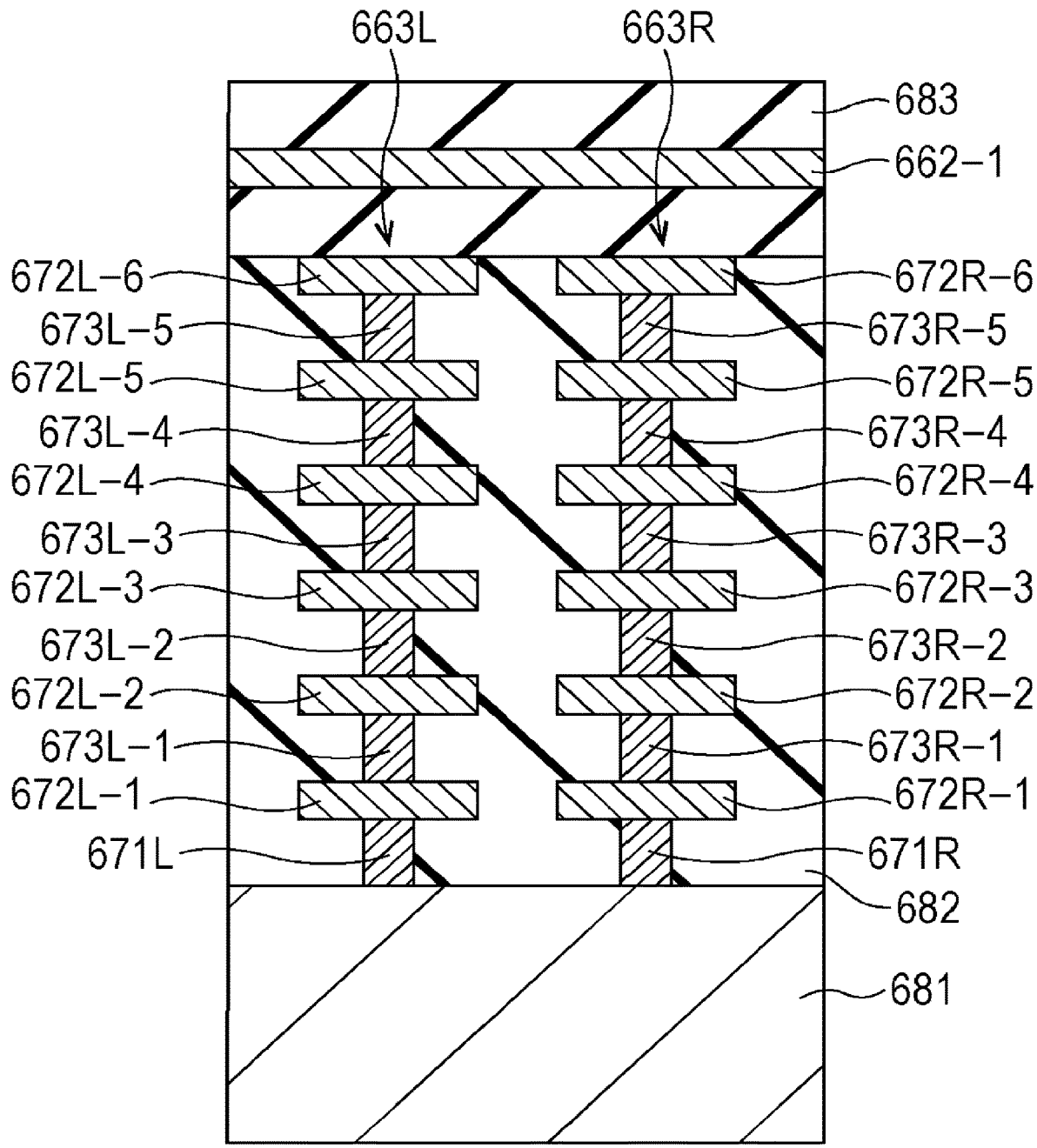
FIG. 30 is a second cross-sectional view schematically illustrating the second embodiment of the moisture-resistant ring.
Figure 31:
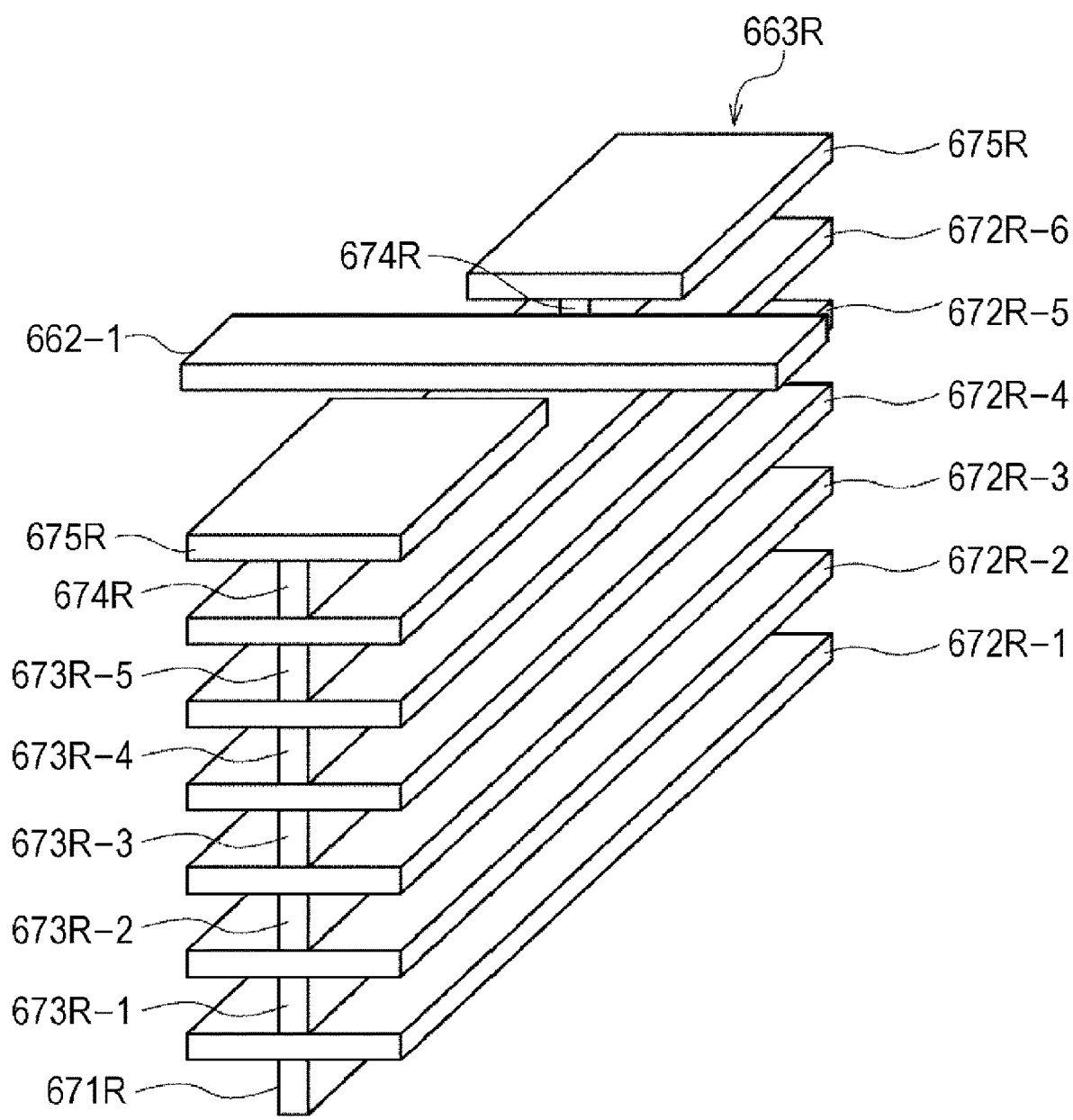
FIG. 31 is a second perspective view schematically illustrating the second embodiment of the moisture-resistant ring.

FIG. 30 is a cross-sectional view schematically illustrating a cross section of a portion through which the wiring 662-1 of the region A1L-1 of the moisture-resistant ring 663L and the region A1R-1 of the moisture-resistant ring 663R passes. FIG. 31 is a perspective view schematically illustrating the vicinity of the region A1R-1 of the moisture-resistant ring 663R.

Figure 32:
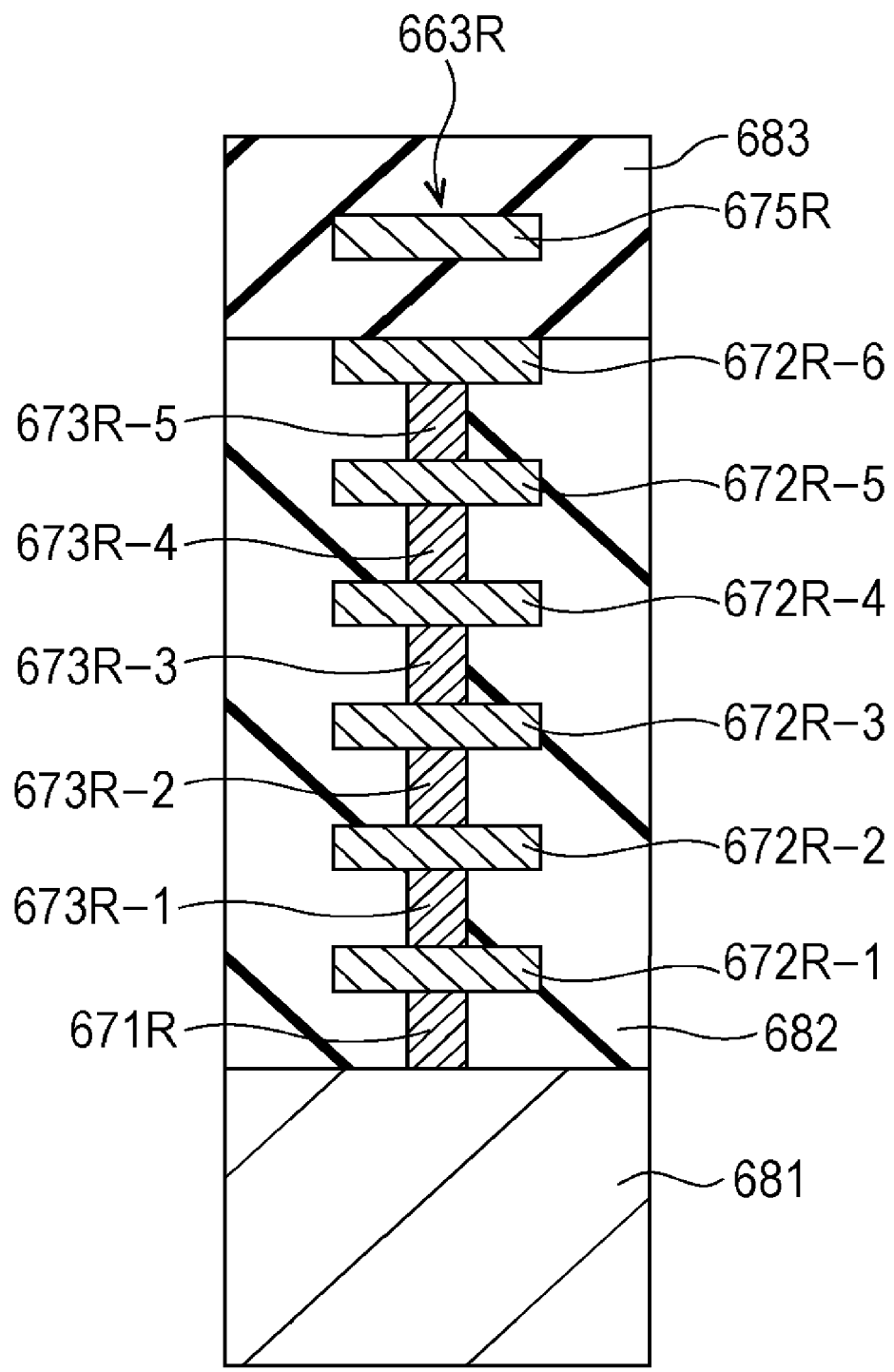
FIG. 32 is a third cross-sectional view schematically illustrating the second embodiment of the moisture-resistant ring.
Figure 33:
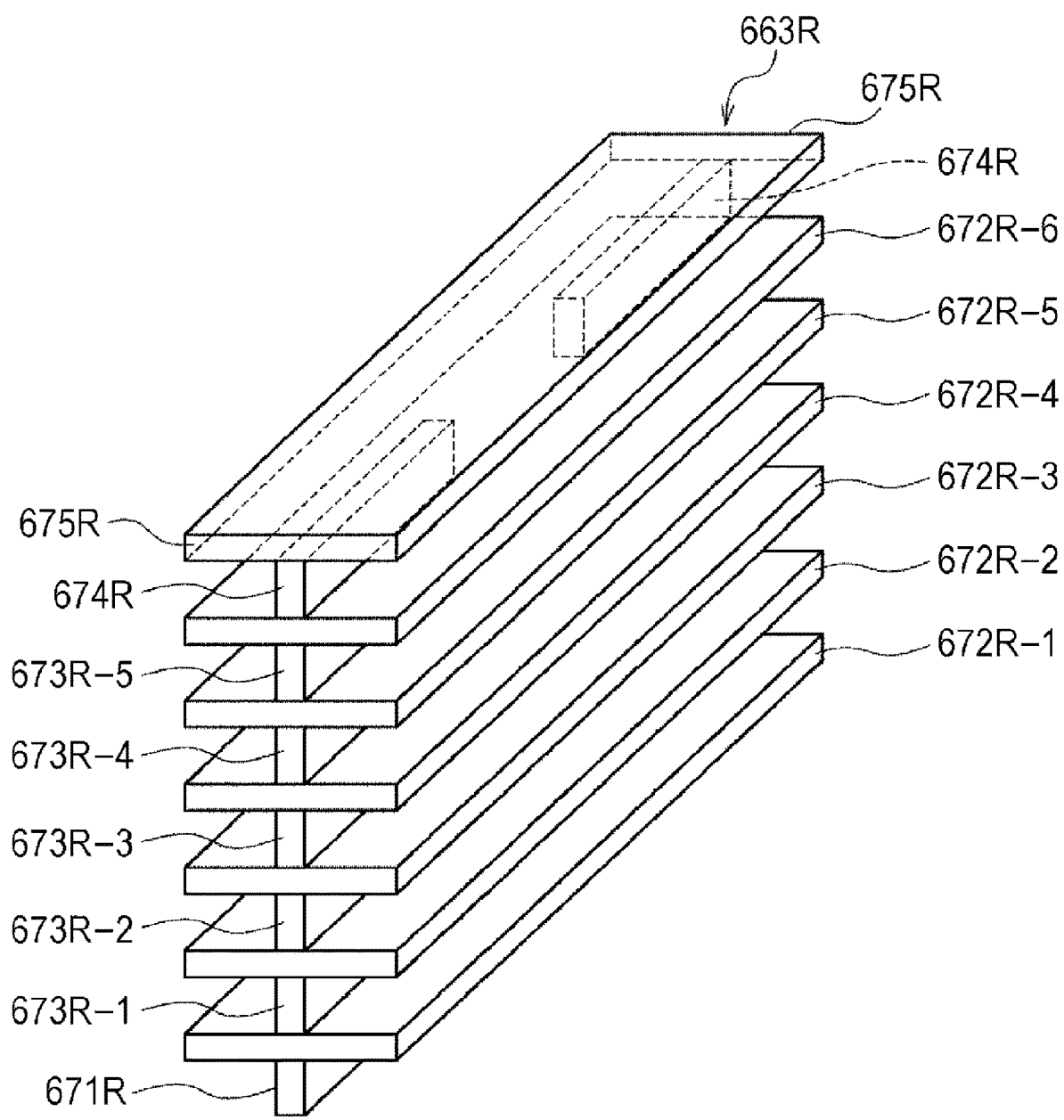
FIG. 33 is a third perspective view schematically illustrating the second embodiment of the moisture-resistant ring.

FIG. 32 is a cross-sectional view schematically illustrating a cross section at the same position as that of the portion through which the wiring 662-1 passes in the region A1L-1 of the moisture-resistant ring 663L, in the region A2R-1 of the moisture-resistant ring 663R. FIG. 33 is a perspective view schematically illustrating the vicinity of the region A2R-1 of the moisture-resistant ring 663R. In addition, in FIG. 33, only a dummy wiring 675R of the top layer is transmitted.

The moisture-resistant ring 663R includes a wall 671R, dummy wirings 672R-1 to 672R-6, walls 673R-1 to 673R-5, a wall 674R, and a dummy wiring 675R, and has substantially the same structure as that of the moisture-resistant ring 613 described above with reference to FIG. 25 and FIG. 26. In other words, the moisture-resistant ring 663R has a stacked structure of seven layers, similar to the moisture-resistant ring 613, and is made of the same material as that of the moisture-resistant ring 613.

An insulation film made of a low-K material is used for an interlayer insulation film 682 from the surface of the substrate layer 681 to the top of the sixth wiring layer, for example, similarly to the interlayer insulation film 632 of the logic board 601. Further, an oxide film (for example, a silicon oxide film) is used for an interlayer insulation film 683 above the top of the sixth wiring layer, for example, similarly to the interlayer insulation film 633 of the logic board 601.

However, the moisture-resistant ring 663R is different from the moisture-resistant ring 613, the wall 674R and the dummy wiring 675R are not formed in some parts, and discontinuous. Specifically, the wall 674R and the dummy wiring 675R are discontinuous in a part through which the wirings 662-1 to 662-3 in the regions A1R-1 to A1R-3 pass in the left side of the moisture-resistant ring 663R.

For example, as illustrated in FIG. 30 and FIG. 31, the wall 674R and the dummy wiring 675R are discontinuous so as not to interfere with the wiring 662-1 in the part through which the wiring 662-1 of the region A1R-1 passes. Further, without being illustrated, the wall 674R and the dummy wiring 675R are discontinuous so as not to interfere with the wirings 662-2 and 662-3, in the part through which the wiring 662-2 of the region A1R-2 passes and the part through which the wiring 662-3 of the region A1R-3 passes.

Similarly, the wall 674L of the moisture-resistant ring 663L and the dummy wiring 675L are discontinuous so as not to interfere with the wirings 662-1 to 662-3 in a part through which the wirings 662-1 to 662-3 in the regions A1L-1 to A1L-3 pass in the right side of the moisture-resistant ring 663L.

Further, the wall 674R of the moisture-resistant ring 663R is discontinuous in a part corresponding to a discontinuous portion of the wall 674L in the regions A1L-1 to A1L-3 of the moisture-resistant ring 663L. For example, in the wall 674R, in the region A2R-1 on the right side of the moisture-resistant ring 663L, the same portion as the discontinuous portion of the wall 674L in the region A1L-1 on the right side of the moisture-resistant ring 663L is discontinuous, as illustrated in FIG. 32 and FIG. 33. Further, without being illustrated, in the regions A2R-2 and A2R-3 on the right side of the moisture-resistant ring 663R of the wall 674R, the same portions as the discontinuous portions of the wall 674L in the regions A1L-2 and A1L-3 on the right side of the moisture-resistant ring 663L are discontinuous.

Similarly, in the wall 674L of the moisture-resistant ring 663L, the portions corresponding to the discontinuous portions of the wall 674R in the regions A1R-1 to A1R-3 of the moisture-resistant ring 663R are discontinuous.

Thus, the discontinuous portion of the wall 674L of the moisture-resistant ring 663L and the discontinuous portion of the wall 674R of the moisture-resistant ring 663R are same, and the wall 674R and the wall 674L have a shape of the same symmetry.

In addition, the dummy wiring 675R is continuous without interruption in the regions A2R-1 to A2R-3. Similarly, the dummy wiring 675L is continuous without interruption in the regions A2L-1 to A2L-3.

As described above, in the moisture-resistant ring 663R, the wall 671R to dummy wiring 675R form a wall surrounding the periphery of the signal processing circuit 661R so as to prevent infiltration of moisture to the signal processing circuits 661R from the side of the logic board 651. Similarly, in the moisture-resistant ring 663L, the wall 671L to the dummy wiring 675L form a wall surrounding the periphery of the signal processing circuit 661L so as to prevent infiltration of moisture to the signal processing circuits 661L from the side of the logic board 651.

Further, as described above, the moisture-resistant rings 663L and 663R do not interfere with the wirings 662-1 to 662-3 connecting the signal processing circuit 661L and the signal processing circuit 661R.

Further, since the discontinuous interval of the wall 674R and the dummy wiring 675R of the moisture-resistant ring 663R are very short and the water resistance of the interlayer insulation film 683 is also high, the moisture performance of moisture-resistant ring 663R is hardly deteriorated. Similarly, since the discontinuous interval of the wall 674L and the dummy wiring 675L of the moisture-resistant ring 663L are very short and the water resistance of the interlayer insulation film 683 is also high, the moisture performance of moisture-resistant ring 663L is hardly deteriorated.

Further, since the wall 674L of the moisture-resistant ring 663L and the wall 674R of the moisture-resistant ring 663R have the same shape, the wall 674L and the wall 674R can be exposed by using, for example, the same photomask, and thus it is possible to reduce costs.

In addition, the moisture-resistant rings 663L and 663R do not necessarily have to be formed so as to surround all peripheries of the signal processing circuits 661L and 661R, and may be formed so as to surround only a part of the peripheries, in a range capable of ensuring the moisture resistance.

Further, a discontinuous portion of the wall 674L and the wall 674R other than the portion through which the wirings 662-1 to 662-3 pass is not necessarily provided. However, if the discontinuous portion is not provided, the wall 674L and the wall 674R do not have the same shape, and thus it becomes necessary to use separate exposure.

In addition, for example, even when three or more signal processing circuits are disposed on the logic board, it is possible to form moisture-resistant rings of respective signal processing circuits so as to avoid interference of the wiring connecting respective signal processing circuits, in the same manner.

(Manufacturing Method of Moisture-Resistant Rings 663L and 663R)

Next, a manufacturing method of moisture-resistant rings 663L and 663R of the logic board 651 will be described with reference to FIG. 34 to FIG. 40.

In addition, hereinafter, the left sides of FIG. 34 to FIG. 40 each schematically illustrates a cross section of a portion at which the wirings 662-1 to 662-3 do not pass, in a portion at which the right side of the moisture-resistant ring 663L and the left side of the moisture-resistant ring 663R are adjacent. In contrast, the right sides of FIG. 34 to FIG. 40 each schematically illustrates a cross section of a portion at which the wiring 662-1 passes, in a portion at which the right side of the moisture-resistant ring 663L and the left side of the moisture-resistant ring 663R are adjacent.

Further, hereinafter, the wall 671L to the dummy wiring 672L-6 of the moisture-resistant ring 663L, the wall 671R to the dummy wiring 672R-6 of the moisture-resistant ring 663R, and the interlayer insulation film 682 have already been formed, and a step of forming a portion above the interlayer insulation film 682 will be described. In addition, one-shot exposure is used for the exposure in the processes up to here.

Figure 34:
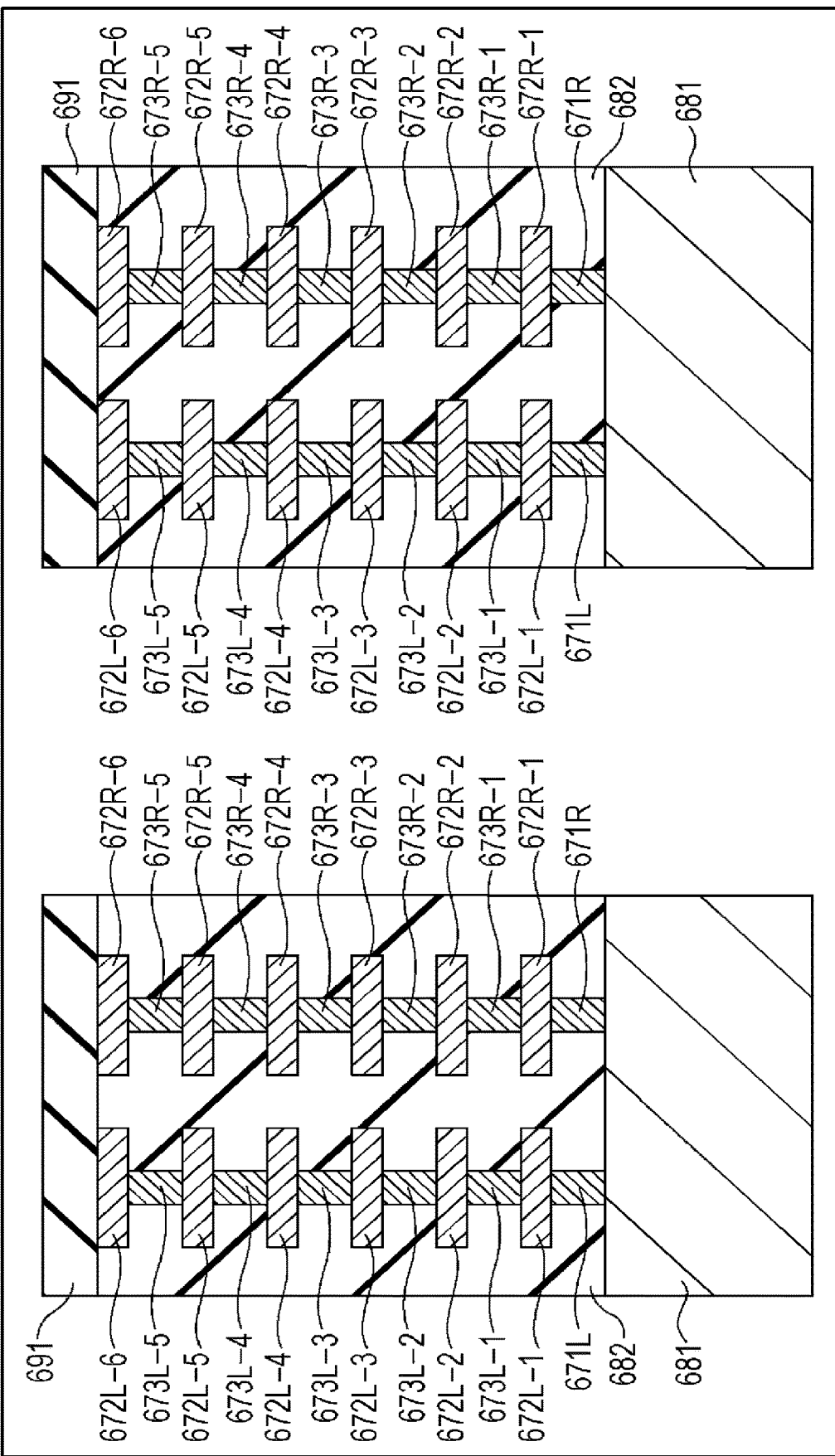
FIG. 34 is a diagram illustrating a manufacturing method of the second embodiment of the moisture-resistant ring.

First, as illustrated in FIG. 34, an oxide film 691 is deposited on the interlayer insulation film 682.

Figure 35:
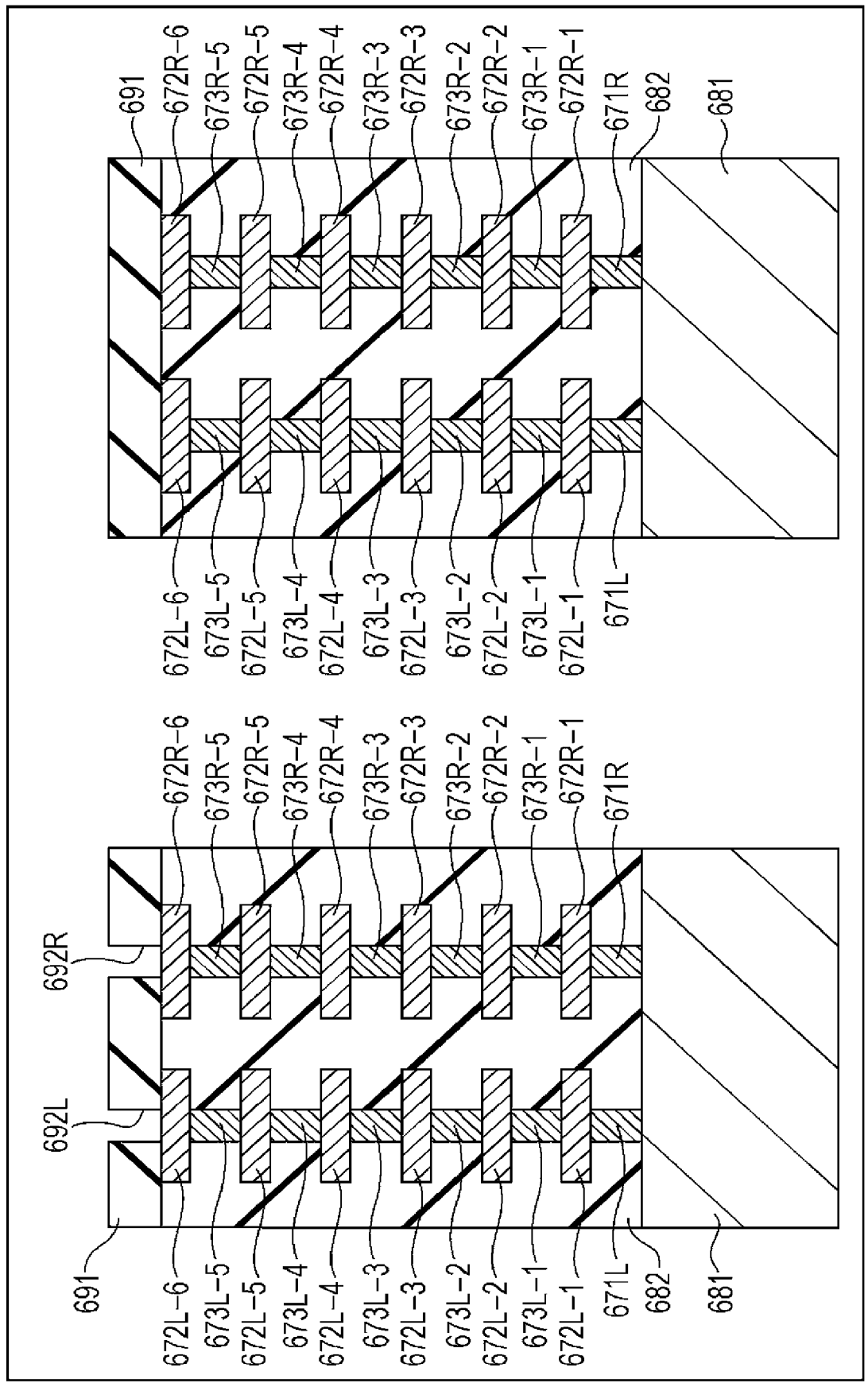
FIG. 35 is a diagram illustrating the manufacturing method of the second embodiment of the moisture-resistant ring.

Next, as illustrated in FIG. 35, the oxide film 691 is etched so as to form grooves 692L and 692R. The groove 692L is formed so as to substantially overlap the wall 673L-5 through the dummy wiring 672L-6, as viewed from above. However, the groove 692L is intended to form the wall 674L of the moisture-resistant ring 663L, and is not formed in the portion in which the wall 674L described above is discontinuous. Similarly, the groove 692R is formed so as to substantially overlap the wall 673R-5 through the dummy wiring 672R-6, as viewed from above. However, the groove 692R is intended to form the wall 674R of the moisture-resistant ring 663R, and is not formed in the portion in which the wall 674R described above is discontinuous.

Further, as described above, since the wall 674R and the wall 674L have the same shape, the groove 692L and the groove 692R have the same shape. Accordingly, the groove 692L and the groove 692R can be respectively formed by using the same photomask, through one-shot exposure.

Figure 36:
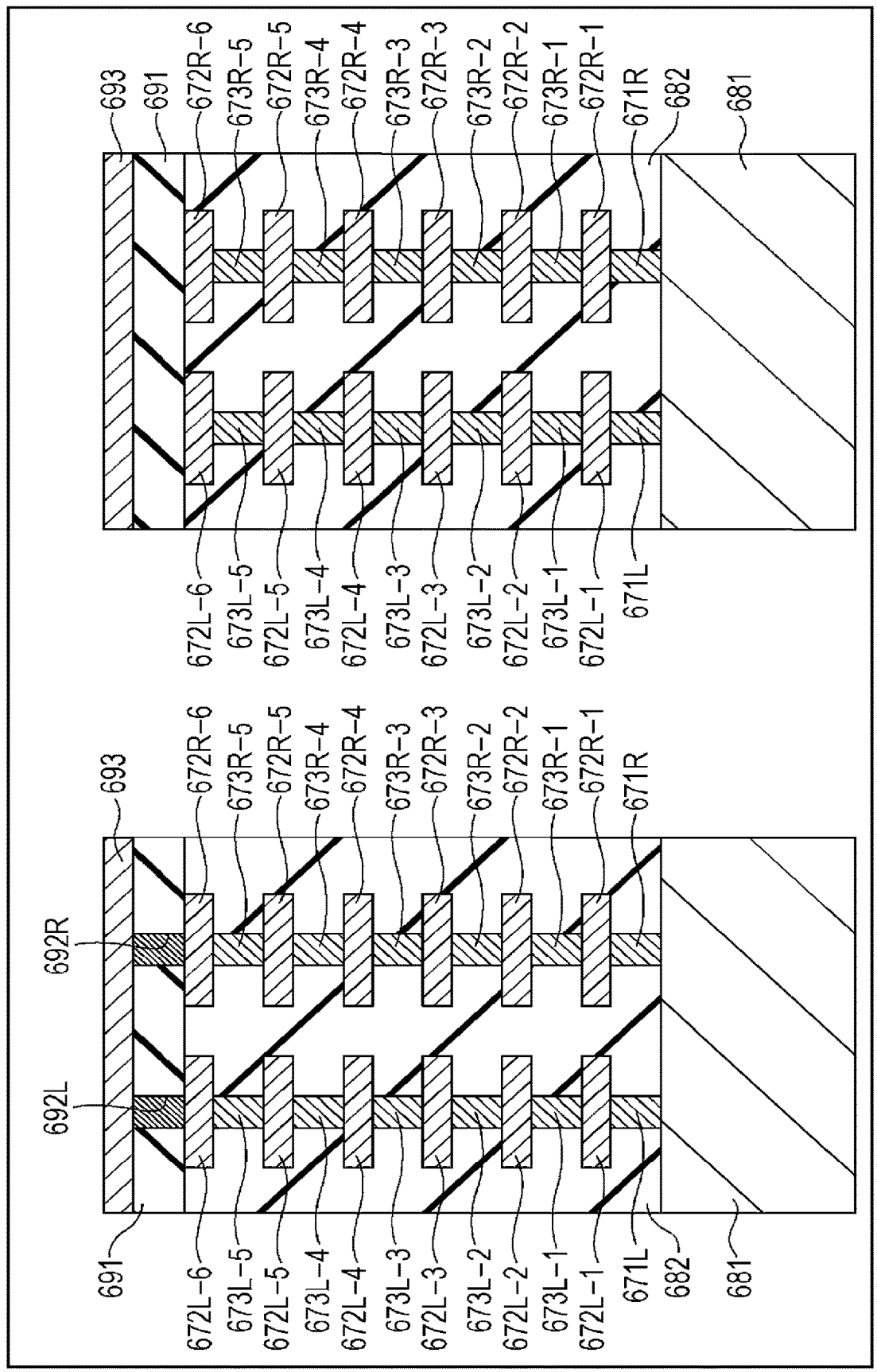
FIG. 36 is a diagram illustrating the manufacturing method of the second embodiment of the moisture-resistant ring.

Further, as illustrated in FIG. 36, a metal film 693 made of tungsten is deposited on the oxide film 691. In this case, the metal film 693 is deposited thick such that the grooves 692L and 692R are completely buried.

Figure 37:
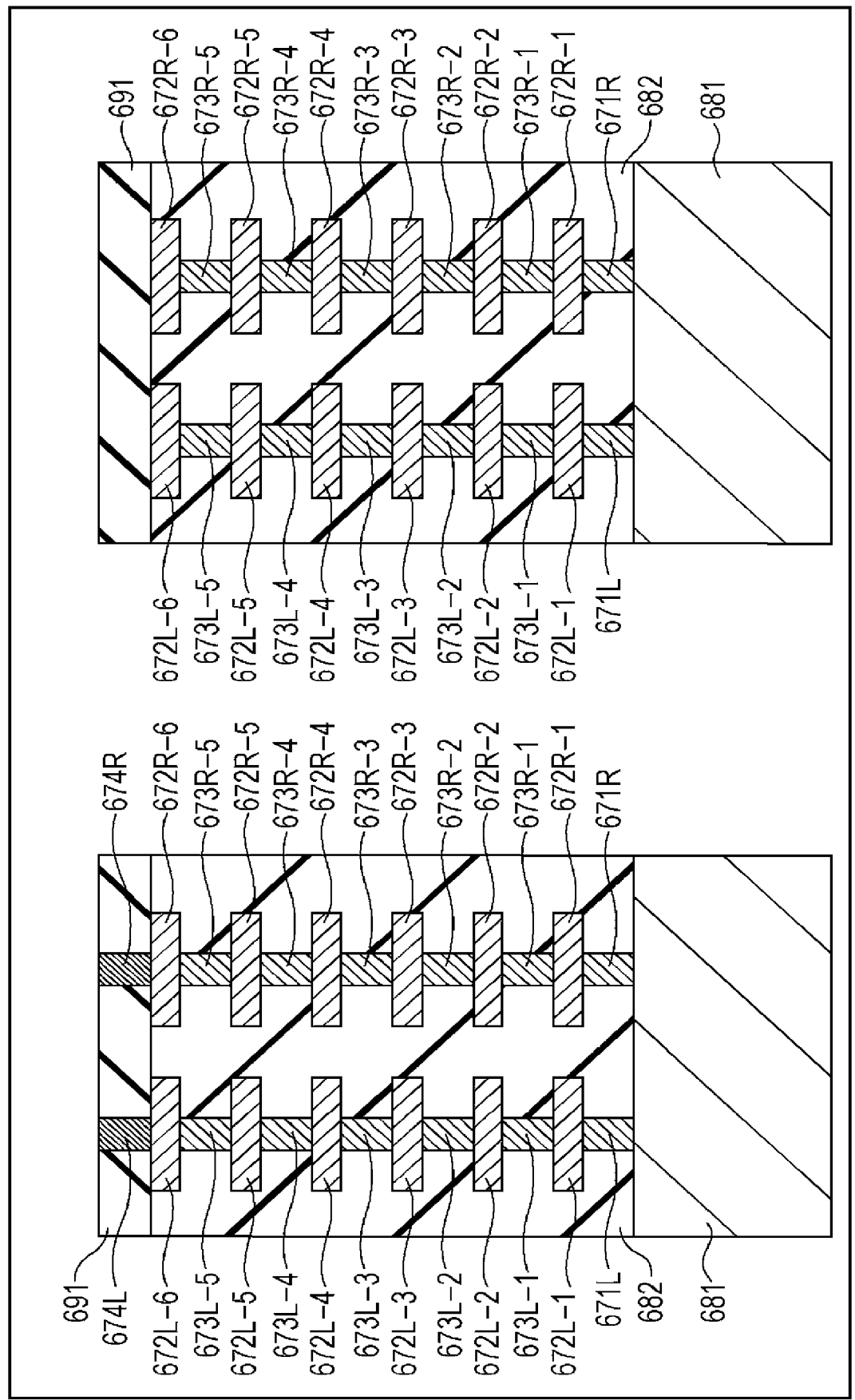
FIG. 37 is a diagram illustrating the manufacturing method of the second embodiment of the moisture-resistant ring.

Next, as illustrated in FIG. 37, the metal film 693 is left in the grooves 692L and 692R, and the metal film 693 on the oxide film 691 is removed by polishing. This allows the walls 674L and 674R made of tungsten to be formed.

Figure 38:
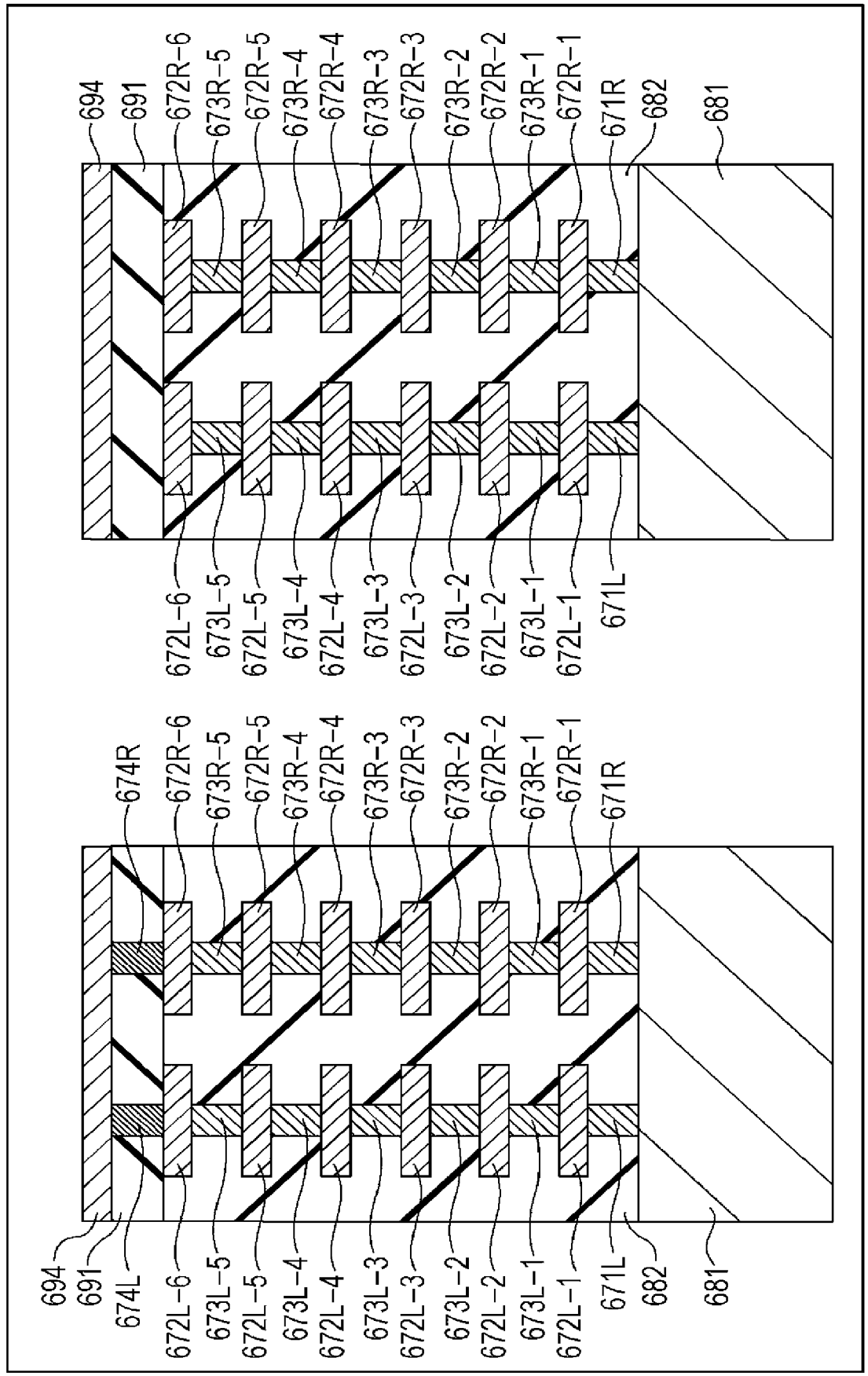
FIG. 38 is a diagram illustrating the manufacturing method of the second embodiment of the moisture-resistant ring.

Next, as illustrated in FIG. 38, the metal film 694 made of aluminum is deposited on the oxide film 691.

Figure 39:
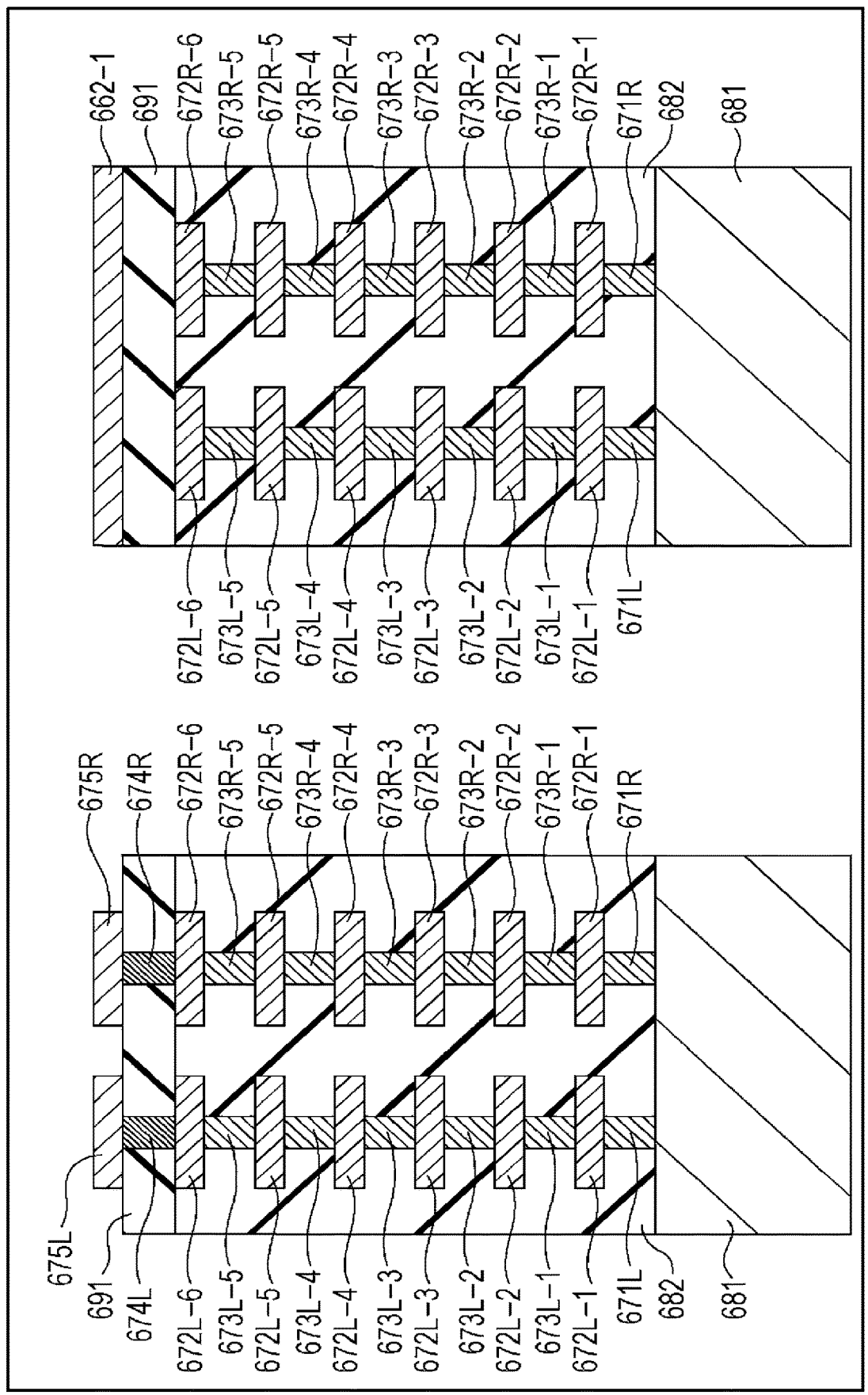
FIG. 39 is a diagram illustrating the manufacturing method of the second embodiment of the moisture-resistant ring.

Next, as illustrated in FIG. 39, the metal film 694 is etched. Thus, the inter-circuit wiring layer including the wirings 662-1 to 662-3 and the dummy wirings 675L and 675R are formed. The separate exposure described above is used for forming the inter-circuit wiring layer.

Figure 40:
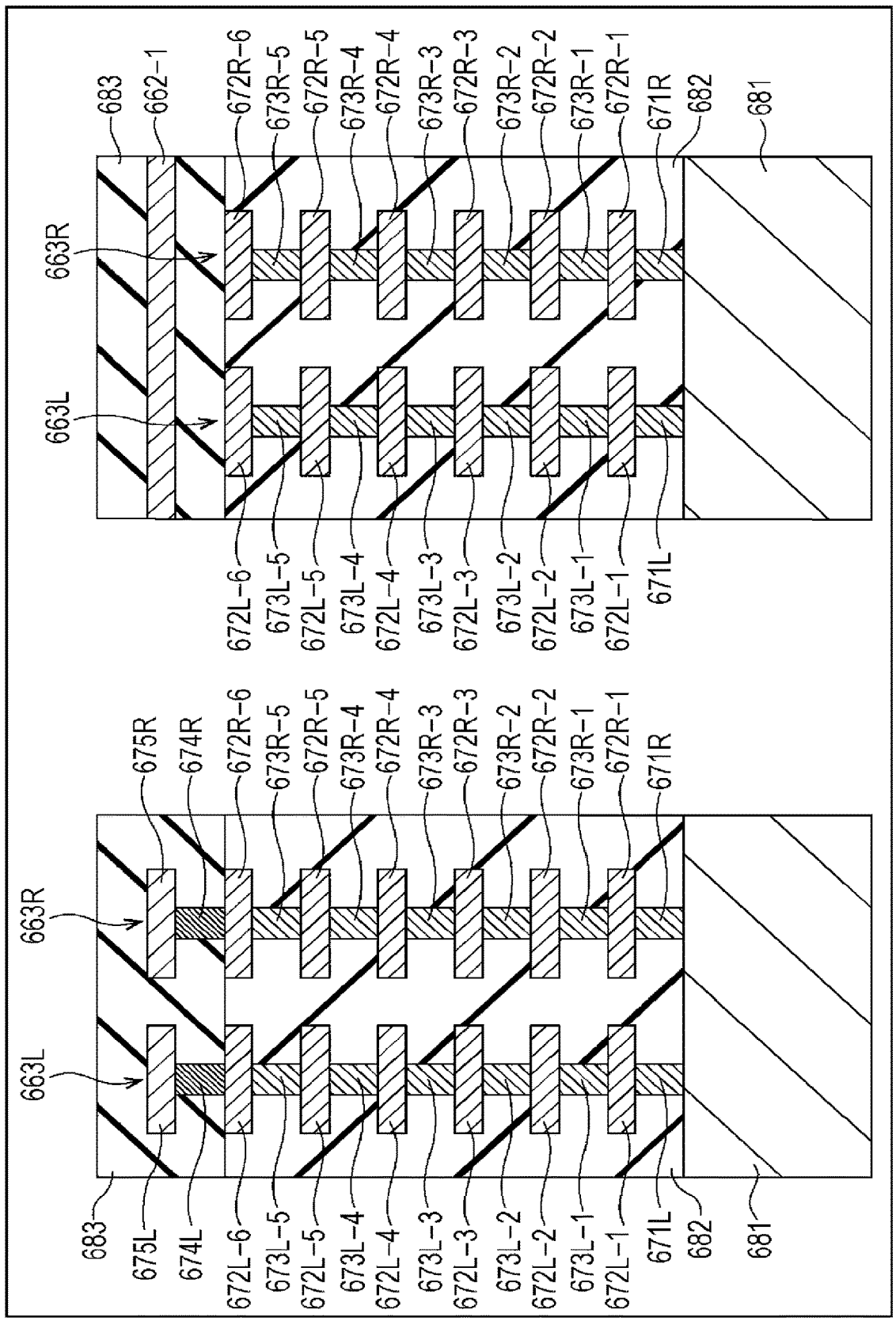
FIG. 40 is a diagram illustrating the manufacturing method of the second embodiment of the moisture-resistant ring.

Last, as illustrated in FIG. 40, an oxide film is deposited on the inter-circuit wiring layer. Thus, an interlayer insulation film 683 is formed in conjunction with the oxide film 691 deposited in the process described with reference to FIG. 34. In addition, for example, a protective film made of polyimide is further formed on the interlayer insulation film.

In addition, the number and material of layers of the moisture-resistant ring and the material of the interlayer insulation film which are described above are an example, and can be changed as necessary.

{4-2. Modification of Imaging Process}

Although the example in which one sheet of pixel data is divided into the left and right and generated by respective signal processing circuits has been described above, a method of dividing pixel data may be freely varied depending on the number or the layout of the signal processing circuit provided in the logic board. For example, the pixel data may be divided vertically, or may be divided into n (n is 3 or more).

Further, for example, without dividing the pixel data, a plurality of (for example, two) signal processing circuits respectively generate entire pixel data, and pixel data obtained by adding the pixel values of a plurality of pieces of the generated pixel data may be generated. Thus, it is possible to reduce random noise or absorb the difference in the characteristics of the AD converter 81, thereby allowing the image quality to be improved.

In this case, the pixel values of a plurality of pieces of pixel data may be weighted and added. For example, two signal processing circuits respectively generate entire pixel data, and the respective pieces of pixel data are weighted with a weight of 0.5 and added, such that it is possible to achieve pixel data, which is an average value of the pixel values of the two pieces of entire pixel data.

Further, for example, in addition to dividing the pixel data, the pixel data of the same region may be generated by a plurality of signal processing circuits and added. For example, the left signal processing circuit and the right signal processing circuit may be respectively provided in duplicate so as to create two pieces of pixel data of the left half of the subject and two pieces of pixel data of the right half of the subject. Then, for example, the pixel data obtained by adding the pixel values of two pieces of pixel data of the left half and the pixel data obtained by adding the pixel values of two pieces of pixel data of the right half may be added.

{4-3. Modification of Scope of the Present Technology}

Although the case where the present technology is applied to the solid-state imaging device has been described, the present technology can be applied to other semiconductor devices of a stacked structure in which the chip size is greater than the exposure range of the exposure apparatus.

5. Electronic Equipment

It is possible to use the solid-state imaging device employing the present technology as an imaging unit (i.e., image-capturing unit), in general, an electronic apparatus, such as an imaging device like a digital still camera and a video camera, a portable terminal device having an imaging function, such as a mobile phone, and a copying machine using the solid-state imaging device as the image-reading unit. Further, there is also the case in which the above modular form is mounted on the electronic apparatus; in other words, a camera module is used as the imaging device.

{5-1. Imaging Device}

Figure 41:
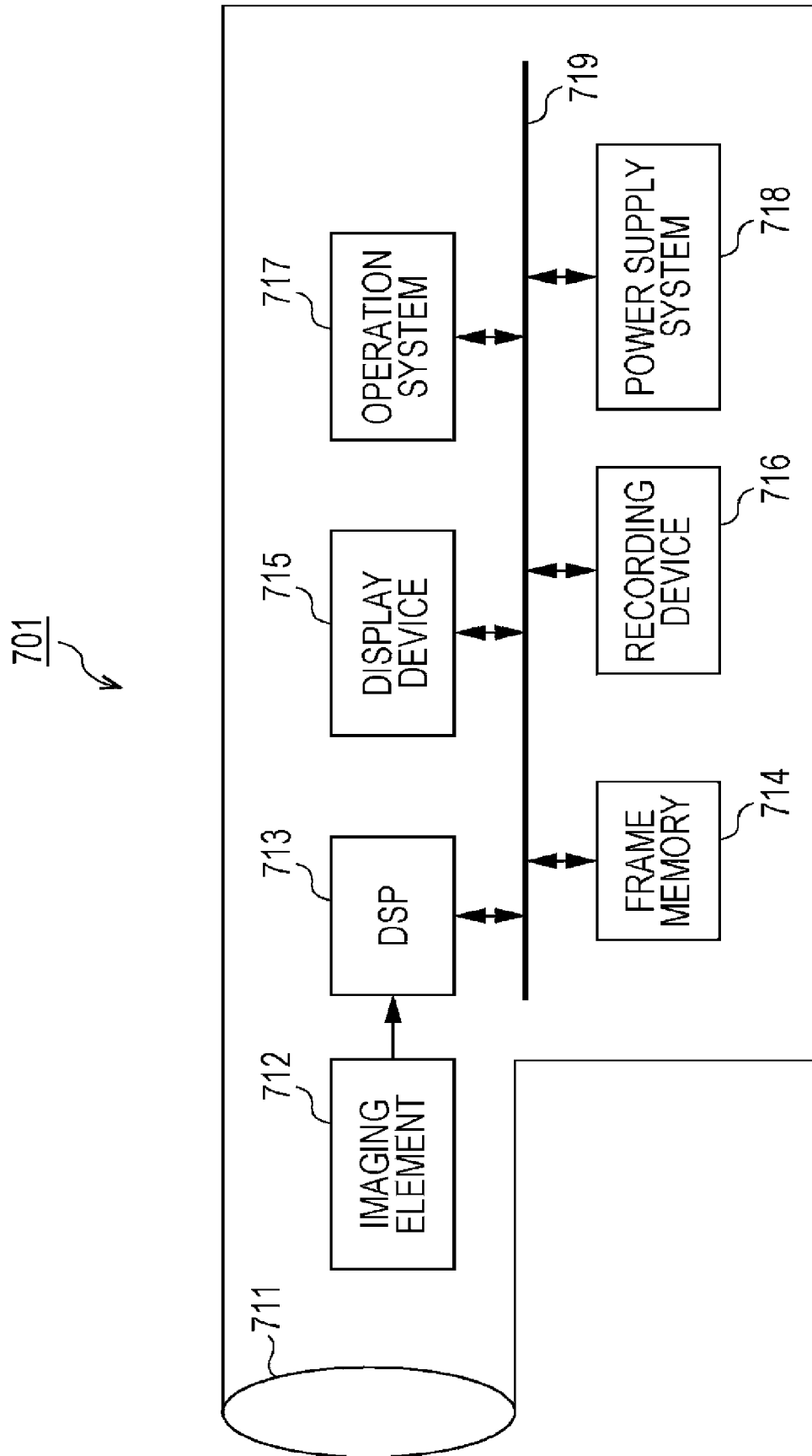
FIG. 41 is a block diagram illustrating a configuration example of an electronic apparatus.

FIG. 41 is a block diagram illustrating a configuration example of an imaging device (e.g., camera device) 701 as an example of an electronic apparatus employing the present technology.

As illustrated in FIG. 41, the imaging device 701 includes an optical system including a lens group 711 and the like, an imaging element 712, a DSP circuit 713 which is a camera signal processing unit, a frame memory 714, a display device 715, a recording device 716, an operation system 717, a power supply system 718, and the like. The DSP circuit 713, the frame memory 714, the display device 715, the recording device 716, the operation system 717, and the power supply system 718 are configured to be connected to each other through a bus line 719.

The lens group 711 receives incident light (i.e., image light) from a subject and focuses the incident light on the imaging plane of the imaging element 712. The imaging element 712 converts the incident light focused on the imaging plane by the lens group 711 into an electrical signal in units of pixels, and outputs a pixel signal.

The display device 715 is a panel-type display device, such as a liquid crystal display device or an organic electro luminescence (EL) display device, and displays a moving image or a still image captured by the imaging element 712. The recording device 716 records the moving image or the still image captured by the imaging element 712 in a recording medium, such as a memory card, a video tape, or a digital versatile disc (DVD).

The operation system 717 issues operation commands for various functions of the imaging device 701, under the operation by the user. The power supply system 718 appropriately supplies various power types, which are operating power of the DSP circuit 713, the frame memory 714, the display device 715, the recording device 716, and the operation system 717, to these supply targets.

Such imaging device 701 is applied to a video camera or a digital still camera, and a camera module for a mobile device, such as a smartphone and a mobile phone. Then, it is possible to use a solid-state imaging device according to the embodiments described above as the imaging element 712, in the imaging device 701. This makes it possible to reduce the cost of the imaging device 701.

In addition, the embodiments of the present technology are not limited to the embodiments described above, and various modifications can be made without departing from the scope of the present technology.

Further, for example, the present technology can have the following configurations.

(1)

A solid-state imaging device including:

a first substrate having a pixel circuit including a pixel array unit formed thereon; and a second substrate having a plurality of signal processing circuits formed thereon, wherein the plurality of signal processing circuits are arranged adjacent to one another and include a spacing region therebetween, and wherein the first substrate and the second substrate are stacked.

(2)

The solid-state imaging device according to (1), wherein each of the signal processing circuits have a same set of functions.

(3)

The solid-state imaging device according to any one of (1) to (2), wherein the same set of functions includes operating as a same signal processing circuit.

(4)

The solid-state imaging device according to any one of (2) to (3), wherein a function to be enabled and a function to be disabled are configured in each of the signal processing circuits in response to one or more external signals.

(5)

The solid-state imaging device according to any one of (1) to (4), wherein a first signal processing circuit of the plurality of signal processing circuits is configured to generate first pixel data based on a pixel signal of a pixel in a first region of the pixel array unit, and wherein a second signal processing circuit of the plurality of signal processing circuits is configured to generate second pixel data based on a pixel signal of a pixel in a second region different from the first region of the pixel array unit.

(6)

The solid-state imaging device according to any one of (1) to (5), wherein a first signal processing circuit of the plurality of signal processing circuits and a second signal processing circuit of the plurality of signal processing circuits are electrically connected.

(7)

The solid-state imaging device according to (6), wherein the first signal processing circuit and the second signal processing circuit are electrically connected through a first wiring layer formed on the second substrate.

(8)

The solid-state imaging device according to (7), wherein the first wiring layer is formed on a top layer of a wiring layer of the second substrate.

(9)

The solid-state imaging device according to any one of (7) to (8), further comprising: a first moisture-resistant structure that surrounds at least a part of a periphery of the first signal processing circuit; and a second moisture-resistant structure that surrounds at least a part of a periphery of the second signal processing circuit.

(10)

The solid-state imaging device according to (9), wherein the first signal processing circuit and the second signal processing circuit have a common circuit pattern, wherein the first wiring layer is formed on the top layer of the wiring layer of the second substrate, and includes a top layer of the first moisture-resistant structure and a top layer of the second moisture-resistant structure, wherein the top layer of the first moisture-resistant structure, and a first wall connecting the top layer of the first moisture-resistant structure and a layer one below the top layer are not formed at a first portion through which a wiring of the first wiring layer of the first moisture-resistant structure passes, and wherein the top layer of the second moisture-resistant structure, a second wall connecting the top layer of the second moisture-resistant structure, and a layer one below the top layer are not formed at a second portion through which a wiring of the first wiring layer of the second moisture-resistant structure passes.

(11)

The solid-state imaging device according to (10), wherein the first wall is not formed at a third portion of the first moisture-resistant structure corresponding to the second portion of the second moisture-resistant structure, and wherein the second wall is not formed at a fourth portion of the second moisture-resistant structure corresponding to the first portion of the first moisture-resistant structure.

(12)

The solid-state imaging device according to (10), wherein a wiring layer except for the first wiring layer of the second substrate is formed by a one-shot exposure, and the first wiring layer is formed by a separate exposure.

(13)

The solid-state imaging device according to (10), wherein interlayer insulation films of second and subsequent wiring layers are made of a low-K film, the second wiring layer being one below the first wiring layer, and wherein an interlayer insulation film above the second wiring layer is made of an insulation film having a water resistance higher than that of the low-K film.

(14)

The solid-state imaging device according to (7), further comprising a moisture-resistant structure that surrounds at least a part of a periphery of the second substrate.

(15)

The solid-state imaging device according to (14), wherein at least a portion of one or more layers of the respective signal processing circuits are formed by a one-shot exposure, and wherein a layer having a moisture-resistant structure formed thereon is formed by the separate exposure.

(16)

The solid-state imaging device according to (6), wherein the first signal processing circuit and the second signal processing circuit are electrically connected through a wiring formed on the first substrate.

(17)

The solid-state imaging device according to (16), wherein the wiring formed on the first substrate is formed in an area outside of the pixel array unit, and wherein the first signal processing circuit and the second signal processing circuit are connected to the wiring formed on the first substrate through a via formed on the first substrate.

(18)

The solid-state imaging device according to (6), wherein the first signal processing circuit and the second signal processing circuit are electrically connected to each other in an area that is external to the solid-state imaging device.

(19)

The solid-state imaging device according to (18), wherein the solid-state imaging device is mounted to a package and the first signal processing circuit and the second signal processing circuit are electrically connected through a conductive pattern on the package.

(20)

The solid-state imaging device according to any one of (18) to (19), wherein signal lines of a same analog signal of the first signal processing circuit and the second signal processing circuit are electrically connected, in an area that is external to the solid-state imaging device.

(21)

The solid-state imaging device according to (6), wherein the first signal processing circuit and the second signal processing circuit are electrically connected to a substrate by one or more bond wires, and wherein the substrate is at least one of provided in the solid-state imaging device, provided in a same package, and provided outside the package.

(22)

The solid-state imaging device according to any one of (6) to (21), wherein the first signal processing circuit is configured to generate first pixel data based on a pixel signal of a pixel in a first region of the pixel array unit, and supply the generated first pixel data to the second signal processing circuit, and wherein the second signal processing circuit is configured to generate second pixel data based on a pixel signal of a pixel in a second region different from the first region of the pixel array unit, and combine the generated second pixel data with the first pixel data.

(23)

The solid-state imaging device according to any one of (6) to (21), wherein the first signal processing circuit is configured to generate first pixel data based on a pixel signal of a pixel in a predetermined region of the pixel array unit, and supply the generated first pixel data to the second signal processing circuit, and wherein the second signal processing circuit is configured to generate second pixel data based on a pixel signal of a pixel of the pixel array unit in the same region as that of the first signal processing circuit, and generate third pixel data by adding the first pixel data and the second pixel data.

(24)

The solid-state imaging device according to any one of (1) to (23), wherein a third substrate is stacked on a surface on an opposite side of a surface adjacent to the first substrate of the second substrate.

(25)

The solid-state imaging device according to (24), further comprising a memory on the third substrate that is configured to store pixel data obtained by analog-to-digital converting a pixel signal of each pixel in the pixel array unit.

(26)

The solid-state imaging device according to any one of claim (1) to (25), further comprising an analog-to-digital (AD) conversion unit on the second substrate, wherein the AD conversion unit is configured to convert a pixel signal of each pixel in the pixel array unit in units of columns of the pixel array unit.

(27)

The solid-state imaging device according to any one of (1) to (25), further comprising an analog-to-digital (AD) conversion unit on the second substrate, wherein the AD conversion unit is configured to convert a pixel signal of each pixel in the pixel array unit in units of regions that include a two-dimensional array of pixels of a predetermined number in the pixel array unit.

(28)

The solid-state imaging device according to any one of (1) to (27), wherein the pixel circuit is formed by a separate exposure, and wherein at least a portion of one or more layers of respective signal processing circuits are formed by a one-shot exposure.

(29)

The solid-state imaging device according to any one of (1) to (28), wherein a first signal processing circuit of the plurality of signal processing circuits and a second signal processing circuit of the plurality of signal processing circuits are formed by a same one-shot exposure.

(30)

The solid-state imaging device according to any one of (1) to (29), wherein the spacing region between the plurality of signal processing circuits is a scribe region.

(31)
A manufacturing method of a solid-state imaging device, including:
forming a pixel circuit including a pixel array unit so as to be two-dimensionally arranged through a scribe region on a first semiconductor substrate, by using one or more separate exposures;
forming a signal processing circuit that processes a pixel signal of each pixel in the pixel array unit so as to be two-dimensionally arranged through a scribe region on a second semiconductor substrate, by using a one-shot exposure;
stacking the first semiconductor substrate and the second semiconductor substrate such that the scribe region of the first semiconductor substrate overlaps the scribe region of the second semiconductor substrate; and
cutting a semiconductor substrate including the first semiconductor substrate and the second semiconductor substrate that are stacked, along the scribe region of the first semiconductor substrate.

(32)
The manufacturing method of a solid-state imaging device according to (31), wherein the signal processing circuit includes a first signal processing circuit and a second signal processing circuit arranged adjacent to one another and include the scribe region of the second semiconductor substrate therebetween, and wherein a wiring layer that electrically connects the first signal processing circuit and the second signal processing circuit which are disposed in the same solid-state imaging device is formed on the second semiconductor substrate.

(33)
The manufacturing method of a solid-state imaging device according to (32), wherein the wiring layer is formed on a top layer of a wiring layer of the second semiconductor substrate.

(34)
The manufacturing method of a solid-state imaging device according to any one of (32) to (33), further including:
forming a first moisture-resistant structure that surrounds at least a part of a periphery of the first signal processing circuit; and
forming a second moisture-resistant structure that surrounds at least a part of a periphery of the second signal processing circuit.

(35)
The manufacturing method of a solid-state imaging device according to any one of (32) to (33), further including:
forming a moisture-resistant structure that surrounds at least a part of an outer periphery of the first and second signal processing circuits which are disposed on the same solid-state imaging device.

(36)
The manufacturing method of a solid-state imaging device according to any one of (31), wherein the signal processing circuit includes a first signal processing circuit and a second signal processing circuit arranged adjacent to one another and include the scribe region of the second semiconductor substrate therebetween, and wherein a wiring and a via for electrically connecting the first signal processing circuit and the second signal processing circuit which are disposed on the same solid-state imaging device are formed on the first semiconductor substrate.

(37)
An electronic apparatus including:
a solid-state imaging device including a first substrate having a pixel circuit including a pixel array unit formed thereon and a second substrate having a plurality of signal processing circuits formed thereon, wherein the plurality of signal processing circuits are arranged adjacent to one another and include a spacing region therebetween, and wherein the first substrate and the second substrate are stacked.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Solid-state imaging device
11 Pixel substrate
12 Logic board
21 Pixel circuit
22 Scribe region
31 Pixel array unit
32 Unit pixel
41L, 41R Signal processing circuit
42 Scribe region
67L, 67R Memory unit
68L, 68R Data processing unit
69L, 69R Interface unit
81L-1 to 81R-n AD converter
101L-1 to 101R-2 AD conversion unit
102L-1 to 102R-2 Memory unit
103L, 103R Logic unit
104L-1 to 104R-2 Interface unit
105L-1 to 105R-4 Via
121 Signal processing LSI
171L, 171R Multiplexer
172L, 172R Core
201 Solid-state imaging device
211 Logic board
301 Solid-state imaging device
311 Pixel substrate
312 Logic board
321 Pixel circuit
331 Pixel array unit
341L, 341R Signal processing circuit
351L, 351R Wiring
352L, 352R, 353L, 353R, 355L, 355R, 357L, 357R Via
358 Wiring
401 Package
411L, 411R Bonding wire
412 Conductive pattern
511 Pixel substrate
512 Logic board
521 Pixel circuit
531 Pixel array unit
532 Via
541L, 541R Signal processing circuit
601 Logic board
611L, 611R Signal processing circuit
612-1 to 612-3 Wiring
613 Moisture-resistant ring
621 Wall
622-1 to 622-6 Dummy wiring
623-1 to 623-5, 624 Wall
625 Dummy wiring 631 Substrate layer
632, 633 Interlayer insulation film
651 Logic board
661L, 661R Signal processing circuit
662-1 to 662-3 Wiring
663L, 663R Moisture-resistant ring
671L, 671R Wall
672L-1 to 672R-6 Dummy wiring
673L-1 to 673R-5, 674L, 674R Wall
675L, 675R Dummy wiring
681 Substrate layer
682, 683 Interlayer insulation film
701 Imaging device
712 Imaging element

What is claimed is:

1. A light detecting device, comprising:
 a first substrate including:
  a first substrate layer at a light incident side, the first substrate layer including a plurality of photodiodes; and
  a first wiring layer at a side opposite the light incident side, the first wiring layer including a plurality of pixel transistors;
 a second substrate including a second wiring layer and a second substrate layer,
 wherein the first substrate and the second substrate are bonded together such that the first wiring layer and the second wiring layer are facing each other; and
 a third substrate including a third wiring layer and a third substrate layer,
 wherein the first substrate and the third substrate are bonded together such that the first wiring layer and the third wiring layer are facing each other,
 wherein the first wiring layer and the second wiring layer are electrically connected to one another and the first wiring layer and the third wiring layer are electrically connected to one another, and
 wherein a size of the second substrate and a size of the third substrate are each smaller than a size of the first substrate.

2. The light detecting device according to claim 1, wherein the first wiring layer and the second wiring layer are electrically connected by a via.

3. The light detecting device according to claim 1, further comprising a spacing region provided between the second substrate and the third substrate.

4. The light detecting device according to claim 1, wherein the second substrate includes a first signal processing circuit and the third substrate includes a second signal processing circuit.

5. The light detecting device according to claim 4, wherein a signal from the first signal processing circuit is conveyed to the second signal processing circuit and a result of a signal processing on the signal from the second signal processing circuit is output as an image signal.

6. The light detecting device according to claim 5, wherein the first signal processing circuit includes an analog to digital converter and the second signal processing circuit includes a memory.

7. The light detecting device according to claim 4, wherein the second substrate includes a guard ring.

8. The light detecting device according to claim 7, wherein the guard ring surrounds a part of a periphery of the first signal processing circuit.

9. The light detecting device according to claim 8, wherein a pixel array includes the plurality of photodiodes and a part of the guard ring is disposed under the pixel array.

10. The light detecting device according to claim 1, wherein the second wiring layer and the third wiring layer are electrically connected via a metal disposed in the first wiring layer.

11. The light detecting device according to claim 1, wherein the first substrate and the second substrate are directly bonded to each other.

12. The light detecting device according to claim 4, wherein the second signal processing circuit is surrounded by a via that connects the second substrate and the first substrate.

13. An electronic apparatus, comprising:
 a light detecting device, including:
  a first substrate including:
   a first substrate layer at a light incident side, the first substrate layer including a plurality of photodiodes; and
   a first wiring layer at a side opposite the light incident side, the first wiring layer including a plurality of pixel transistors;
  a second substrate including a second wiring layer and a second substrate layer,
  wherein the first substrate and the second substrate are bonded together such that the first wiring layer and the second wiring layer are facing each other; and
  a third substrate including a third wiring layer and a third substrate layer,
  wherein the first substrate and the third substrate are bonded together such that the first wiring layer and the third wiring layer are facing each other,
  wherein the first wiring layer and the second wiring layer are electrically connected to one another and the first wiring layer and the third wiring layer are electrically connected to one another, and
  wherein a size of the second substrate and a size of the third substrate are each smaller than a size of the first substrate.

* * * * *